United States Patent
Yamazaki et al.

(10) Patent No.: US 9,806,202 B2
(45) Date of Patent: Oct. 31, 2017

(54) SEMICONDUCTOR DEVICE AND MEMORY DEVICE

(71) Applicant: Semiconductor Energy Laboratory Co., Ltd., Atsugi-shi, Kanagawa-ken (JP)

(72) Inventors: Shunpei Yamazaki, Tokyo (JP); Kazuhiro Tsutsui, Kanagawa (JP); Shinpei Matsuda, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/942,310

(22) Filed: Nov. 16, 2015

(65) Prior Publication Data

US 2016/0149055 A1    May 26, 2016

(30) Foreign Application Priority Data

Nov. 21, 2014 (JP) ................................. 2014-236491

(51) Int. Cl.
*H01L 29/786* (2006.01)
*H01L 27/108* (2006.01)
(Continued)

(52) U.S. Cl.
CPC .. *H01L 29/78696* (2013.01); *H01L 27/10805* (2013.01); *H01L 27/10814* (2013.01);
(Continued)

(58) Field of Classification Search
CPC ....................... H01L 29/7869; H01L 29/78696
See application file for complete search history.

(56) References Cited

U.S. PATENT DOCUMENTS 7,468,901 B2    12/2008    Kameshiro et al.
8,089,117 B2    1/2012    Shimizu
(Continued)

FOREIGN PATENT DOCUMENTS

CN        105009299 A      10/2015
DE      112014001257       12/2015
(Continued)

OTHER PUBLICATIONS

Hisamoto.D et al., "A Folded-channel MOSFET for Deep-sub-tenth Micron Era,", IEDM 98: Technical Digest of International Electron Devices Meeting, Dec. 6, 1998, pp. 1032-1034.
(Continued)

*Primary Examiner* — Allison P Bernstein
(74) *Attorney, Agent, or Firm* — Fish & Richardson P.C.

(57) ABSTRACT

The present invention provides a transistor having a high on-state current. The transistor includes a plurality of fins, a first oxide semiconductor, a gate insulating film, and a gate electrode. One of adjacent two fins includes a second oxide semiconductor and a third oxide semiconductor. The other includes a fourth oxide semiconductor and the third oxide semiconductor. The second oxide semiconductor and the fourth oxide semiconductor include regions that face each other with the gate electrode positioned therebetween. The gate electrode and the second oxide semiconductor overlap with each other with the gate insulating film and the first oxide semiconductor positioned therebetween. The gate electrode and the fourth oxide semiconductor overlap with each other with the gate insulating film and the first oxide semiconductor positioned therebetween.

20 Claims, 44 Drawing Sheets

(51) Int. Cl.
  *H01L 29/24* (2006.01)
  *H01L 29/66* (2006.01)
  *H01L 29/78* (2006.01)
  *H01L 27/12* (2006.01)
  *H01L 27/146* (2006.01)

(52) U.S. Cl.
  CPC .... *H01L 27/1225* (2013.01); *H01L 27/14634* (2013.01); *H01L 29/24* (2013.01); *H01L 29/66818* (2013.01); *H01L 29/7853* (2013.01); *H01L 29/7869* (2013.01)

(56) References Cited

U.S. PATENT DOCUMENTS

| | | | |
|---|---|---|---|
| 8,207,531 B2 | 6/2012 | Takahashi et al. | |
| 8,373,237 B2 | 2/2013 | Park et al. | |
| 8,737,109 B2 | 5/2014 | Yamazaki et al. | |
| 9,076,505 B2 | 7/2015 | Atsumi et al. | |
| 2007/0075372 A1 | 4/2007 | Terashima et al. | |
| 2010/0270619 A1 | 10/2010 | Lee | |
| 2011/0049509 A1 | 3/2011 | Takahashi et al. | |
| 2011/0121288 A1 | 5/2011 | Yamazaki et al. | |
| 2011/0127522 A1 | 6/2011 | Yamazaki | |
| 2011/0148455 A1 | 6/2011 | Kato et al. | |
| 2011/0156027 A1 | 6/2011 | Yamazaki et al. | |
| 2011/0186932 A1 | 8/2011 | Mizumura et al. | |
| 2012/0001266 A1 | 1/2012 | Lim et al. | |
| 2012/0051118 A1 | 3/2012 | Yamazaki et al. | |
| 2012/0241739 A1 | 9/2012 | Yamazaki et al. | |
| 2014/0151691 A1 | 6/2014 | Matsubayashi et al. | |
| 2014/0264324 A1 | 9/2014 | Yamazaki | |
| 2014/0299873 A1 | 10/2014 | Yamazaki | |
| 2015/0214378 A1 | 7/2015 | Matsubayashi et al. | |
| 2015/0221774 A1* | 8/2015 | Yamazaki | H01L 29/7869 257/43 |
| 2015/0263047 A1* | 9/2015 | Kimura | H01L 27/1222 365/149 |
| 2016/0260822 A1* | 9/2016 | Okamoto | H01L 29/22 |

FOREIGN PATENT DOCUMENTS

| | | |
|---|---|---|
| JP | 4865331 | 2/2012 |
| JP | 2012-069932 A | 4/2012 |
| JP | 2012-089841 A | 5/2012 |
| JP | 2013-168631 A | 8/2013 |
| JP | 2014-210702 A | 11/2014 |
| TW | 201442242 | 11/2014 |
| TW | 201530765 | 8/2015 |
| WO | WO-2005/038931 | 4/2005 |
| WO | WO-2014/142333 | 9/2014 |
| WO | WO-2015/114476 | 8/2015 |

OTHER PUBLICATIONS

International Search Report (Application No. PCT/162015/058830) Dated Feb. 23, 2016.
Written Opinion (Application No. PCT/IB2015/058830) Dated Feb. 23, 2016.

* cited by examiner

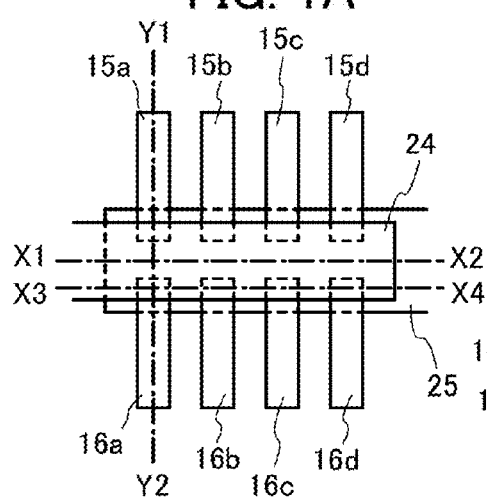
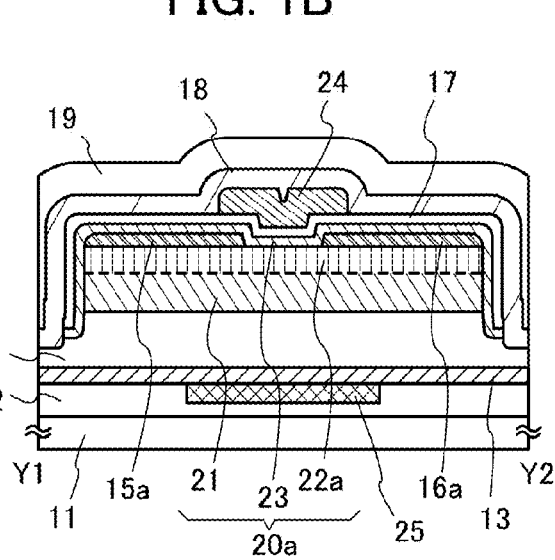
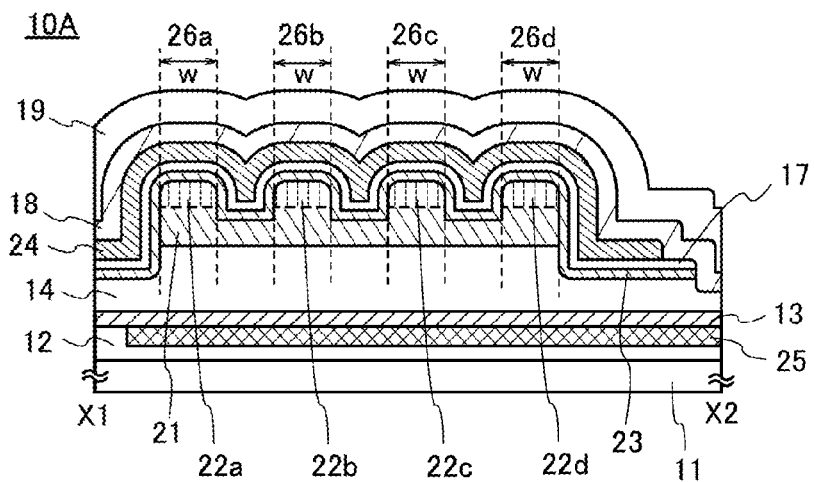
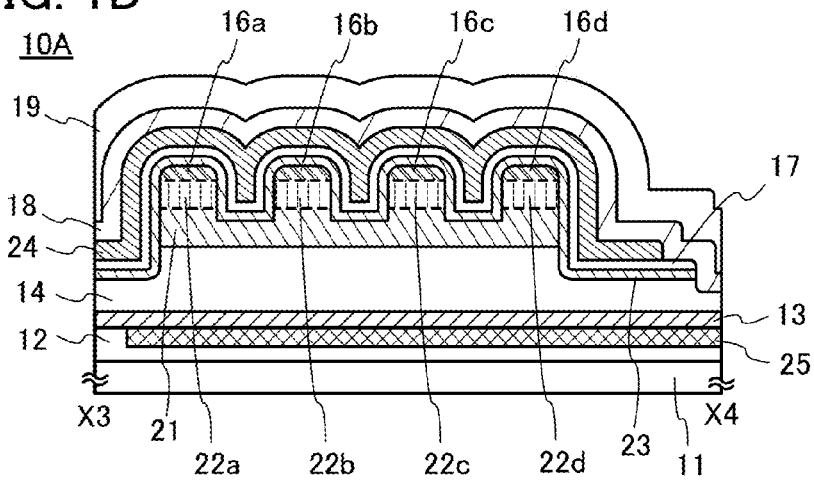

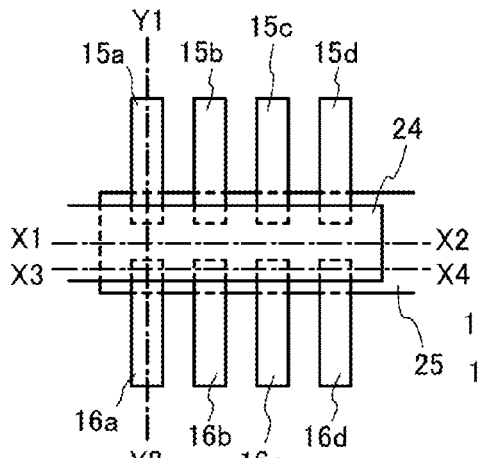
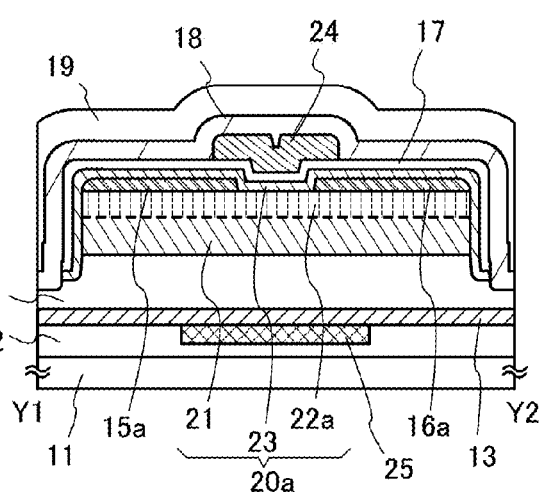
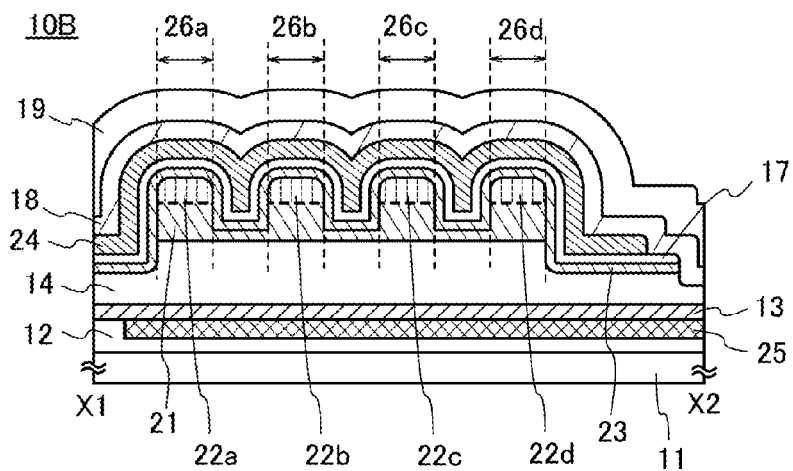
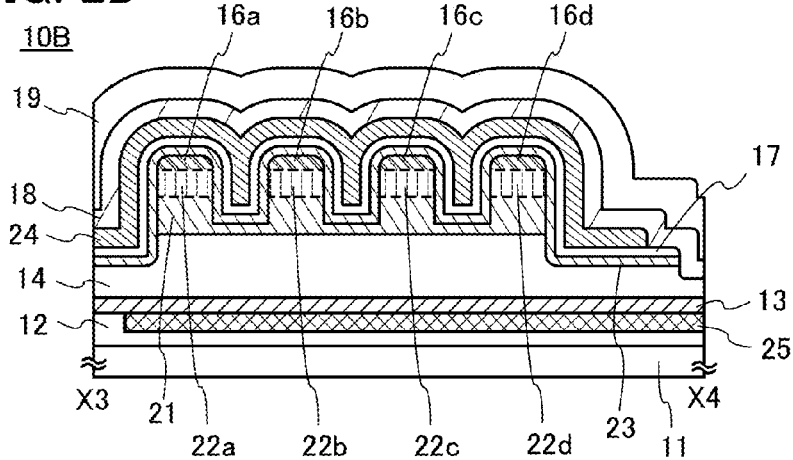

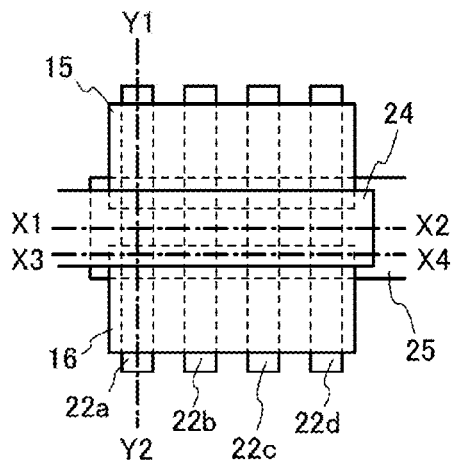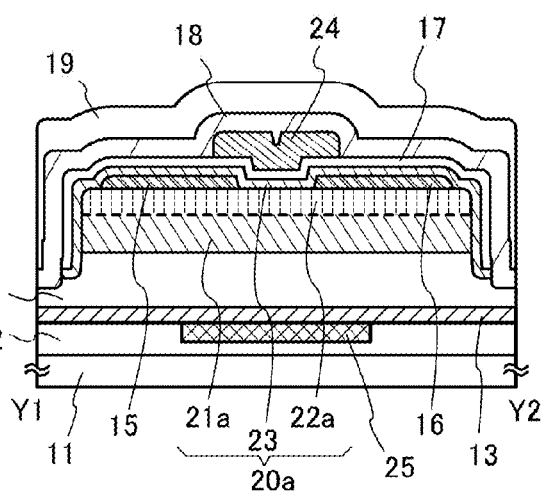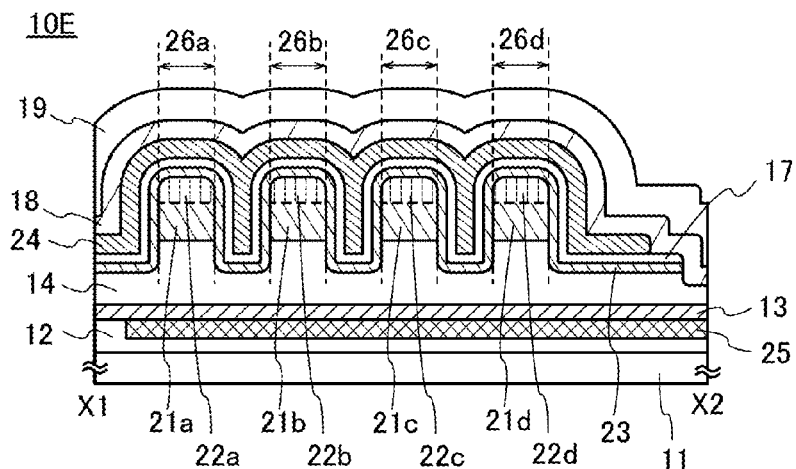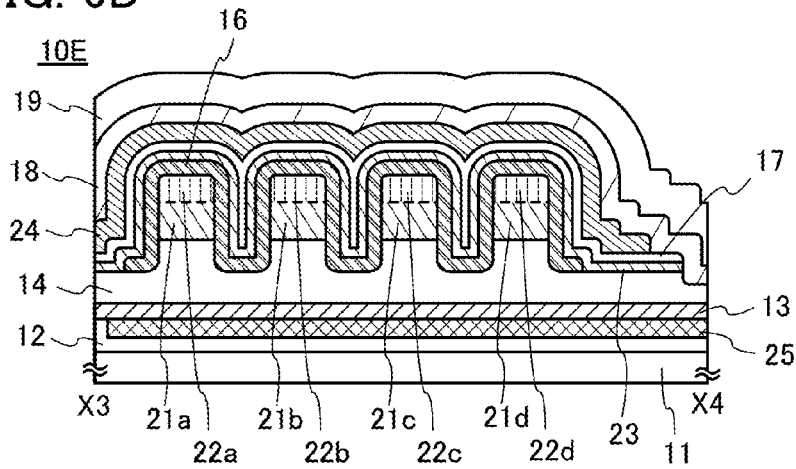

300 FIG. 11A
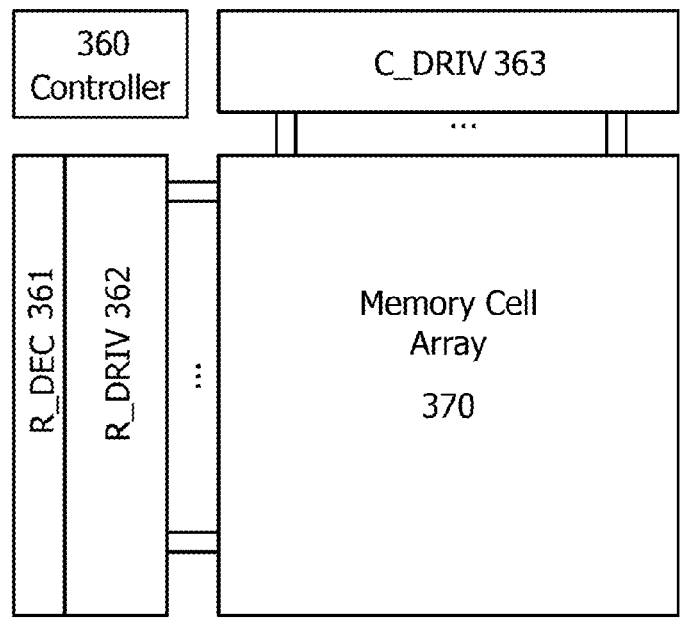
FIG. 11B
300_A
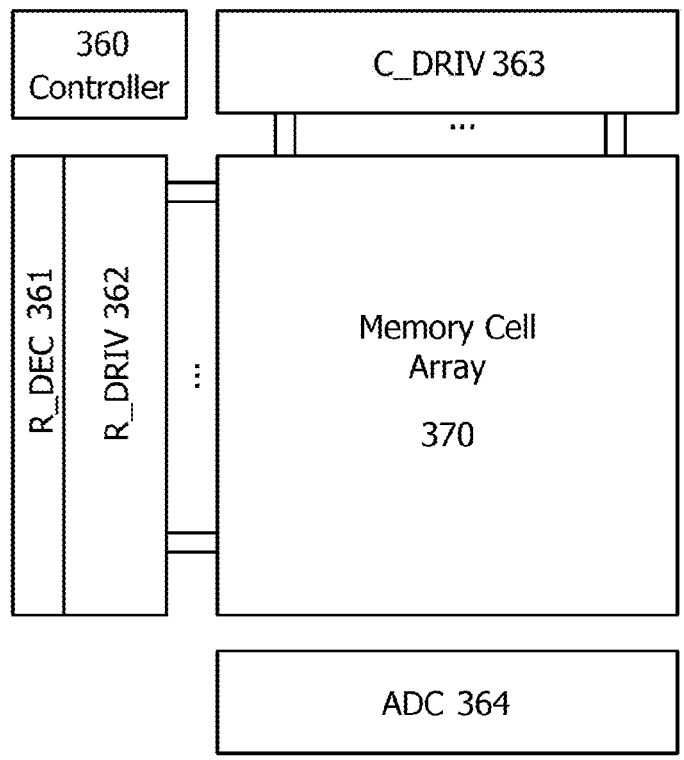

4000

4000

4000

4000

4000

4000

FIG. 32A
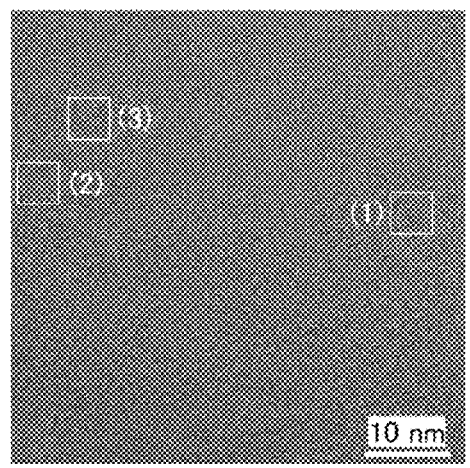
FIG. 32B  FIG. 32C  FIG. 32D
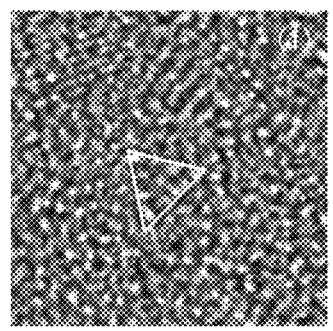 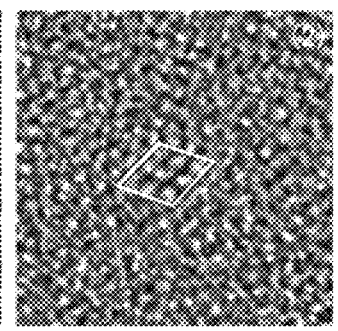 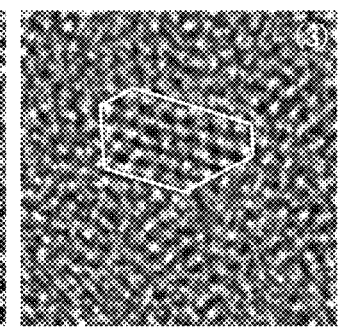

FIG. 34A
FIG. 34B
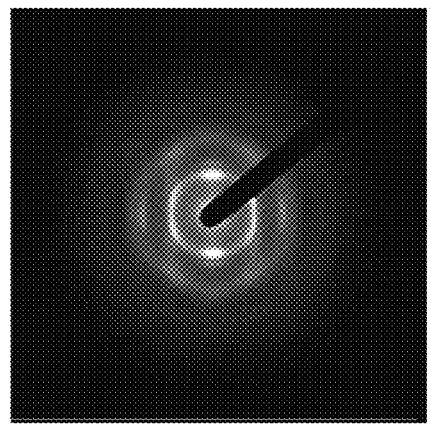
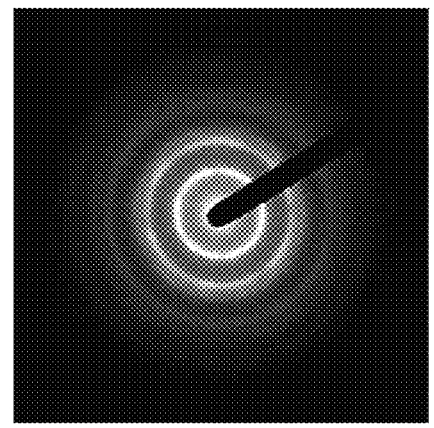

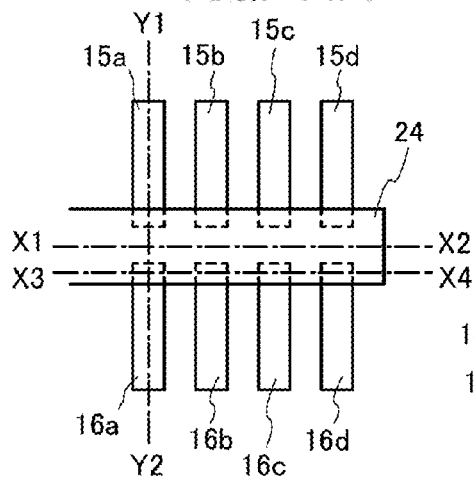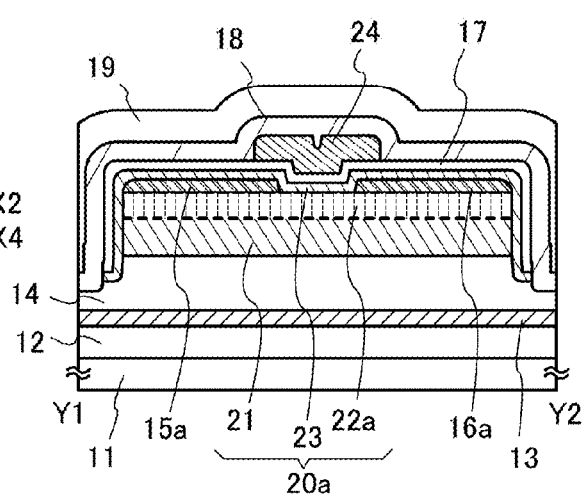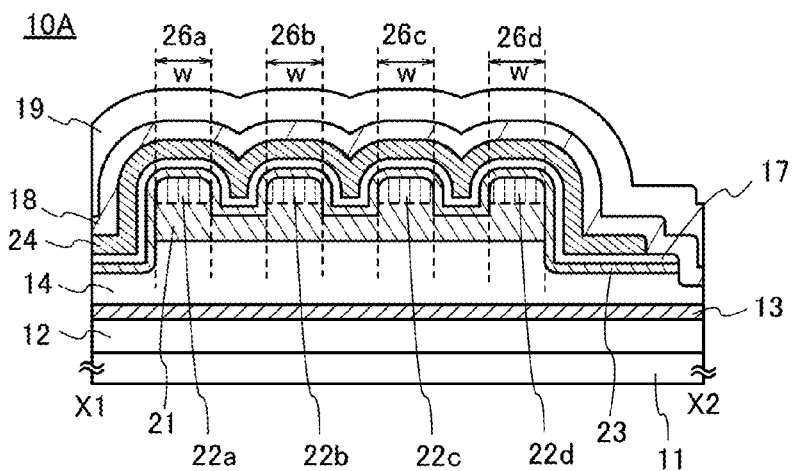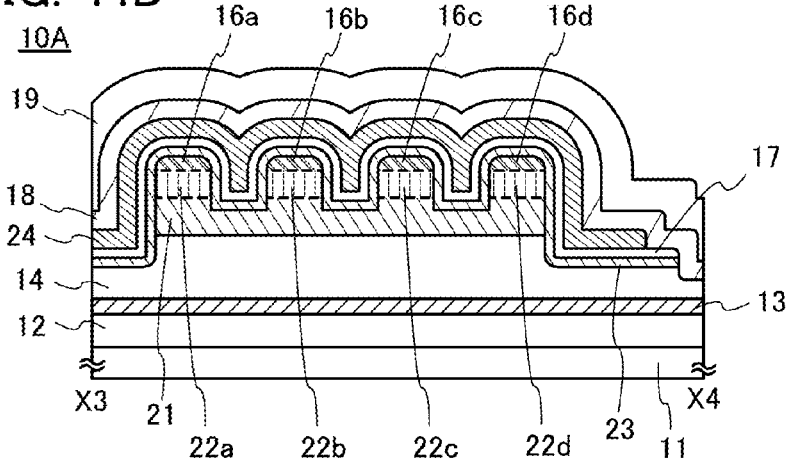

SEMICONDUCTOR DEVICE AND MEMORY DEVICE

TECHNICAL FIELD

One embodiment of the present invention relates to a semiconductor device or a memory device.

The present invention relates to an object, a method, or a manufacturing method. In addition, the present invention relates to a process, a machine, manufacture, or a composition of matter. One embodiment of the present invention relates to a semiconductor device, a display device, a light-emitting device, a power storage device, a memory device, a driving method thereof, or a manufacturing method thereof.

In this specification and the like, a semiconductor device generally means a device that can function by utilizing semiconductor characteristics. A display device, an electro-optical device, a semiconductor circuit, and an electronic device include a semiconductor device in some cases.

BACKGROUND ART

A technique in which a transistor is formed using a semiconductor material has attracted attention. Such a transistor is applied to a wide range of electronic devices such as an integrated circuit (IC) or an image display device (also simply referred to as a display device). Although silicon-based semiconductor materials have been widely used as semiconductor materials applicable to the transistor, oxide semiconductors have been attracting attention as alternative materials.

Patent Document 1 discloses an example in which a transistor including an oxide semiconductor in a channel formation region (hereinafter referred to as an oxide semiconductor (OS) transistor) is used in a dynamic random access memory (DRAM). The OS transistor has extremely low leakage current in an off state (off-state current); thus, a DRAM having a low refresh frequency and a low power consumption can be formed.

Patent Document 2 discloses a nonvolatile memory including an OS transistor. Unlike the flash memory, the nonvolatile memory has unlimited cycling capability, can easily operate at high speed, and consumes less power.

REFERENCE

Patent Document

[Patent Document 1] Japanese Published Patent Application No. 2013-168631
[Patent Document 2] Japanese Published Patent Application No. 2012-069932

DISCLOSURE OF INVENTION

An object of one embodiment of the present invention is to provide a transistor having a high on-state current. Another object of one embodiment of the present invention is to provide a memory having a high operation frequency. Another object of one embodiment of the present invention is to provide a novel semiconductor device.

Note that the description of a plurality of objects does not mutually preclude their existence. Note that one embodiment of the present invention does not necessarily achieve all the objects listed above. Objects other than those listed above are apparent from the description of the specification, drawings, and claims, and also such objects could be an object of one embodiment of the present invention.

One embodiment of the present invention is a transistor including a first to N-th fins (N is a natural number of 2 or more), a first oxide semiconductor, a gate insulating film, and a gate electrode. In the transistor, one of adjacent two fins among the first to N-th fins includes a second oxide semiconductor and a third oxide semiconductor. The other of the adjacent two fins includes a fourth oxide semiconductor and the third oxide semiconductor. The second oxide semiconductor and the fourth oxide semiconductor include regions that face each other with the gate electrode positioned therebetween. The gate insulating film includes a region in contact with a top surface of the first oxide semiconductor. The second oxide semiconductor includes a first portion between the first oxide semiconductor and the third oxide semiconductor. The gate electrode and the first portion overlap with each other with the gate insulating film positioned therebetween. The fourth oxide semiconductor includes a second portion between the first oxide semiconductor and the third oxide semiconductor. The gate electrode and the second portion overlap with each other with the gate insulating film positioned therebetween.

One embodiment of the present invention is a transistor including a first to N-th fins (N is a natural number of 2 or more), a first oxide semiconductor, a gate insulating film, and a gate electrode. In the transistor, one of adjacent two fins among the first to N-th fins includes a second oxide semiconductor and a third oxide semiconductor. The other of the adjacent two fins includes a fourth oxide semiconductor and the third oxide semiconductor. The second oxide semiconductor and the fourth oxide semiconductor include regions that face each other with the gate electrode positioned therebetween. The third oxide semiconductor included in the one of the adjacent two fins and the third oxide semiconductor included in the other of the adjacent two fins include regions that face each other with the gate electrode positioned therebetween. The gate insulating film includes a region in contact with a top surface of the first oxide semiconductor. The second oxide semiconductor includes a first portion between the first oxide semiconductor and the third oxide semiconductor. The gate electrode and the first portion overlap with each other with the gate insulating film positioned therebetween. The fourth oxide semiconductor includes a second portion between the first oxide semiconductor and the third oxide semiconductor. The gate electrode and the second portion overlap with each other with the gate insulating film positioned therebetween.

In the above embodiments, the first to fourth oxide semiconductors include indium, zinc, and M (M is Al, Ti, Ga, Y, Zr, La, Ce, Nd, or Hf).

In the above embodiments, the first and third oxide semiconductors preferably have a larger atomic ratio of M to In than the second and fourth oxide semiconductors.

One embodiment of the present invention is a transistor including a first to N-th fins (N is a natural number of 2 or more), a first oxide semiconductor, a gate insulating film, and a gate electrode. In the transistor, one of adjacent two fins among the first to N-th fins includes a second oxide semiconductor and a third oxide semiconductor. The other of the adjacent two fins includes a fourth oxide semiconductor and a fifth oxide semiconductor. The second oxide semiconductor and the fourth oxide semiconductor include regions that face each other with the gate electrode positioned therebetween. The third oxide semiconductor and the fifth oxide semiconductor include regions that face each other with the gate electrode positioned therebetween. The gate insulating film includes a region in contact with a top surface of the first oxide semiconductor. The second oxide semiconductor includes a first portion between the first oxide semiconductor and the third oxide semiconductor. The gate electrode and the first portion overlap with each other with the gate insulating film positioned therebetween. The fourth oxide semiconductor includes a second portion between the first oxide semiconductor and the fifth oxide semiconductor. The gate electrode and the second portion overlap with each other with the gate insulating film positioned therebetween.

In the above embodiments, the first to fifth oxide semiconductors include indium, zinc, and M (M is Al, Ti, Ga, Y, Zr, La, Ce, Nd, or Hf).

In the above embodiments, the first, third, and fifth oxide semiconductors preferably have a larger atomic ratio of M to In than the second and fourth oxide semiconductors.

One embodiment of the present invention is a memory including the transistor according to any of the above embodiments and a capacitor, in which the N divided by load capacitance is larger than or equal to $2 \times 10^{12}$ $F^{-1}$ and smaller than or equal to $200 \times 10^{15}$ $F^{-1}$.

One embodiment of the present invention is an electronic device including the transistor according to any of the above embodiments and at least one of a microphone, a speaker, a display portion, and an operation key.

In this specification and the like, a transistor is a kind of semiconductor elements and can achieve amplification of current or voltage, switching operation for controlling conduction or non-conduction, or the like. A transistor in this specification includes an insulated-gate field effect transistor (IGFET) and a thin film transistor (TFT).

Note that functions of a "source" and a "drain" of a transistor are sometimes replaced with each other when a transistor of opposite polarity is used or when the direction of current flow is changed in circuit operation, for example. Therefore, the terms "source" and "drain" can be replaced with each other in this specification.

Note that the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

Note that in this specification and the like, the channel length refers to, for example, a distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not fixed at one value in some cases. Therefore, in this specification, the channel length is any one of the following values: the maximum value, the minimum value, and the average value in a region where a channel is formed.

The channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths in all regions do not necessarily have the same value. In other words, the channel width of one transistor is not fixed at one value in some cases. Therefore, in this specification, the channel width is any one of the following values: the maximum value, the minimum value, and the average value in a region where a channel is formed.

Note that depending on transistor structures, a channel width in a region where a channel is formed actually (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is high in some cases. In that case, an effective channel width obtained when a channel is actually formed is greater than an apparent channel width shown in the top view.

In a transistor having a three-dimensional structure, an effective channel width is difficult to measure in some cases. For example, to estimate an effective channel width from a design value, it is necessary to assume that the shape of a semiconductor is known as an assumption condition. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Further, in this specification, in the case where the term "channel width" is simply used, it may denote a surrounded channel width and an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where electric field mobility, a current value per channel width, and the like of a transistor are obtained by calculation, a surrounded channel width may be used for the calculation. In that case, a value different from one in the case where an effective channel width is used for the calculation is obtained in some cases.

In this specification and the like, a display element, a display device, which is a device including a display element, a light-emitting element, and a light-emitting device, which is a device including a light-emitting element, can employ various modes or can include various elements. The display element, the display device, the light-emitting element, or the light-emitting device includes at least one of an electroluminescent (EL) element (e.g., an EL element including organic and inorganic materials, an organic EL element, or an inorganic EL element), an LED (e.g., a white LED, a red LED, a green LED, or a blue LED), a transistor (a transistor that emits light depending on current), an electron emitter, a liquid crystal element, electronic ink, an electrophoretic element, a grating light valve (GLV), a plasma display panel (PDP), a display element using micro electro mechanical systems (MEMS), a digital micromirror device (DMD), a digital micro shutter (DMS), MIRASOL (registered trademark), an interferometric modulator display (IMOD) element, a MEMS shutter display element, an optical-interference-type MEMS display element, an electrowetting element, a piezoelectric ceramic display, a display element including a carbon nanotube, and the like. Other than the above, display media whose contrast, luminance, reflectivity, transmittance, or the like is changed by electrical or magnetic effect may be included. Note that examples of display devices having EL elements include an EL display. Examples of display devices including electron emitters are a field emission display (FED) and an SED-type flat panel display (SED: surface-conduction electron-emitter display). Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of a display device including electronic ink, electronic liquid powder (registered trademark), or electrophoretic elements include electronic paper. In the case of a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption. Note that in the case of using an LED, graphene or graphite may be provided under an electrode or a nitride semiconductor of the LED. Graphene or graphite may be a multilayer film in which a plurality of layers are stacked. As described above, provision of graphene or graphite enables easy formation of a nitride semiconductor film thereover, such as an n-type GaN semiconductor layer including crystals. Furthermore, a p-type GaN semiconductor layer including crystals or the like can be provided thereover, and thus the LED can be formed. Note that an MN layer may be provided between the n-type GaN semiconductor layer including crystals and graphene or graphite. The GaN semiconductor layers included in the LED may be formed by MOCVD. Note that when the graphene is provided, the GaN semiconductor layers included in the LED can also be formed by a sputtering method.

Furthermore, in the present specification, any of the embodiments and the examples described below can be combined as appropriate. In the case where some structural examples are given in one embodiment or example, any of the structural examples can be combined as appropriate.

One embodiment of the present invention can provide a transistor having a high on-state current. One embodiment of the present invention can provide a memory having a high operation frequency. One embodiment of the present invention can provide a novel semiconductor device.

Note that the description of these effects does not disturb the existence of other effects. One embodiment of the present invention does not necessarily have all the effects listed above. Other effects will be apparent from and can be derived from the description of the specification, the drawings, the claims, and the like.

BRIEF DESCRIPTION OF DRAWINGS

In the accompanying drawings:

FIGS. 1A to 1D are a top view and cross-sectional views illustrating a structural example of a transistor;

FIGS. 2A to 2D are a top view and cross-sectional views illustrating a structural example of a transistor;

FIGS. 6A to 6D are a top view and cross-sectional views illustrating a structural example of a transistor;

FIGS. 11A and 11B are block diagrams each illustrating a structural example of a nonvolatile memory;

FIGS. 32A to 32D are Cs-corrected high-resolution TEM images of a plane of a CAAC-OS;

FIGS. 34A and 34B show electron diffraction patterns of a CAAC-OS;

FIGS. 44A to 44D are a top view and cross-sectional views illustrating a structural example of a transistor.

BEST MODE FOR CARRYING OUT THE INVENTION

Figure 3A:
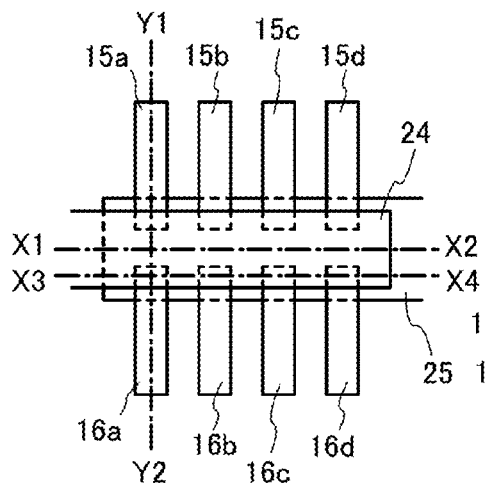
FIGS. 3A to 3D are a top view and cross-sectional views illustrating a structural example of a transistor.

Embodiments will be described in detail with reference to drawings. Note that the present invention is not limited to the description below, and it is easily understood by those skilled in the art that various changes and modifications can be made without departing from the spirit and scope of the present invention. Accordingly, the present invention should not be interpreted as being limited to the content of the embodiments below.

Note that in this specification and the like, ordinal numbers such as "first", "second", and the like are used in order to avoid confusion among components and do not limit the number.

Note that in the structures of the invention described below, the same portions or portions having similar functions are denoted by the same reference numerals in different drawings, and description of such portions is not repeated. Further, the same hatching pattern is applied to portions having similar functions, and the portions are not especially denoted by reference numerals in some cases.

Note that in each drawing described in this specification, the size, the layer thickness, or the region of each component is exaggerated for clarity in some cases. Therefore, embodiments of the present invention are not limited to such a scale.

(Embodiment 1)

In this embodiment, a semiconductor device (a transistor) of one embodiment of the present invention will be described with reference to FIGS. 1A to 1D, FIGS. 2A to 2D, FIGS. 3A to 3D, FIGS. 4A to 4D, FIGS. 5A to 5D, FIGS. 6A to 6D, FIGS. 7A and 7B, FIGS. 8A to 8D, FIGS. 9A to 9D, and FIGS. 10A to 10C.

<<Structural Example 1 of Semiconductor Device>>

FIGS. 1A to 1D are a top view and cross-sectional views of a transistor 10A. FIG. 1A is the top view. FIG. 1B illustrates a cross section along dashed-dotted line Y1-Y2 in FIG. 1A. FIG. 1C illustrates a cross section along dashed-dotted line X1-X2 in FIG. 1A. FIG. 1D illustrates a cross section along dashed-dotted line X3-X4 in FIG. 1A. In FIGS. 1A to 1D, some components are scaled up or down or omitted for easy understanding. In some cases, the direction of the dashed-dotted line Y1-Y2 is referred to as a channel length direction and the direction of the dashed-dotted line X1-X2 is referred to as a channel width direction.

The transistor 10A includes a substrate 11, an insulating film 12 over the substrate 11, a conductive film 25 over the insulating film 12, an insulating film 13 over the insulating film 12 and the conductive film 25, an insulating film 14 over the insulating film 13, a semiconductor 21 over the insulating film 14, semiconductors 22a to 22d in contact with a top surface of the semiconductor 21, conductive films 15a and 16a in contact with a top surface of the semiconductor 22a, conductive films 15b and 16b in contact with a top surface of the semiconductor 22b, conductive films 15c and 16c in contact with a top surface of the semiconductor 22c, conductive films 15d and 16d in contact with a top surface of the semiconductor 22d, a semiconductor 23 in contact with the semiconductor 21, the semiconductors 22a to 22d, the conductive films 15a to 15d, and the conductive films 16a to 16d, an insulating film 17 over the semiconductor 23, a conductive film 24 over the insulating film 17, an insulating film 18 over the insulating film 17 and the conductive film 24, and an insulating film 19 over the insulating film 18.

Note that the semiconductors 21, 22a, and 23 are collectively referred to as a semiconductor 20a. The semiconductors 21, 22b, and 23 are collectively referred to as a semiconductor 20b. The semiconductors 21, 22c, and 23 are collectively referred to as a semiconductor 20c. The semiconductors 21, 22d, and 23 are collectively referred to as a semiconductor 20d.

The semiconductor 22a includes a first portion provided between the semiconductor 21 and the semiconductor 23, and the conductive film 24 and the first portion overlap with each other with the insulating film 17 positioned therebetween.

The semiconductor 22b includes a second portion provided between the semiconductor 21 and the semiconductor 23, and the conductive film 24 and the second portion overlap with each other with the insulating film 17 positioned therebetween.

The semiconductor 22c includes a third portion provided between the semiconductor 21 and the semiconductor 23, and the conductive film 24 and the third portion overlap with each other with the insulating film 17 positioned therebetween.

The semiconductor 22d includes a fourth portion provided between the semiconductor 21 and the semiconductor 23, and the conductive film 24 and the fourth portion overlap with each other with the insulating film 17 positioned therebetween.

As illustrated in FIGS. 1C and 1D, the semiconductors 20a to 20d have a projected shape. In this specification, this projected-shape semiconductor is referred to as a fin. For example, in FIG. 1C, the transistor 10A includes four fins, which are fins 26a to 26d. Further, a transistor including a plurality of fins is referred to as a multi-channel FET in this specification. In particular, in the case where the semiconductor that forms fins is an oxide semiconductor, the transistor is referred to as a multi-channel OS-FET in this specification.

Note that in the case where the number of fins included in a FET is one, the FET may be referred to as a single-channel FET or a single-channel OS-FET in this specification.

The fin 26a includes the semiconductors 21 and 22a.
The fin 26b includes the semiconductors 21 and 22b.
The fin 26c includes the semiconductors 21 and 22c.
The fin 26d includes the semiconductors 21 and 22d.

At the time of forming the fins 26a to 26d of the transistor 10A, the semiconductor 21 between the fins is partly etched (see FIGS. 1C and 1D).

When attention is focused on adjacent two fins (e.g., the fin 26a and the fin 26b), the semiconductor 22a included in the fin 26a and the semiconductor 22b included in the fin 26b have regions that face each other with the conductive film 24 positioned therebetween.

This can be similarly applied to the other adjacent two fins.

Although the transistor 10A illustrated in FIGS. 1A to 1D includes four fins, the number of fins is not limited to this.

The number of fins included in the transistor 10A may be more than or equal to two and less than four, or may be more than or equal to 4.

The conductive films 15a to 15d function as one of a source and a drain. The conductive films 16a to 16d function as the other of the source and the drain.

The conductive film 24 functions as a first gate electrode.

The insulating film 17 functions as a first gate insulating film.

The conductive film 25 functions as a second gate electrode.

The insulating film 13 and the insulating film 14 function as a second gate insulating film.

Figure 43A:
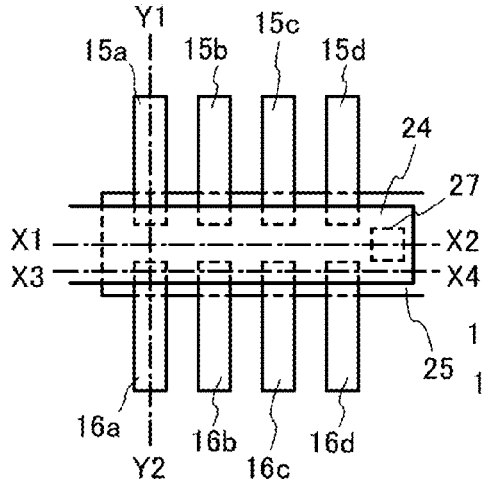
FIGS. 43A to 43D are a top view and cross-sectional views illustrating a structural example of a transistor.
Figure 43B:
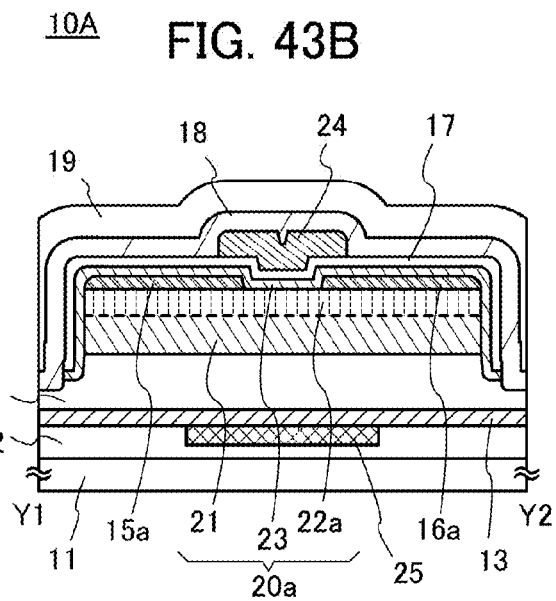
Figure 43C:
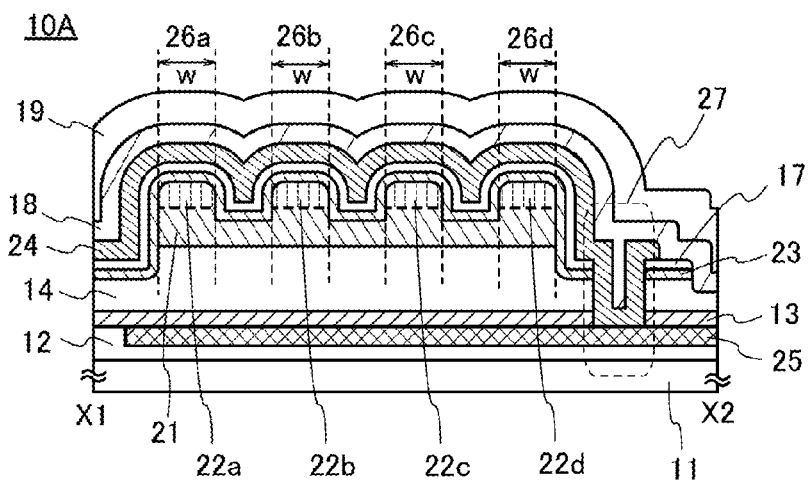
Figure 43D:
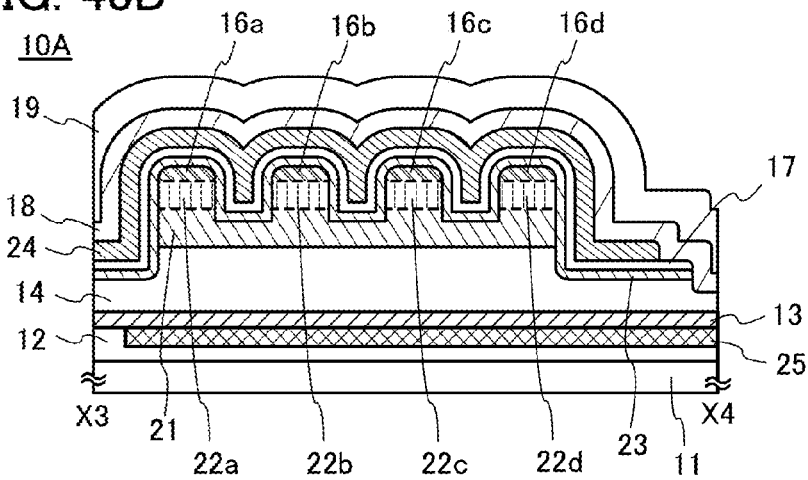

Potentials applied to the conductive films 24 and 25 may be the same or different from each other. An example in which the conductive film 24 and the conductive film 25 of the transistor 10A are connected through a contact hole 27 is illustrated in FIGS. 43A and 43C.

Note that the conductive film 25 may be omitted depending on the cases. An example in which the conductive film 25 of the transistor 10A is omitted is illustrated in FIGS. 44A to 44D.

As illustrated in FIG. 1C, side surfaces of the semiconductors 22a to 22d are surrounded by the conductive film 24. With this structure, the semiconductors 22a to 22d can be electrically surrounded by an electric field of the conductive film 24. Therefore, channels are formed in the entire semiconductors 22a to 22d (bulk) in some cases. A large amount of current can flow between the sources and the drains of the transistor 10A, so that a high on-state current can be obtained.

Especially as the number of fins included in the transistor 10A increases, the on-state current can become higher.

The structure of the transistor 10A is suitable for miniaturization because a high on-state current can be obtained and a short-channel effect can be suppressed. The channel length of the transistor 10A is preferably, for example, greater than or equal to 10 nm and less than 1 µm, further preferably greater than or equal to 10 nm and less than 100 nm, still further preferably greater than or equal to 10 nm and less than 70 nm, yet still further preferably greater than or equal to 10 nm and less than 60 nm, and yet still further preferably greater than or equal to 10 nm and less than 30 nm.

In addition, the width w per fin (see FIG. 1C) in the channel width direction is preferably greater than or equal to 10 nm and less than 1 µm, further preferably greater than or equal to 10 nm and less than 100 nm, still further preferably greater than or equal to 10 nm and less than 70 nm, yet still further preferably greater than or equal to 10 nm and less than 60 nm, and yet still further preferably greater than or equal to 10 nm and less than 30 nm.

<Semiconductor>

Next, a semiconductor that can be used as the semiconductors 20a to 20d is described.

In the transistor 10A, it is preferable that the current flowing between a source and drain in an off state (off-state current) be low. Here, the term "low off-state current" means that a normalized off-state current per micrometer of channel width at room temperature is lower than or equal to $10 \times 10^{-21}$ A. An example of a transistor with such a low off-state current is a transistor including an oxide semiconductor as a semiconductor.

Unless otherwise specified, off-state current in this specification refers to drain current of a transistor in an off state (also referred to as a non-conductive state or a cutoff state). Unless otherwise specified, the off state of an n-channel transistor means that a difference between gate voltage and source voltage ($V_{gs}$) is lower than the threshold voltage ($V_{th}$), and the off state of a p-channel transistor means that $V_{gs}$ is higher than $V_{th}$. For example, the off-state current of an n-channel transistor sometimes refers to drain current that flows when $V_{gs}$ is lower than $V_{th}$. The off-state current of a transistor depends on $V_{gs}$ in some cases. Thus, "the off-state current of a transistor is lower than or equal to $10^{-21}$ A" means "there is $V_{gs}$ with which the off-state current of a transistor becomes lower than or equal to $10^{-21}$ A" in some cases.

The off-state current of a transistor depends on voltage $V_{ds}$ between the drain and source in some cases. Unless otherwise specified, the off-state current in this specification might be off-state current at the time when the absolute value of $V_{ds}$ is 0.1 V, 0.8 V, 1 V, 1.2 V, 1.8 V, 2.5 V, 3 V, 3.3 V, 10 V, 12 V, 16 V, or 20 V. Alternatively, the off-state current of a transistor might be an off-state current at $V_{ds}$ that is used in a semiconductor device or the like including the transistor.

The semiconductors 22a to 22d are each preferably an oxide semiconductor including indium (In). The oxide semiconductor including indium has high carrier mobility (electron mobility). Furthermore, the semiconductors 22a to 22d preferably include an element M. The element M is preferably aluminum (Al), titanium (Ti), gallium (Ga), yttrium (Y), zirconium (Zr), lanthanum (La), cerium (Ce), neodymium (Nd), hafnium (Hf), or the like. Note that two or more of the above elements may be used in combination as the element M. The element M is an element having a high bonding energy with oxygen, for example. The element M is an element whose bonding energy with oxygen is higher than that of indium. The element M is an element that can increase the energy gap of the oxide semiconductor, for example. The semiconductors 22a to 22d preferably include zinc (Zn). When the oxide semiconductor includes zinc, the oxide semiconductor is easily to be crystallized, for example.

Note that the semiconductors 22a to 22d are not limited to the oxide semiconductor containing indium. The semiconductors 22a to 22d may be, for example, an oxide semiconductor which does not contain indium and contains zinc, an oxide semiconductor which does not contain indium and contains gallium, or an oxide semiconductor which does not contain indium and contains tin, e.g., a zinc tin oxide or a gallium tin oxide.

For the semiconductors 22a to 22d, an oxide with a wide energy gap may be used, for example. The energy gap of the semiconductors 22a to 22d is, for example, greater than or equal to 2.5 eV and less than or equal to 4.2 eV, preferably greater than or equal to 2.8 eV and less than or equal to 3.8 eV, further preferably greater than or equal to 3 eV and less than or equal to 3.5 eV.

An oxide semiconductor film with low carrier density is preferably used as the semiconductors 22a to 22d. For example, the semiconductors 22a to 22d have a carrier density of lower than or equal to $1 \times 10^{17}/cm^3$, preferably lower than or equal to $1 \times 10^{15}/cm^3$, further preferably lower than or equal to $1 \times 10^{13}/cm^3$, still further preferably lower than or equal to $8 \times 10^{11}/cm^3$, yet further preferably lower than or equal to $1 \times 10^{11}/cm^3$, still further preferably lower than or equal to $1 \times 10^{10}/cm^3$, and is higher than or equal to $1 \times 10^{-9}/cm^3$.

It is preferable to use, as the semiconductors 22a to 22d, an oxide semiconductor film in which the impurity concentration is low and the density of defect states is low, in which case the transistor can have more excellent electrical characteristics. Here, the state in which the impurity concentration is low and the density of defect states is low (the number of oxygen vacancies is small) is referred to as "highly purified intrinsic" or "substantially highly purified intrinsic". A highly purified intrinsic or substantially highly purified intrinsic oxide semiconductor film has few carrier generation sources, and thus can have low carrier density. Thus, a transistor in which a channel region is formed in the oxide semiconductor film rarely has a negative threshold voltage (is rarely normally on). A highly purified intrinsic or substantially highly purified intrinsic oxide semiconductor film has low density of defect states and accordingly has low density of trap states in some cases. Furthermore, a highly purified intrinsic or substantially highly purified intrinsic oxide semiconductor film has an extremely low off-state current.

The semiconductors 22a to 22d are preferably a CAAC-OS film which will be described later.

The semiconductors 21 and 23 include one or more, or two or more elements other than oxygen included in the semiconductors 22a to 22d. Since the semiconductors 21 and 23 each include one or more, or two or more elements other than oxygen included in the semiconductors 22a to 22d, an interface state is less likely to be formed at the interface between the semiconductor 21 and the semiconductors 22a to 22d and the interface between the semiconductors 22a to 22d and the semiconductor 23.

In the case of using an In-M-Zn oxide as the semiconductor 21 and the summation of In and M is assumed to be 100 atomic %, the proportions of In and M are preferably set to be less than 50 atomic % and greater than 50 atomic %, respectively, further preferably less than 25 atomic % and greater than 75 atomic %, respectively. In the case where the semiconductor 21 is formed by a sputtering method, a sputtering target with the above composition, for example, a sputtering target containing In, M, and Zn at an atomic ratio of 1:3:2, is preferably used.

In the case of using an In-M-Zn oxide as the semiconductors 22a to 22d and the summation of In and M is assumed to be 100 atomic %, the proportions of In and M are preferably set to be greater than 25 atomic % and less than 75 atomic %, respectively, further preferably greater than 34 atomic % and less than 66 atomic %, respectively. In the case where the semiconductors 22a to 22d are formed by a sputtering method, a sputtering target with the above composition, for example, a sputtering target containing In, M, and Zn at an atomic ratio of 1:1:1, 1:1:1.2, 2:1:3, 3:1:2, or 4:2:4.1, is preferably used. In particular, when a sputtering target containing In, Ga, and Zn at an atomic ratio of 4:2:4.1 is used, the semiconductors 22a to 22d may contain In, Ga, and Zn at an atomic ratio of around 4:2:3.

In the case of using an In-M-Zn oxide as the semiconductor 23 and the summation of In and M is assumed to be 100 atomic %, the proportions of In and M are preferably set to be less than 50 atomic % and greater than 50 atomic %, respectively, further preferably less than 25 atomic % and greater than 75 atomic %, respectively. Note that the semiconductor 23 and the semiconductor 21 may be formed using the same type of oxide. Note that the semiconductor 21 and/or the semiconductor 23 do/does not necessarily contain indium in some cases. For example, the semiconductor 21 and/or the semiconductor 23 may be gallium oxide.

Instead of the semiconductor 23, an insulator or a semiconductor having an insulating property may be used. In this case, the semiconductor 23 has a function of a gate insulating film.

Figure 7A:
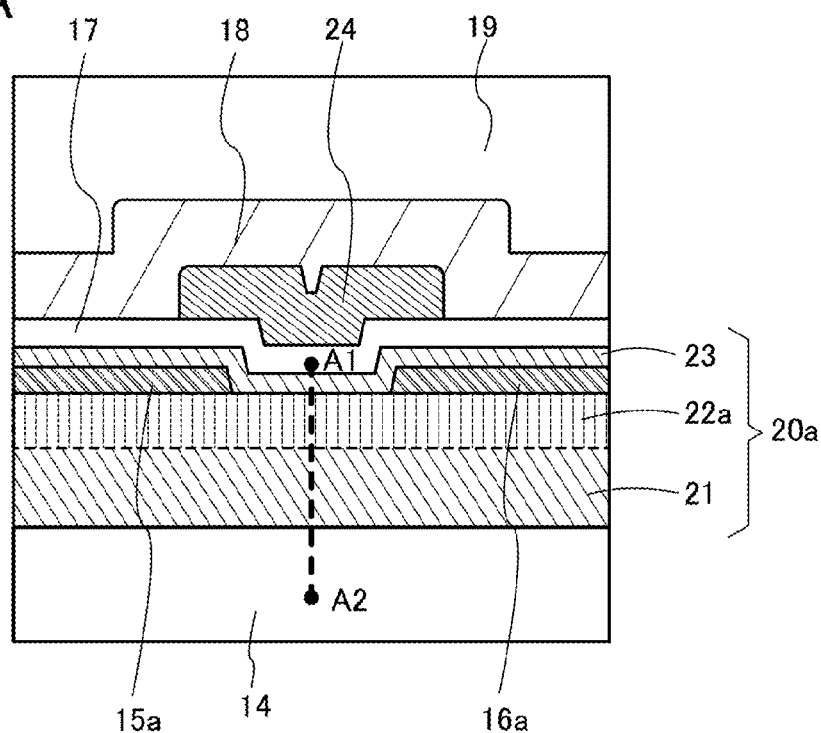
FIG. 7A is a cross-sectional view of a transistor and FIG. 7B is an energy band diagram showing a band structure of the transistor.
Figure 7B:
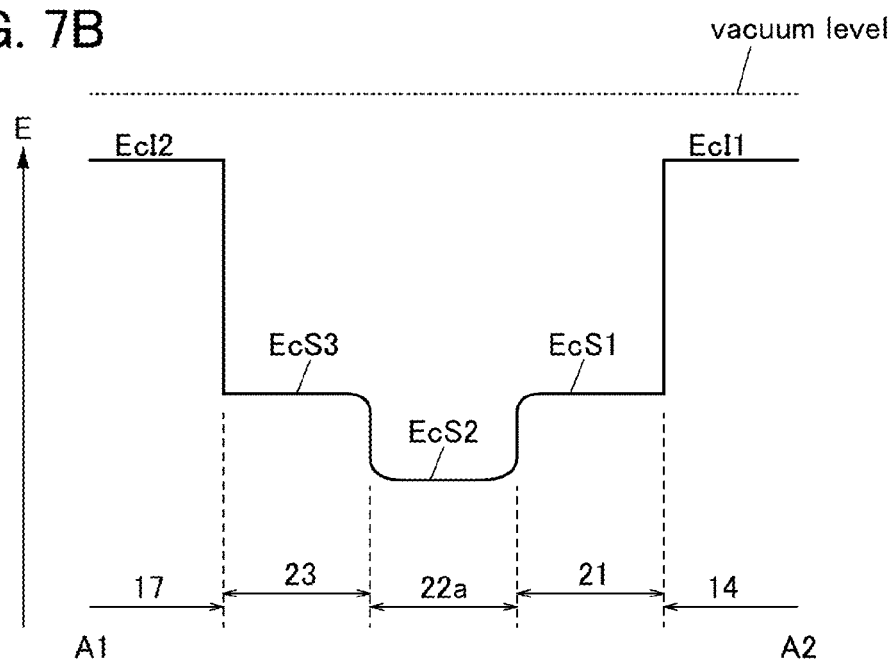

Next, a function and an effect of the semiconductor 20a which is formed of the stacked semiconductors 21, 22a, and 23 will be described using an energy band diagram in FIG. 7B. FIG. 7A is an enlarged view of the channel portion of the transistor 10A illustrated in FIG. 1B. FIG. 7B shows an energy band structure of a portion along the chain line A1-A2 in FIG. 7A.

Although a stacked-layer structure of the semiconductor 20a is described below, the same can apply to the semiconductors 20b to 20d.

In FIG. 7B, EcI1, EcS1, EcS2, EcS3, and EcI2 indicate the energy of the conduction band minimum of the insulating film 14, the semiconductor 21, the semiconductor 22a, the semiconductor 23, and the insulating film 17, respectively.

Here, a difference in energy between the vacuum level and the conduction band minimum (the difference is also referred to as electron affinity) corresponds to a value obtained by subtracting an energy gap from a difference in energy between the vacuum level and the valence band maximum (the difference is also referred to as ionization potential). The energy gap can be measured using a spectroscopic ellipsometer. The energy difference between the vacuum level and the valence band maximum can be measured using an ultraviolet photoelectron spectroscopy (UPS) device.

Since the insulating film 14 and the insulating film 17 are insulators, EcI1 and EcI2 are closer to the vacuum level than EcS1, EcS2, and EcS3 (i.e., the insulating film 14 and the insulating film 17 have a smaller electron affinity than the semiconductor 21, the semiconductor 22a, and the semiconductor 23).

As the semiconductor 22a, an oxide having an electron affinity higher than those of the semiconductors 21 and 23 is used. For example, as the semiconductor 22a, an oxide having an electron affinity higher than those of the semiconductors 21 and 23 by 0.07 eV or higher and 1.3 eV or lower, preferably 0.1 eV or higher and 0.7 eV or lower, further preferably 0.15 eV or higher and 0.4 eV or lower is used. Note that the electron affinity refers to an energy difference between the vacuum level and the conduction band minimum.

An indium gallium oxide has a small electron affinity and a high oxygen-blocking property. Therefore, the semiconductor 23 preferably includes an indium gallium oxide. The gallium atomic ratio [Ga/(In+Ga)] is, for example, higher than or equal to 70%, preferably higher than or equal to 80%, further preferably higher than or equal to 90%.

At this time, when a gate voltage is applied, a channel is formed in the semiconductor 22a having the highest electron affinity among the semiconductors 21, 22a, and 23.

Here, in some cases, there is a mixed region of the semiconductor 21 and the semiconductor 22a between the semiconductor 21 and the semiconductor 22a. Furthermore, in some cases, there is a mixed region of the semiconductor 22a and the semiconductor 23 between the semiconductor 22a and the semiconductor 23. The mixed region has a low interface state density. For that reason, the stack of the semiconductors 21, 22a, and 23 has a band structure where energy at each interface and in the vicinity of the interface is changed continuously (continuous junction).

At this time, electrons move mainly in the semiconductor 22a, not in the semiconductors 21 and 23. As described above, when the interface state density at the interface between the semiconductor 21 and the semiconductor 22a and the interface state density at the interface between the semiconductor 22a and the semiconductor 23 are decreased, electron movement in the semiconductor 22a is less likely to be inhibited and the on-sate current of the transistor 10A can be increased.

As factors of inhibiting electron movement are decreased, the on-state current of the transistor can be increased. For example, in the case where there is no factor of inhibiting electron movement, electrons are assumed to be efficiently moved. Electron movement is inhibited also in the case where physical unevenness in a channel formation region is large, for example.

To increase the on-state current of the transistor, for example, root mean square (RMS) roughness in a measurement area of 1 µm×1 µm of the top surface or the bottom surface of the semiconductor 22a (a formation surface; here, the semiconductor 21) is less than 1 nm, preferably less than 0.6 nm, further preferably less than 0.5 nm, still further preferably less than 0.4 nm. The average surface roughness (also referred to as Ra) in the measurement area of 1 µm×1 µm is less than 1 nm, preferably less than 0.6 nm, further preferably less than 0.5 nm, still further preferably less than 0.4 nm. The maximum peak-to-valley height (P-V) in the measurement area of 1 µm×1 µm is less than 10 nm, preferably less than 9 nm, further preferably less than 8 nm, still further preferably less than 7 nm. RMS roughness, Ra, and P-V can be measured using, for example, a scanning probe microscope SPA-500 manufactured by SII Nano Technology Inc.

The electron movement is also inhibited, for example, in the case where the density of defect states is high in a region where a channel is formed.

For example, in the case where the semiconductor 22a contains oxygen vacancies (also denoted by $V_O$), donor levels are formed by entry of hydrogen into sites of oxygen vacancies in some cases. A state in which hydrogen enters sites of oxygen vacancies is denoted by $V_OH$ in the following description in some cases. $V_OH$ is a factor of decreasing the on-state current of the transistor because $V_OH$ scatters electrons. Note that sites of oxygen vacancies become more stable by entry of oxygen than by entry of hydrogen. Thus, by decreasing oxygen vacancies in the semiconductor 22a, the on-state current of the transistor can be increased in some cases.

For example, the hydrogen concentration at a certain depth in the semiconductor 22a or in a certain region of the semiconductor 22a, which is measured by secondary ion mass spectrometry (SIMS), is higher than or equal to $1\times10^{16}$ atoms/cm$^3$ and lower than or equal to $2\times10^{20}$ atoms/cm$^3$, preferably higher than or equal to $1\times10^{16}$ atoms/cm$^3$ and lower than or equal to $5\times10^{19}$ atoms/cm$^3$, further preferably higher than or equal to $1\times10^{16}$ atoms/cm$^3$ and lower than or equal to $1\times10^{19}$ atoms/cm$^3$, still further preferably higher than or equal to $1\times10^{16}$ atoms/cm$^3$ and lower than or equal to $5\times10^{18}$ atoms/cm$^3$.

To decrease oxygen vacancies in the semiconductor 22a, for example, there is a method in which excess oxygen in the insulating film 14 is moved to the semiconductor 22a through the semiconductor 21. In this case, the semiconductor 21 is preferably a layer having an oxygen-transmitting property (a layer through which oxygen passes or is transmitted).

Note that a channel is formed in the entire semiconductor 22a. Therefore, as the semiconductor 22a has a larger thickness, a channel region becomes larger. In other words, the thicker the semiconductor 22a is, the larger the on-state current of the transistor is.

Moreover, the thickness of the semiconductor 23 is preferably as small as possible to increase the on-state current of the transistor. For example, the semiconductor 23 has a region with a thickness of less than 10 nm, preferably less than or equal to 5 nm, further preferably less than or equal to 3 nm. Meanwhile, the semiconductor 23 has a function of blocking entry of elements other than oxygen (such as hydrogen and silicon) included in the adjacent insulator into the semiconductor 22a where a channel is formed. For this reason, it is preferable that the semiconductor 23 have a certain thickness. For example, the semiconductor 23 may have a region with a thickness of greater than or equal to 0.3 nm, preferably greater than or equal to 1 nm, further preferably greater than or equal to 2 nm. The semiconductor 23 preferably has an oxygen blocking property to suppress outward diffusion of oxygen released from the insulating film 14 and the like.

To improve reliability, it is preferable that the thickness of the semiconductor 21 be large and the thickness of the semiconductor 23 be small. For example, the semiconductor 21 has a region with a thickness of greater than or equal to 10 nm, preferably greater than or equal to 20 nm, further preferably greater than or equal to 40 nm, still further preferably greater than or equal to 60 nm. When the thickness of the semiconductor 21 is made large, the distance from an interface between the adjacent insulator and the semiconductor 21 to the semiconductor 22a in which a channel is formed can be large. However, to prevent the productivity of the semiconductor device from being decreased, the semiconductor 21 has a region with a thickness of, for example, less than or equal to 200 nm, preferably less than or equal to 120 nm, further preferably less than or equal to 80 nm.

For example, a region with a silicon concentration measured by SIMS analysis of higher than or equal to $1\times10^{16}$ atoms/cm$^3$ and lower than $1\times10^{19}$ atoms/cm$^3$, preferably higher than or equal to $1\times10^{16}$ atoms/cm$^3$ and lower than $5\times10^{18}$ atoms/cm$^3$, further preferably higher than or equal to $1\times10^{16}$ atoms/cm$^3$ and lower than $2\times10^{18}$ atoms/cm$^3$ is provided between the semiconductor 22a and the semiconductor 21. A region with a silicon concentration measured by SIMS of higher than or equal to $1\times10^{16}$ atoms/cm$^3$ and lower than $1\times10^{19}$ atoms/cm$^3$, preferably higher than or equal to $1\times10^{16}$ atoms/cm$^3$ and lower than $5\times10^{18}$ atoms/cm$^3$, further preferably higher than or equal to $1\times10^{16}$ atoms/cm$^3$ and lower than $2\times10^{18}$ atoms/cm$^3$ is provided between the semiconductor 22a and the semiconductor 23.

It is preferable to reduce the concentration of hydrogen in the semiconductor 21 and the semiconductor 23 in order to reduce the concentration of hydrogen in the semiconductor 22a. The semiconductor 21 and the semiconductor 23 each have a region in which the concentration of hydrogen measured by SIMS is higher than or equal to $1\times10^{16}$ atoms/cm$^3$ and lower than or equal to $2\times10^{20}$ atoms/cm$^3$, preferably higher than or equal to $1\times10^{16}$ atoms/cm$^3$ and lower than or equal to $5\times10^{19}$ atoms/cm$^3$, further preferably higher than or equal to $1\times10^{16}$ atoms/cm$^3$ and lower than or equal to $1\times10^{19}$ atoms/cm$^3$, still further preferably higher than or equal to $1\times10^{16}$ atoms/cm$^3$ and lower than or equal to $5\times10^{18}$ atoms/cm$^3$.

It is preferable to reduce the concentration of nitrogen in the semiconductor 21 and the semiconductor 23 in order to reduce the concentration of nitrogen in the semiconductor 22a. The semiconductor 21 and the semiconductor 23 each have a region in which the concentration of nitrogen measured by SIMS is higher than or equal to $1\times10^{16}$ atoms/cm$^3$ and lower than $5\times10^{19}$ atoms/cm$^3$, preferably higher than or equal to $1\times10^{16}$ atoms/cm$^3$ and lower than or equal to $5\times10^{18}$ atoms/cm$^3$, further preferably higher than or equal to $1\times10^{16}$ atoms/cm$^3$ and lower than or equal to 1×10$^{18}$ atoms/cm$^3$, still further preferably higher than or equal to 1×10$^{16}$ atoms/cm$^3$ and lower than or equal to 5×10$^{17}$ atoms/cm$^3$.

The three-layer structure of the semiconductors 21, 22a, and 23 is an example. For example, a two-layer structure without the semiconductor 21 or the semiconductor 23 may be employed. A four-layer structure in which any one of the semiconductors described as examples of the semiconductor 21, the semiconductor 22a, and the semiconductor 23 is provided under or over the semiconductor 21 or under or over the semiconductor 23 may be employed. An n-layer structure (n is an integer of 5 or more) in which any one or more of the semiconductors described as examples of the semiconductor 21, the semiconductor 22a, and the semiconductor 23 is/are provided at two or more of the following positions: over the semiconductor 21, under the semiconductor 21, over the semiconductor 23, and under the semiconductor 23, may be employed.

Back to the explanation of the components in FIGS. 1A to 1D.

<Base Insulating Film>

In FIGS. 1A to 1D, the insulating film 12 has a function of electrically separating the substrate 11 and the conductive film 25 from each other.

The insulating film 14 preferably includes an oxide. In particular, the insulating film 14 preferably includes an oxide material from which part of oxygen is released by heating. The insulating film 14 preferably includes an oxide containing oxygen more than that in the stoichiometric composition. By heating, part of oxygen is released from an oxide film containing oxygen more than that in the stoichiometric composition. Oxygen released from the insulating film 14 is supplied to the semiconductors 20a to 20d which are an oxide semiconductor, so that oxygen vacancies in the oxide semiconductor can be reduced. Consequently, changes in electrical characteristics of the transistor can be reduced and the reliability of the transistor can be improved.

The oxide film containing oxygen more than that in the stoichiometric composition is an oxide film of which the amount of released oxygen converted into oxygen atoms is greater than or equal to 1.0×10$^{18}$ atoms/cm$^3$, preferably greater than or equal to 3.0×10$^{20}$ atoms/cm$^3$ in thermal desorption spectroscopy (TDS) analysis under the conditions where the temperature of the film surface is higher than or equal to 100° C. and lower than or equal to 700° C., for example. Note that the temperature of the film surface in the TDS analysis is preferably higher than or equal to 100° C. and lower than or equal to 700° C., or higher than or equal to 100° C. and lower than or equal to 500° C.

The insulating film 13 has a function of preventing oxygen included in the insulating film 14 from decreasing by bonding to metal included in the conductive film 25.

The insulating film 13 has a function of blocking oxygen, hydrogen, water, alkali metal, alkaline earth metal, or the like. By providing the insulating film 13, outward diffusion of oxygen from the semiconductors 20a to 20d and entry of hydrogen, water, or the like into the semiconductors 20a to 20d from the outside can be prevented.

<<Structural Example 2 of Semiconductor Device>>

FIGS. 2A to 2D are a top view and cross-sectional views of a transistor 10B. FIG. 2A is the top view. FIG. 2B illustrates a cross section along dashed-dotted line Y1-Y2 in FIG. 2A. FIG. 2C illustrates a cross section along dashed-dotted line X1-X2 in FIG. 2A. FIG. 2D illustrates a cross section along dashed-dotted line X3-X4 in FIG. 2A. In FIGS. 2A to 2D, some components are scaled up or down or omitted for easy understanding. In some cases, the direction of the dashed-dotted line Y1-Y2 is referred to as a channel length direction and the direction of the dashed-dotted line X1-X2 is referred to as a channel width direction.

At the time of forming the fins 26a to 26d of the transistor 10B illustrated in FIGS. 2A to 2D, the semiconductor 21 between the fins is partly etched (see FIGS. 2C and 2D). The transistor 10B is different from the transistor 10A in that the semiconductor 21 is etched more deeply.

When attention is focused on adjacent two fins (e.g., the fin 26a and the fin 26b), the semiconductor 22a included in the fin 26a and the semiconductor 22b included in the fin 26b have regions that face each other with the conductive film 24 positioned therebetween. In addition, the semiconductor 21 included in the fin 26a and the semiconductor 21 included in the fin 26b have regions that face each other with the conductive film 24 positioned therebetween.

This can be similarly applied to the other adjacent two fins.

In the transistor 10B, side surfaces of the semiconductors 22a to 22d functioning as channel regions are completely surrounded by the conductive film 24, so that a gate electric field can be applied to the semiconductors 22a to 22d more effectively. As a result, the transistor 10B can have a higher on-state current than the transistor 10A.

The other structures of the transistor 10B are the same as those of the transistor 10A, and therefore the description of the transistor 10A can be referred to for the other structures.

<<Structural Example 3 of Semiconductor Device>>

Figure 3B:
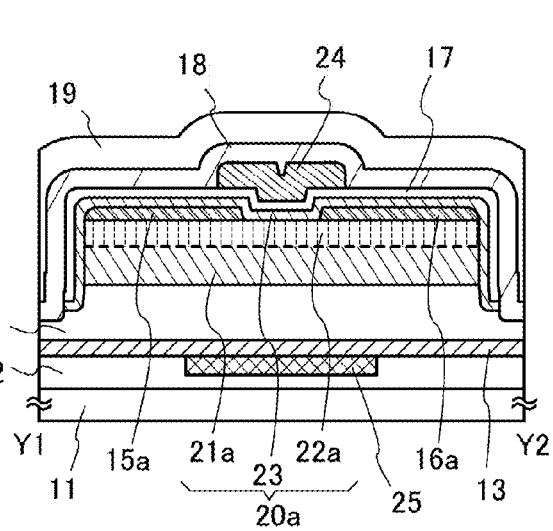
Figure 3C:
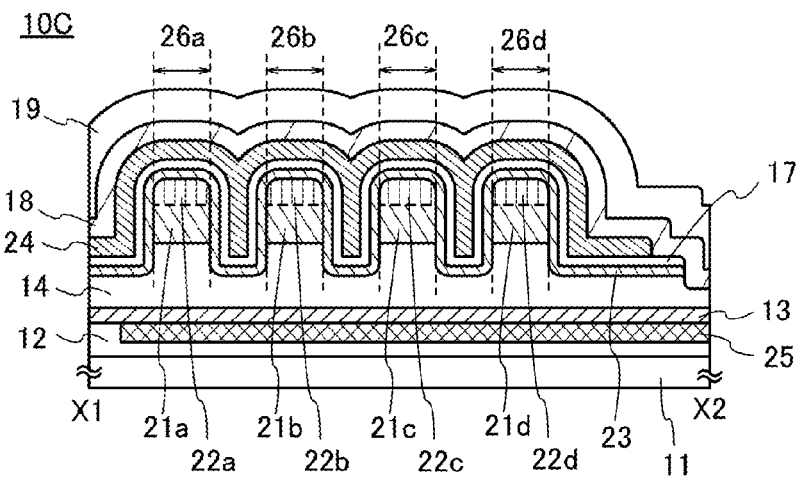
Figure 3D:
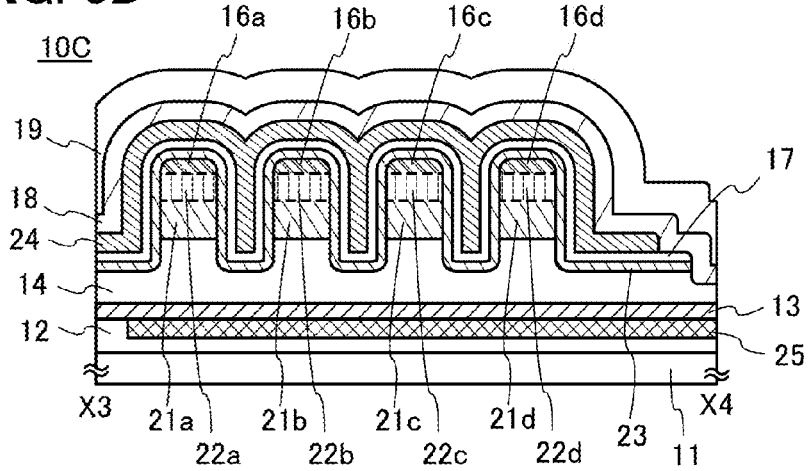

FIGS. 3A to 3D are a top view and cross-sectional views of a transistor 10C. FIG. 3A is the top view. FIG. 3B illustrates a cross section along dashed-dotted line Y1-Y2 in FIG. 3A. FIG. 3C illustrates a cross section along dashed-dotted line X1-X2 in FIG. 3A. FIG. 3D illustrates a cross section along dashed-dotted line X3-X4 in FIG. 3A. In FIGS. 3A to 3D, some components are scaled up or down or omitted for easy understanding. In some cases, the direction of the dashed-dotted line Y1-Y2 is referred to as a channel length direction and the direction of the dashed-dotted line X1-X2 is referred to as a channel width direction.

The fin 26a includes a semiconductor 21a and the semiconductor 22a.

The fin 26b includes a semiconductor 21b and the semiconductor 22b.

The fin 26c includes a semiconductor 21c and the semiconductor 22c.

The fin 26d includes a semiconductor 21d and the semiconductor 22d.

The transistor 10C is different from the transistors 10A and 10B in that the semiconductor 21 between the fins is entirely etched at the time of forming the fins 26a to 26d (see FIG. 3C).

When attention is focused on adjacent two fins (e.g., the fin 26a and the fin 26b), the semiconductor 22a included in the fin 26a and the semiconductor 22b included in the fin 26b have regions that face each other with the conductive film 24 positioned therebetween. Similarly, the semiconductor 21a included in the fin 26a and the semiconductor 21b included in the fin 26b have regions that face each other with the conductive film 24 positioned therebetween.

This can be similarly applied to the other adjacent two fins.

As for the details of the semiconductors 21a to 21d, the description of the semiconductor 21 illustrated in FIGS. 1A to 1D can be referred to.

In the transistor 10C, not only the semiconductors 22a to 22d but also the semiconductors 21a to 21d are surrounded by the conductive film 24. As a result, a gate electric field can be effectively applied to the semiconductors 21a to 21d, and thus a leakage current that flows through the semiconductors 21a to 21d can be suppressed.

The other structures of the transistor 10C are the same as those of the transistor 10A, and therefore the description of the transistor 10A can be referred to for the other structures.

<<Structural Example 4 of Semiconductor Device>>

Figure 4A:
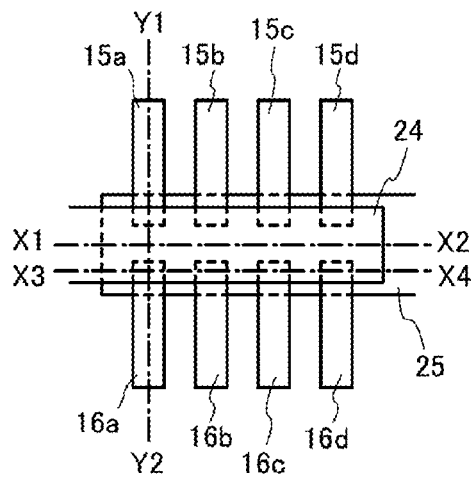
FIGS. 4A to 4D are a top view and cross-sectional views illustrating a structural example of a transistor.
Figure 4B:
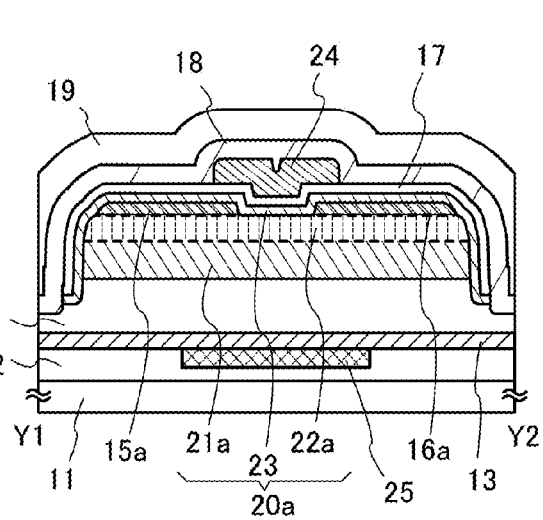
Figure 4C:
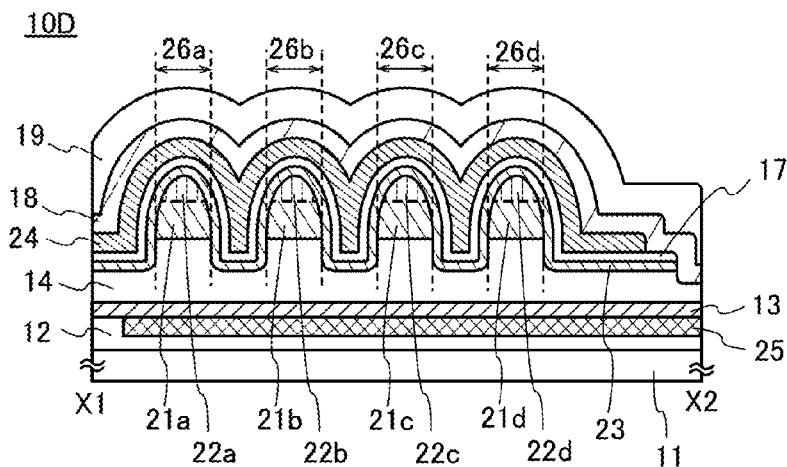
Figure 4D:
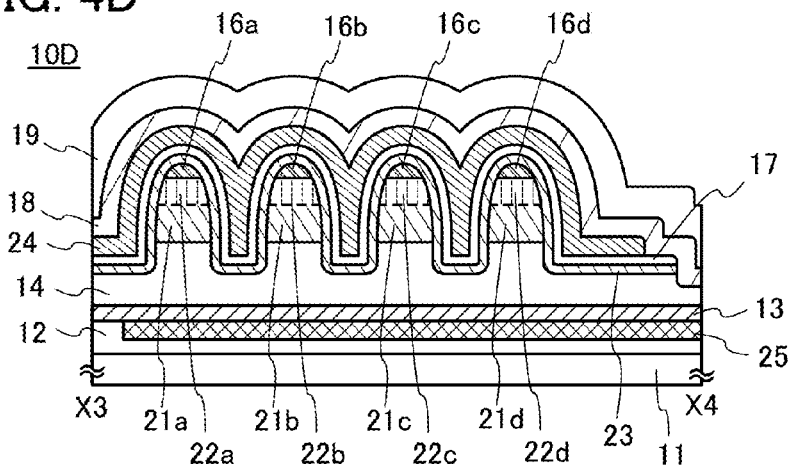
Figure 5A:
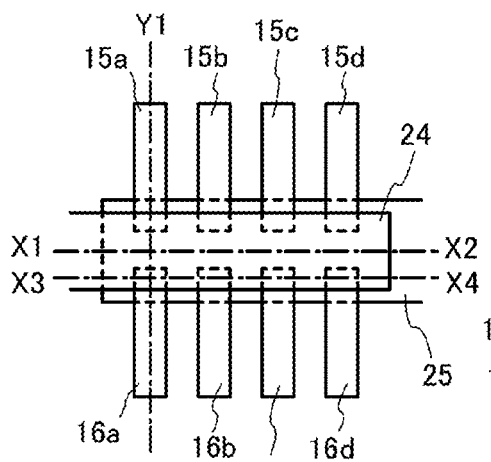
FIGS. 5A to 5D are a top view and cross-sectional views illustrating a structural example of a transistor.
Figure 5B:
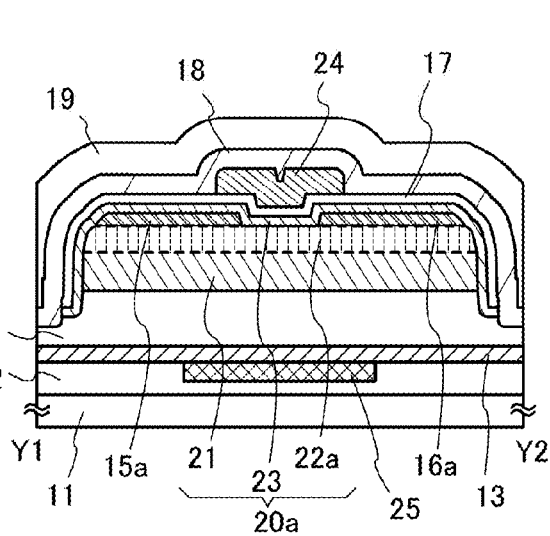
Figure 5C:
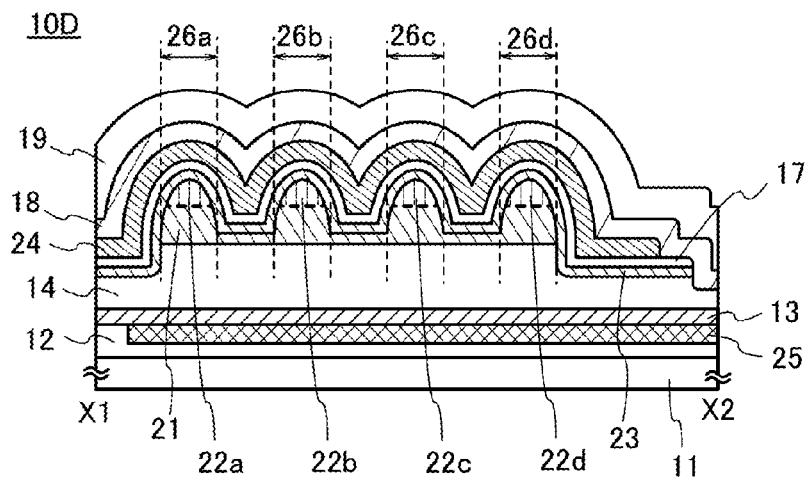
Figure 5D:
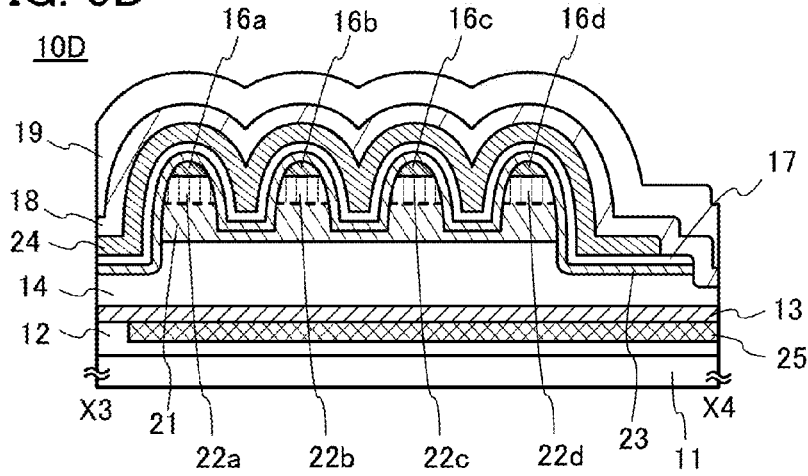

FIGS. 4A to 4D are a top view and cross-sectional views of a transistor 10D. FIG. 4A is the top view. FIG. 4B illustrates a cross section along dashed-dotted line Y1-Y2 in FIG. 4A. FIG. 4C illustrates a cross section along dashed-dotted line X1-X2 in FIG. 4A. FIG. 4D illustrates a cross section along dashed-dotted line X3-X4 in FIG. 4A. In FIGS. 4A to 4D, some components are scaled up or down or omitted for easy understanding. In some cases, the direction of the dashed-dotted line Y1-Y2 is referred to as a channel length direction and the direction of the dashed-dotted line X1-X2 is referred to as a channel width direction.

In FIGS. 4C and 4D illustrating the transistor 10D, tips of the fins 26a to 26d each have a peak. The transistor 10D is different from the transistor 10C in that the tips of the fins 26a to 26d become narrower toward their peaks (see FIGS. 4C and 4D).

By having the above-described shape, the transistor 10D can effectively apply a gate electric field to the semiconductors 22a to 22d. Furthermore, the downsizing of the fins is easy, and many fins can be arranged in the channel width direction. As a result, the transistor 10D can have a high on-state current.

The other structures of the transistor 10D are the same as those of the transistor 10C, and therefore the description of the transistor 10C can be referred to for the other structures.

Note that in the transistor 10D, the semiconductor 21 between the fins may be partly left without being entirely etched, as in the transistors 10A and 10B (see FIGS. 5A to 5D).

<<Structural Example 5 of Semiconductor Device

FIGS. 6A to 6D are a top view and cross-sectional views of a transistor 10E. FIG. 6A is the top view. FIG. 6B illustrates a cross section along dashed-dotted line Y1-Y2 in FIG. 6A. FIG. 6C illustrates a cross section along dashed-dotted line X1-X2 in FIG. 6A. FIG. 6D illustrates a cross section along dashed-dotted line X3-X4 in FIG. 6A. In FIGS. 6A to 6D, some components are scaled up or down or omitted for easy understanding. In some cases, the direction of the dashed-dotted line Y1-Y2 is referred to as a channel length direction and the direction of the dashed-dotted line X1-X2 is referred to as a channel width direction.

Instead of the conductive films 15a to 15d and the conductive films 16a to 16d of the transistor 10C illustrated in FIGS. 3A to 3D, one conductive film 15 and one conductive film 16 are formed in the transistor 10E illustrated in FIGS. 6A to 6D (see FIGS. 6A and 6D).

The other structures of the transistor 10E are the same as those of the transistor 10C, and therefore the description of the transistor 10C can be referred to for the other structures.

Because the conductive films 15 and 16 functioning as the source and drain electrodes are formed on the side surfaces of the semiconductors 22a to 22d in the transistor 10E (see FIG. 6D), a high on-state current can be obtained.

Note that in the transistor 10E, the semiconductor 21 between the fins may be partly left without being entirely etched, as in the transistors 10A and 10B.

Like the transistor 10D, the transistor 10E may have a shape in which the tips of the fins become narrower toward their peaks.

<<Manufacturing Method of Semiconductor Device>>

A method for manufacturing the transistor 10D illustrated in FIGS. 4A to 4D will be described below with reference to FIGS. 8A to 8D and FIGS. 9A to 9D. Note that cross-sectional views of the transistor in the channel length direction (cross-sectional views along dashed-dotted line Y1-Y2 in FIG. 4A) are shown on the left side of FIGS. 8A to 8D and FIGS. 9A to 9D, and cross-sectional views of the transistor in the channel width direction (cross-sectional views along dashed-dotted line X1-X2 in FIG. 4A) are shown on the right side of FIGS. 8A to 8D and FIGS. 9A to 9D.

First, an insulating film 12a is formed over the substrate 11. Then, the conductive film 25 is formed, followed by formation of an insulating film 12b (see FIG. 8A).

As the substrate 11, for example, an insulator substrate, a semiconductor substrate, or a conductor substrate may be used. As the insulator substrate, for example, a glass substrate, a quartz substrate, a sapphire substrate, a stabilized zirconia substrate (e.g., an yttria-stabilized zirconia substrate), or a resin substrate is used. As the semiconductor substrate, for example, a single material semiconductor substrate made of silicon, germanium, or the like, a compound semiconductor substrate made of silicon carbide, silicon germanium, gallium arsenide, indium phosphide, zinc oxide, or gallium oxide, or the like is used. The above semiconductor substrate in which an insulator region is provided, e.g., a silicon on insulator (SOI) substrate may also be used. As the conductor substrate, a graphite substrate, a metal substrate, an alloy substrate, a conductive resin substrate, or the like is used. A substrate including a metal nitride, a substrate including a metal oxide, or the like is used. An insulator substrate provided with a conductor or a semiconductor, a semiconductor substrate provided with a conductor or an insulator, a conductor substrate provided with a semiconductor or an insulator, or the like may also be used. Alternatively, any of these substrates over which an element is provided may be used. As the element provided over the substrate, a capacitor, a resistor, a switching element, a light-emitting element, a memory element, or the like is used.

Alternatively, a flexible substrate may be used as the substrate 11. As a method for providing a transistor over a flexible substrate, there is a method in which the transistor is formed over a non-flexible substrate and then the transistor is separated and transferred to the substrate 11 which is a flexible substrate. In that case, a separation layer is preferably provided between the non-flexible substrate and the transistor. As the substrate 11, a sheet, a film, or a foil containing a fiber may be used. The substrate 11 may have elasticity. The substrate 11 may have a property of returning to its original shape when bending or pulling is stopped. Alternatively, the substrate 11 may have a property of not returning to its original shape. The thickness of the substrate 11 is, for example, greater than or equal to 5 µm and less than or equal to 700 µm, preferably greater than or equal to 10 µm and less than or equal to 500 µm, further preferably greater than or equal to 15 µm and less than or equal to 300 µm. When the substrate 11 has a small thickness, the weight of the semiconductor device can be reduced. When the substrate 11 has a small thickness, even in the case of using glass or the like, the substrate 11 may have elasticity or a property of returning to its original shape when bending or pulling is stopped. Therefore, an impact applied to the semiconductor device over the substrate 11, which is caused by dropping or the like, can be reduced. That is, a durable semiconductor device can be provided.

For the substrate 11 which is a flexible substrate, for example, metal, an alloy, resin, glass, or fiber thereof can be used. The flexible substrate 11 preferably has a lower coefficient of linear expansion because deformation due to an environment is suppressed. The flexible substrate 11 is formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, acrylic, and polytetrafluoroethylene (PTFE). In particular, aramid is preferably used for the flexible substrate 11 because of its low coefficient of linear expansion.

As a material for the insulating films 12a and 12b, a material containing silicon oxide, silicon nitride, silicon oxynitride, or silicon nitride oxide is preferably used. Alternatively, a metal oxide such as aluminum oxide, aluminum oxynitride, gallium oxide, gallium oxynitride, yttrium oxide, yttrium oxynitride, hafnium oxide, or hafnium oxynitride can be used. Note that in this specification, "oxynitride" refers to a material that contains oxygen at a higher proportion than nitrogen, and a "nitride oxide" refers to a material that contains nitrogen at a higher proportion than oxygen.

The insulating films 12a and 12b may be formed using silicon oxide with high step coverage which is formed by reacting tetraethyl orthosilicate (TEOS), silane, or the like with oxygen, nitrous oxide, or the like.

The insulating films 12a and 12b may be formed by a sputtering method, a chemical vapor deposition (CVD) method (including a thermal CVD method, a metal organic CVD (MOCVD) method, a plasma enhanced CVD (PECVD) method, and the like), a molecular beam epitaxy (MBE) method, an atomic layer deposition (ALD) method, a pulsed laser deposition (PLD) method, or the like. In particular, it is preferable that the insulating films be formed by a CVD method, further preferably a plasma CVD method because coverage can be further improved. It is preferable to use a thermal CVD method, an MOCVD method, or an ALD method in order to reduce plasma damage.

In the case of using a semiconductor substrate as the substrate 11, the insulating film 12a may be formed using a thermal oxide film.

The conductive film 25 preferably has a single-layer structure or a layered structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), and strontium (Sr), an alloy of such a low-resistance material, or a compound containing such a material as its main component. It is particularly preferable to use a high-melting-point material which has both heat resistance and conductivity, such as tungsten or molybdenum. In addition, the conductive film is preferably formed using a low-resistance conductive material such as aluminum or copper. The conductive film is more preferably formed using a Cu—Mn alloy, in which case manganese oxide formed at the interface with an insulator containing oxygen has a function of preventing Cu diffusion.

The conductive film 25 can be formed by a sputtering method, a CVD method (including a thermal CVD method, an MOCVD method, a PECVD method, and the like), an MBE method, an ALD method, a PLD method, or the like.

Figure 8A:
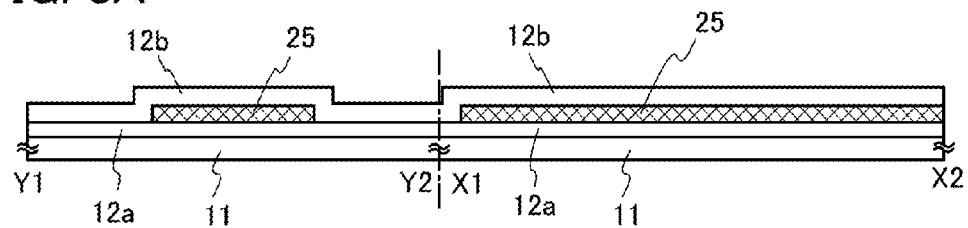
FIGS. 8A to 8D are cross-sectional views illustrating an example of a method for manufacturing a transistor.
Figure 8B:
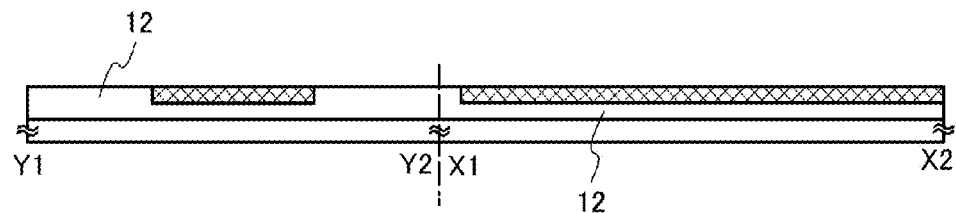

Next, a surface of the insulating film 12b is subjected to planarization by a chemical mechanical polishing (CMP) method (see FIG. 8B).

As the insulating film 12b, a planarization film may be used. At this time, a CMP method or the like is not necessarily used for planarization. The planarization film can be formed by, for example, an atmospheric pressure CVD method, a coating method, or the like. An example of a film which can be formed by an atmospheric pressure CVD method is a film of borophosphosilicate glass (BPSG). Furthermore, an example of a film which can be formed by a coating method is a film of hydrogen silsesquioxane (HSQ).

Hereinafter, the insulating films 12a and 12b are collectively referred to as the insulating film 12.

Figure 8C:
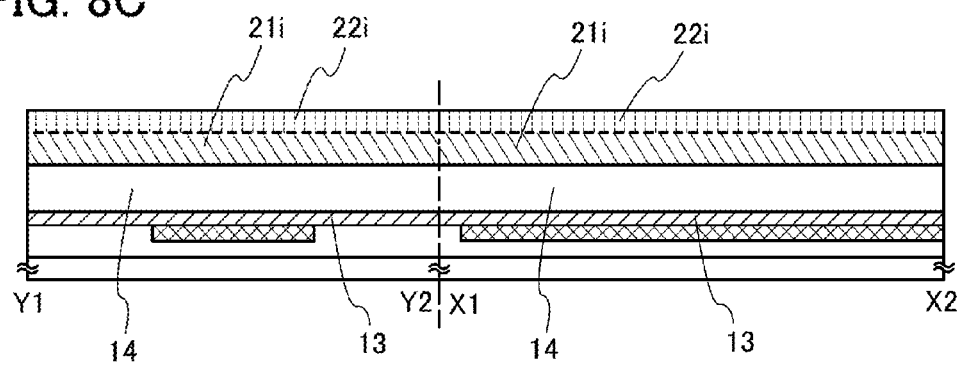

Next, the insulating film 13, the insulating film 14, a semiconductor 21i, and a semiconductor 22i are formed (see FIG. 8C).

The insulating films 13 and 14 may be formed by a sputtering method, a CVD method (including a thermal CVD method, an MOCVD method, a PECVD method, and the like), an MBE method, an ALD method, a PLD method, or the like.

The insulating film 13 preferably has a blocking effect against oxygen, hydrogen, water, alkali metal, alkaline earth metal, and the like. The insulating film 13 can be, for example, a nitride insulating film. The nitride insulating film is formed using silicon nitride, silicon nitride oxide, aluminum nitride, aluminum nitride oxide, or the like. Note that instead of the nitride insulating film, an oxide insulating film may be provided. As the oxide insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, and a hafnium oxynitride film can be given.

The insulating film 14 preferably contains an oxide that can supply oxygen to the semiconductor 21i and the semiconductor 22i. For example, for the insulating film 14, a material containing silicon oxide or silicon oxynitride is preferably used. Alternatively, a metal oxide such as aluminum oxide, aluminum oxynitride, gallium oxide, gallium oxynitride, yttrium oxide, yttrium oxynitride, hafnium oxide, or hafnium oxynitride can be used.

To make the insulating film 14 contain excess oxygen, the insulating film 14 may be formed in an oxygen atmosphere, for example. Alternatively, a region containing excess oxygen may be formed by introducing oxygen into the insulating film 14 that has been formed. Both the methods may be combined.

For example, oxygen (at least including any of oxygen radicals, oxygen atoms, and oxygen ions) may be introduced into the insulating film 14 that has been formed, so that a region containing excess oxygen is formed. Oxygen can be introduced by, for example, an ion implantation method, an ion doping method, a plasma immersion ion implantation method, plasma treatment, or the like.

A gas containing oxygen can be used for oxygen introducing treatment. As the gas containing oxygen, oxygen, nitrous oxide, nitrogen dioxide, carbon dioxide, carbon monoxide, or the like can be used. Furthermore, a rare gas may be included in the gas containing oxygen for the oxygen introducing treatment. Moreover, hydrogen or the like may be included. For example, a mixed gas of carbon dioxide, hydrogen, and argon may be used.

After the insulating film 14 is formed, the insulating film 14 may be subjected to planarization treatment using a CMP method or the like to improve the planarity of the top surface thereof.

The semiconductors 21i and 22i are preferably formed successively without being exposed to the air. The semiconductors 21i and 22i are formed by a sputtering method, a CVD method (including a thermal CVD method, an MOCVD method, a PECVD method, and the like), an MBE method, a PLD method, an ALD method, or the like.

The description of the semiconductor 21 in FIGS. 1A to 1D can be referred to for a material that can be used for the semiconductor 21i. Similarly, the description of the semiconductors 22a to 22d in FIGS. 1A to 1D can be referred to for a material that can be used for the semiconductor 22i.

Note that in the case where In—Ga—Zn oxide layers formed by an MOCVD method are used as the semiconductors 21i and 22i, trimethylindium, trimethylgallium, dimethylzinc, and the like may be used as source gases. The source gases are not limited to the above combination, and triethylindium or the like may be used instead of trimethylindium. Alternatively, triethylgallium or the like may be used instead of trimethylgallium. Still alternatively, diethylzinc or the like may be used instead of dimethylzinc.

Here, after the semiconductor 21i is formed, oxygen may be introduced into the semiconductor 21i. For example, oxygen (including at least any of oxygen radicals, oxygen atoms, and oxygen ions) is introduced into the semiconductor 21i which has been formed, whereby a region containing excess oxygen is formed. Oxygen can be introduced by an ion implantation method, an ion doping method, a plasma immersion ion implantation method, plasma treatment, or the like.

A gas containing oxygen can be used for oxygen introducing treatment. As the gas containing oxygen, oxygen, nitrous oxide, nitrogen dioxide, carbon dioxide, carbon monoxide, or the like can be used. Furthermore, a rare gas may be included in the gas containing oxygen for the oxygen introducing treatment. Moreover, hydrogen or the like may be included. For example, a mixed gas of carbon dioxide, hydrogen, and argon may be used.

After the semiconductors 21i and 22i are formed, heat treatment is preferably performed. The heat treatment may be performed at a temperature higher than or equal to 250° C. and lower than or equal to 650° C., preferably higher than or equal to 300° C. and lower than or equal to 500° C., in an inert gas atmosphere, an atmosphere containing an oxidizing gas at 10 ppm or more, or a reduced pressure state. Alternatively, the heat treatment may be performed in such a manner that heat treatment is performed in an inert gas atmosphere, and then another heat treatment is performed in an atmosphere containing an oxidizing gas at 10 ppm or more, in order to compensate for released oxygen. The heat treatment may be performed directly after the deposition of the semiconductors 21i and 22i or may be performed after the semiconductors 21i and 22i are processed into the island-shaped semiconductors 21a to 22d and the island-shaped semiconductors 22a to 22d. Through the heat treatment, oxygen can be supplied to the semiconductors 21i and 22i from the insulating film 14 and the oxide film; thus, oxygen vacancies in the semiconductors 21i and 22i can be reduced.

Figure 8D:
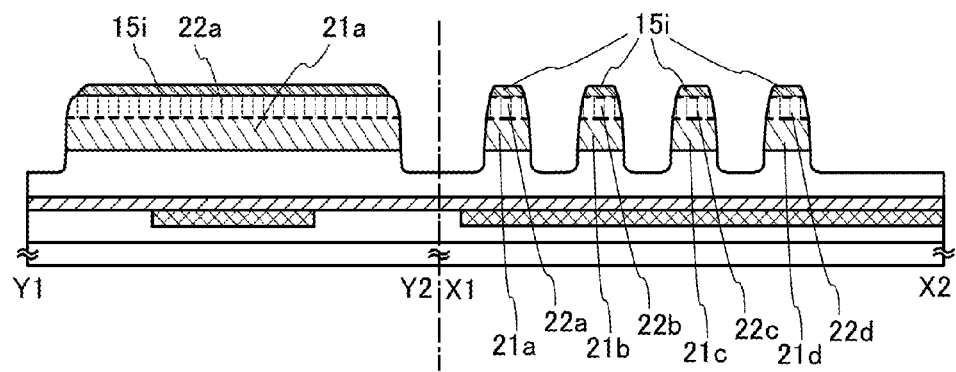

Then, the semiconductors 21i and 22i are processed with the use of a hard mask 15i, so that the island-shaped semiconductors 21a and 22d and the island-shaped semiconductors 22a to 22d are formed (see FIG. 8D). Note that, in some cases, part of the insulating film 14 is etched in the etching of the semiconductors 21i and 22i to reduce the thickness of a portion of the insulating film 14. For this reason, the insulating film 14 is preferably formed to have a large thickness so as not to be removed by the etching.

The hard mask 15i preferably has a single-layer structure or a layered structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), and strontium (Sr), an alloy of such a low-resistance material, or a compound containing such a material as its main component. It is particularly preferable to use a high-melting-point material which has both heat resistance and conductivity, such as tungsten or molybdenum. In addition, the conductive films are preferably formed using a low-resistance conductive material such as aluminum or copper. The conductive films are further preferably formed using a Cu—Mn alloy, in which case manganese oxide formed at the interface with an insulator containing oxygen has a function of preventing Cu diffusion.

The hard mask 15i is preferably formed using a conductive oxide including noble metal, such as iridium oxide, ruthenium oxide, or strontium ruthenate. Such a conductive oxide hardly takes oxygen from an oxide semiconductor even when it is in contact with the oxide semiconductor and hardly generates oxygen vacancies in the oxide semiconductor.

The hard mask 15i can be formed by a sputtering method, a CVD method (including a thermal CVD method, an MOCVD method, a PECVD method, and the like), an MBE method, an ALD method, a PLD method, or the like.

Figure 9A:
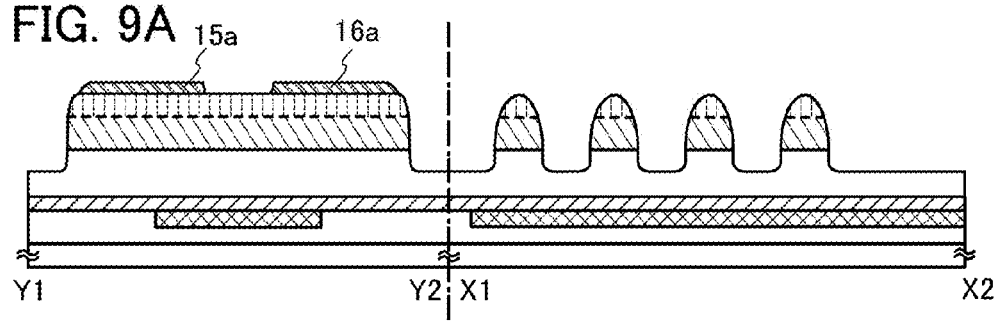
FIGS. 9A to 9D are cross-sectional views illustrating the example of a method for manufacturing a transistor.
Figure 9B:
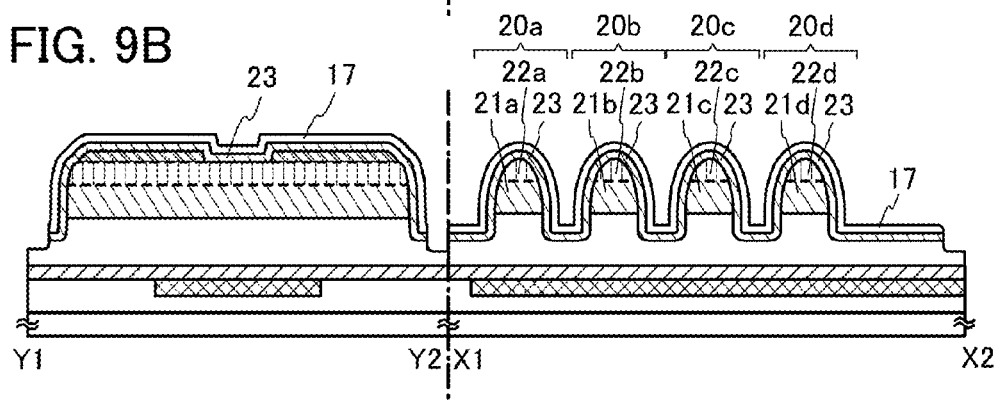

Next, a resist mask is formed, and the hard mask 15i is processed into the conductive films 15a to 15d and the conductive films 16a to 16d by etching (see FIG. 9A). Note that in some cases, upper portions of the semiconductors 22a to 22d and the insulating film 14 are partly etched in etching of the hard mask 15i, so that a portion overlapping with neither the conductive films 15a to 15d nor the conductive films 16a to 16d is thinned. For this reason, the semiconductors 22a to 22d are preferably formed to have a large thickness in advance in consideration of the etching depth.

Then, the semiconductor 23 and the insulating film 17 are formed. After that, a resist mask is formed, the semiconductor 23 and the insulating film 17 are processed by etching, and the resist mask is removed (see FIG. 9B).

Figure 9C:
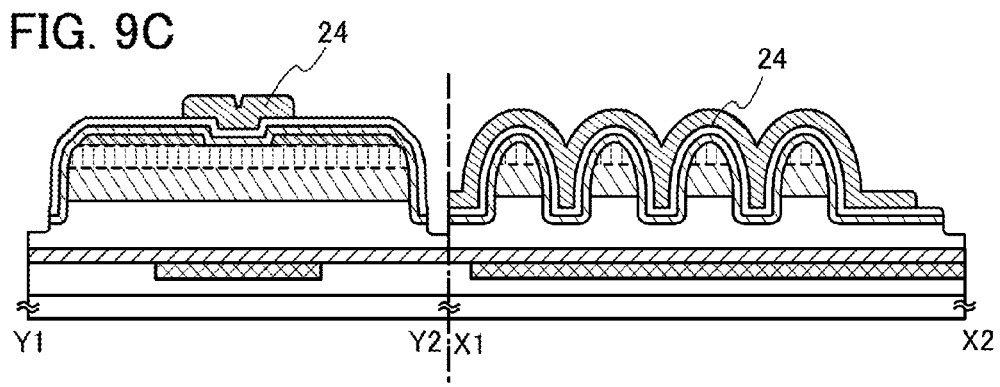

Next, the conductive film is deposited, a resist mask is formed, the conductive film is processed by etching, and the resist mask is removed, whereby the conductive film 24 is formed (see FIG. 9C).

The semiconductor 23, the insulating film 17, and the conductive film 24 can be formed by a sputtering method, a CVD method (including a thermal CVD method, an MOCVD method, a PECVD method, and the like), an MBE method, a PLD method, an ALD method, or the like. In particular, it is preferable to use a CVD method, further preferably a plasma CVD method, because coverage can be further improved. It is preferable to use a thermal CVD method, an MOCVD method, or an ALD method in order to reduce plasma damage.

The semiconductor 23 and the insulating film 17 may be etched after the conductive film 24 is formed. The etching may be performed with a resist mask, for example. Alternatively, the insulating film 17 and the semiconductor 23 may be etched using the conductive film 24 as a mask.

After the semiconductor 23 is formed, oxygen may be introduced into the semiconductor 23. For example, oxygen (including at least any of oxygen radicals, oxygen atoms, and oxygen ions) is introduced into the semiconductor 23 which has been formed, whereby a region containing excess oxygen is formed. Oxygen can be introduced by an ion implantation method, an ion doping method, a plasma immersion ion implantation method, plasma treatment, or the like.

A gas containing oxygen can be used for oxygen introducing treatment. As the gas containing oxygen, oxygen, nitrous oxide, nitrogen dioxide, carbon dioxide, carbon monoxide, and the like can be used. Furthermore, a rare gas may be included in the gas containing oxygen for the oxygen introducing treatment. Moreover, hydrogen or the like may be included. For example, a mixed gas of carbon dioxide, hydrogen, and argon may be used.

The description of the semiconductor 23 in FIGS. 1A to 1D can be referred to for a material that can be used for the semiconductor 23.

The insulating film 17 can be formed using an insulating film containing at least one of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating film 17 may be a stack including any of the above materials. The insulating film 17 may contain lanthanum (La), nitrogen, or zirconium (Zr) as an impurity.

An example of a layered structure of the insulating film 17 is described. The insulating film 17 contains oxygen, nitrogen, silicon, or hafnium, for example. Specifically, the insulating film 17 preferably includes hafnium oxide and silicon oxide or silicon oxynitride.

Hafnium oxide has a higher dielectric constant than silicon oxide and silicon oxynitride. Therefore, the thickness of the insulating film 17 can be made large as compared with the case where silicon oxide is used; as a result, a leakage current due to a tunnel current can be low. That is, it is possible to provide a transistor with a low off-state current.

Figure 9D:
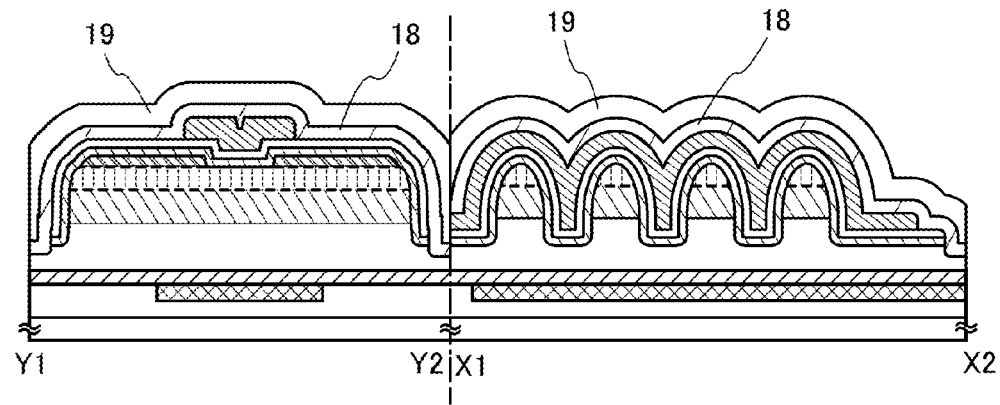

Next, the insulating film 18 and the insulating film 19 are formed (see FIG. 9D).

The insulating film 18 can be formed by a sputtering method, a CVD method (including a thermal CVD method, an MOCVD method, a PECVD method, and the like), an MBE method, an ALD method, a PLD method, or the like, for example. In particular, it is preferable that the insulating film be formed by a CVD method, further preferably a plasma CVD method, because coverage can be further improved. It is preferable to use a thermal CVD method, an MOCVD method, or an ALD method in order to reduce plasma damage.

The insulating film 18 preferably has a blocking effect against oxygen, hydrogen, water, alkali metal, alkaline earth metal, and the like. The insulating film 18 can be, for example, a nitride insulating film. The nitride insulating film is formed using silicon nitride, silicon nitride oxide, aluminum nitride, aluminum nitride oxide, or the like. Note that instead of the nitride insulating film, an oxide insulating film having a blocking effect against oxygen, hydrogen, water, and the like, may be provided. As the oxide insulating film, an aluminum oxide film, an aluminum oxynitride film, a gallium oxide film, a gallium oxynitride film, an yttrium oxide film, an yttrium oxynitride film, a hafnium oxide film, and a hafnium oxynitride film can be given.

An aluminum oxide film is preferably used as the insulating film 18 because it is highly effective in preventing transmission of both oxygen and impurities such as hydrogen and moisture. In addition, oxygen contained in the aluminum oxide film can be diffused into the semiconductors 20a to 20d.

After the insulating film 18 is formed, heat treatment is preferably performed. Through this heat treatment, oxygen can be supplied to the semiconductors 20a to 20d from the insulating film 14 or the like; thus, oxygen vacancies in the semiconductors 20a to 20d can be reduced. Because oxygen released from the insulating film 14 is blocked by the insulating film 13 and the insulating film 18 at this time, the oxygen can be effectively confined. Thus, the amount of oxygen that is supplied to the semiconductors 20a to 20d can be increased, so that oxygen vacancies in the semiconductors 20a to 20d can be effectively reduced.

The insulating film 19 can be formed by a sputtering method, a CVD method (including a thermal CVD method, an MOCVD method, a PECVD method, and the like), an MBE method, an ALD method, a PLD method, or the like. In particular, it is preferable that the insulating film be formed by a CVD method, further preferably a plasma CVD method, because coverage can be improved. It is preferable to use a thermal CVD method, an MOCVD method, or an ALD method in order to reduce plasma damage. In the case where the insulating film 19 is formed using an organic insulating material such as an organic resin, a coating method such as a spin coating method may be used. After the insulating film 19 is formed, the top surface thereof is preferably subjected to planarization treatment.

The insulating film 19 can be formed using an insulator containing at least one of aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, and the like. Alternatively, for the insulating film 19, an organic resin such as a polyimide resin, a polyamide resin, an acrylic resin, a siloxane resin, an epoxy resin, or a phenol resin can be used. The insulating film 19 may be a stack including any of the above materials.

By the above-described manufacturing method, the transistor 10D can be manufactured. The other transistors described in this embodiment can also be manufactured by similar manufacturing methods.

<<Other Structural Examples of Semiconductor Device>>

In each of the transistors described with reference to FIGS. 1A to 1D, FIGS. 2A to 2D, FIGS. 3A to 3D, FIGS. 4A to 4D, FIGS. 5A to 5D, and FIGS. 6A to 6D, the semiconductor 23 and the insulating film 17 may be etched at the same time when the conductive film 24 is formed by etching. An example of such a case is illustrated in FIG. 10A.

Figure 10A:
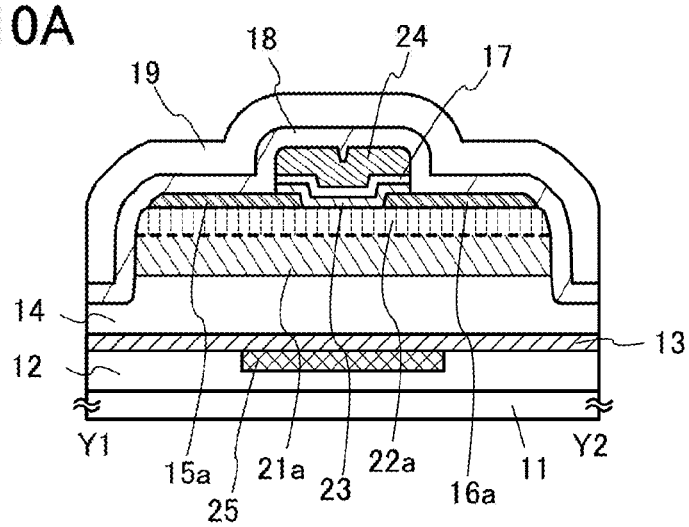
FIGS. 10A to 10C are cross-sectional views each illustrating a structural example of a transistor.

FIG. 10A illustrates a variation of the transistor 10D of FIG. 4B, in which the semiconductor 23 and the insulating film 17 exist only under the conductive film 24.

Figure 10B:
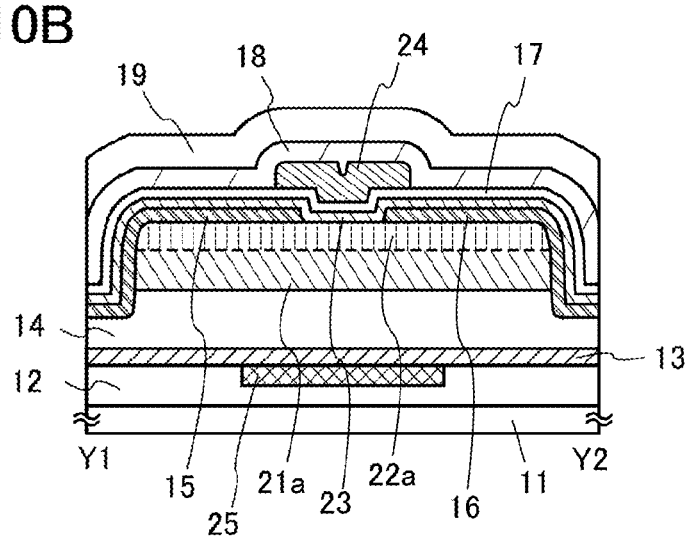

Furthermore, the conductive films 15 and 16 of the transistor 10E illustrated in FIGS. 6A to 6D may be in contact with side surfaces of the semiconductors 21a to 21d and the side surfaces of the semiconductors 22a to 22d. An example of such a case is illustrated in FIG. 10B.

Moreover, in the transistors illustrated in FIGS. 1A to 1D, FIGS. 2A to 2D, FIGS. 3A to 3D, and FIGS. 4A to 4D, the conductive films 15a to 15d and the conductive films 16a to 16d may have a stacked-layer structure including two conductive films. The conductive film 15 and the conductive film 16 of the transistor 10E illustrated in FIGS. 6A to 6D may have a stacked-layer structure including two conductive films. An example of such a case is illustrated in FIG. 10C.

Figure 10C:
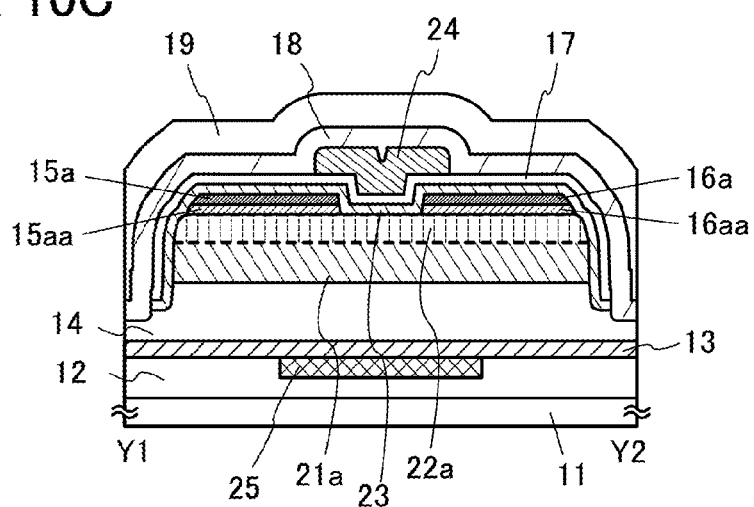

FIG. 10C is a cross-sectional view illustrating a variation of the transistor 10D illustrated in FIG. 4B, in which the conductive film 15a has a stacked-layer structure including a conductive film 15a and a conductive film 15aa and the conductive film 16a has a stacked-layer structure including a conductive film 16a and a conductive film 16aa.

The conductive films 15aa and 16aa may be formed using a transparent conductor, an oxide semiconductor, a nitride semiconductor, or an oxynitride semiconductor, for example. The conductive films 15aa and 16aa may be formed using, for example, a film containing indium, tin, and oxygen, a film containing indium and zinc, a film containing indium, tungsten, and zinc, a film containing tin and zinc, a film containing zinc and gallium, a film containing zinc and aluminum, a film containing zinc and fluorine, a film containing zinc and boron, a film containing tin and antimony, a film containing tin and fluorine, a film containing titanium and niobium, or the like. Alternatively, any of these films may contain hydrogen, carbon, nitrogen, silicon, germanium, or argon.

The conductive films 15aa and 16aa may have a property of transmitting visible light. Alternatively, the conductive films 15aa and 16aa may have a property of not transmitting visible light, ultraviolet light, infrared light, or X-rays by reflecting or absorbing it. In some cases, such a property can suppress a change in electrical characteristics of the transistor due to stray light.

In some cases, it is preferable to use, as the conductive films 15aa and 16aa, a layer which does not form a Schottky barrier with the semiconductor 22a. Accordingly, on-state characteristics of the transistor can be improved.

Each of the conductive films 15aa and 16aa may be formed to have, for example, a single-layer structure or a stacked-layer structure including a conductor containing one or more kinds selected from boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. For example, an alloy film or a compound film may be used, and a conductor containing aluminum, a conductor containing copper and titanium, a conductor containing copper and manganese, a conductor containing indium, tin, and oxygen, a conductor containing titanium and nitrogen, or the like may be used.

In some cases, it is preferable to use, as the conductive films 15aa and 16aa, a film having higher resistance than the conductive films 15a and 16a. Furthermore, in some cases, it is preferable to use, as the conductive films 15aa and 16aa, a film having lower resistance than the channel of the transistor. For example, the conductive films 15aa and 16aa may have a resistivity higher than or equal to 0.1 Ωcm and lower than or equal to 100 Ωcm, higher than or equal to 0.5 Ωcm and lower than or equal to 50 Ωcm, or higher than or equal to 1 Ωcm and lower than or equal to 10 Ωcm. The conductive films 15aa and 16aa having a resistivity within the above range can reduce electric field concentration in a boundary portion between the channel and the drain. Therefore, a change in electrical characteristics of the transistor can be suppressed. In addition, a punch-through current generated by an electric field from the drain can be reduced. Thus, a transistor with a small channel length can have favorable saturation characteristics. Note that in a circuit configuration where the source and the drain do not interchange, only one of the conductive films 15aa and 16aa (e.g., the film on the drain side) may preferably be provided.

The above-described description can be applied to the conductive films 15a to 15d and 16a to 16d in FIGS. 1A to 1D, FIGS. 2A to 2D, FIGS. 3A to 3D, and FIGS. 4A to 4D and the conductive films 15 and 16 in FIGS. 6A to 6D.

(Embodiment 2)

In this embodiment, a nonvolatile memory, a DRAM, a register, and a display device using the transistor described in Embodiment 1 will be described.

<<Nonvolatile Memory>>

FIG. 11A is a block diagram illustrating a structure example of a memory circuit 300. The memory circuit 300 includes a controller 360, a row decoder circuit 361, a row driver circuit 362, a column driver circuit 363, and a memory cell array 370.

The controller 360 is a control circuit for the memory circuit 300, and has a function of generating control signals for controlling the row decoder circuit 361, the row driver circuit 362, and the column driver circuit 363 in accordance with access requirement by a logic portion 230. The row decoder circuit 361, the row driver circuit 362, and the column driver circuit 363 have a function of generating driving signals for driving the memory cell array 370 in accordance with the control signals from the controller 360.

When multivalued data is stored in the memory cell array 370, a structure shown as a memory circuit 300_A in FIG. 11B where an AD converter 364 is provided may be employed. The AD converter 364 may be a flash type, a delta-sigma type, a pipeline type, an integration type, or a successive approximation type.

Figure 12:
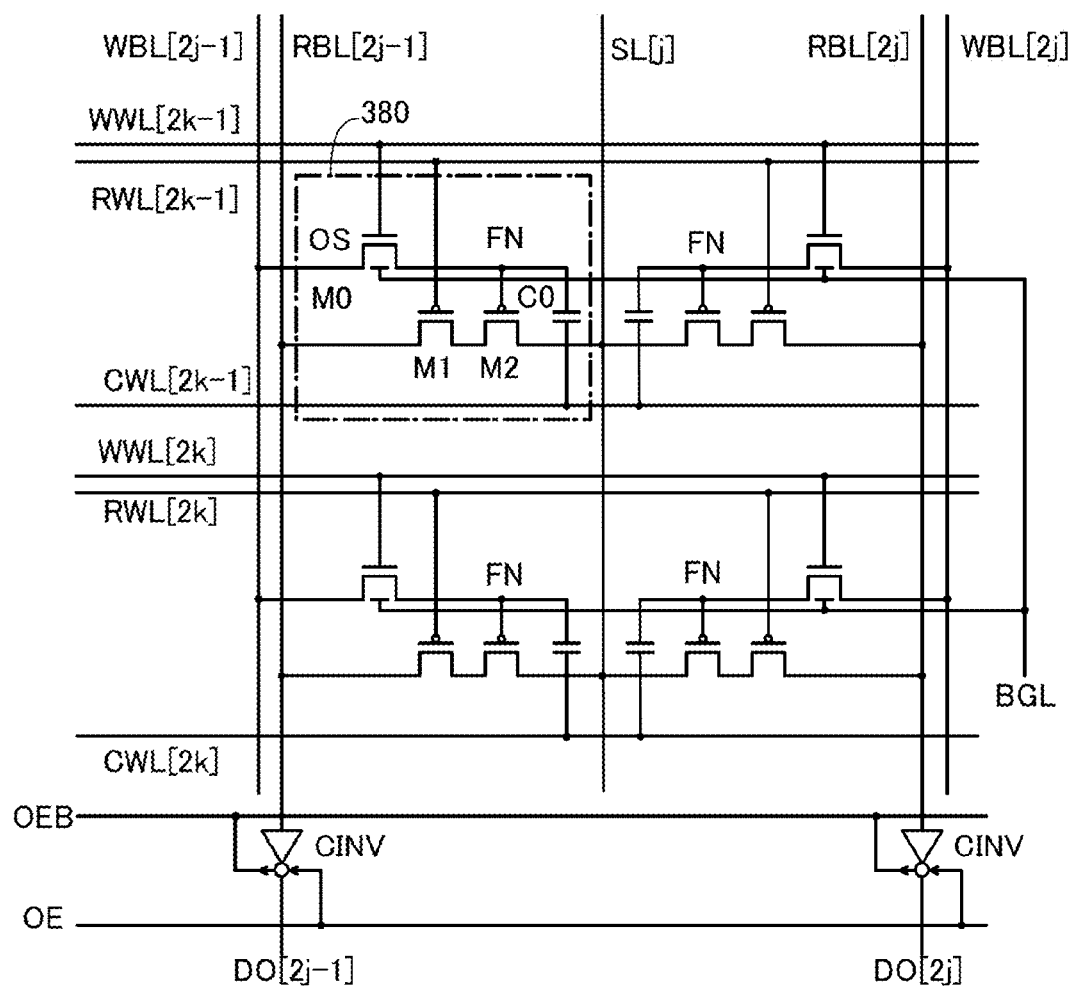
FIG. 12 is a circuit diagram illustrating a structural example of a nonvolatile memory.

The memory cell array 370 is a circuit in which a plurality of memory cells is arranged in an array. FIG. 12 is a circuit diagram illustrating a structure example of the memory cell array 370. FIG. 12 typically illustrates four memory cells 380 in [2j−1, 2k−1] to [2j, 2k] (j and k are integers of 1 or more).

The memory cells 380 each include transistors M0 to M2 and a capacitor C0. Here, the transistor M0 is an n-channel OS transistor. In addition, the transistors M1 and M2 are p-channel Si transistors. A node FN is a data storage portion of the memory cell array 370 that holds a charge as data; in this example, the node FN corresponds to a gate of the transistor M2.

Figure 13:
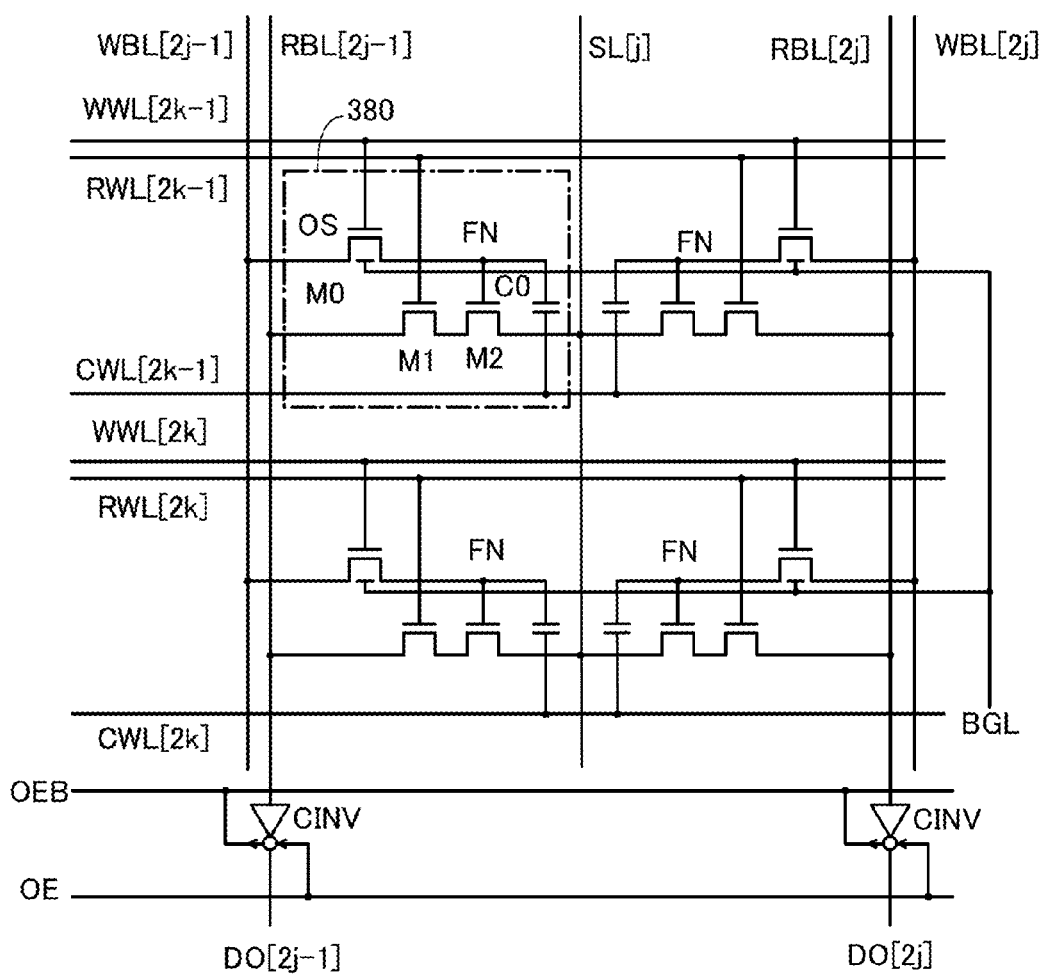
FIG. 13 is a circuit diagram illustrating a structural example of a nonvolatile memory.
Figure 14:
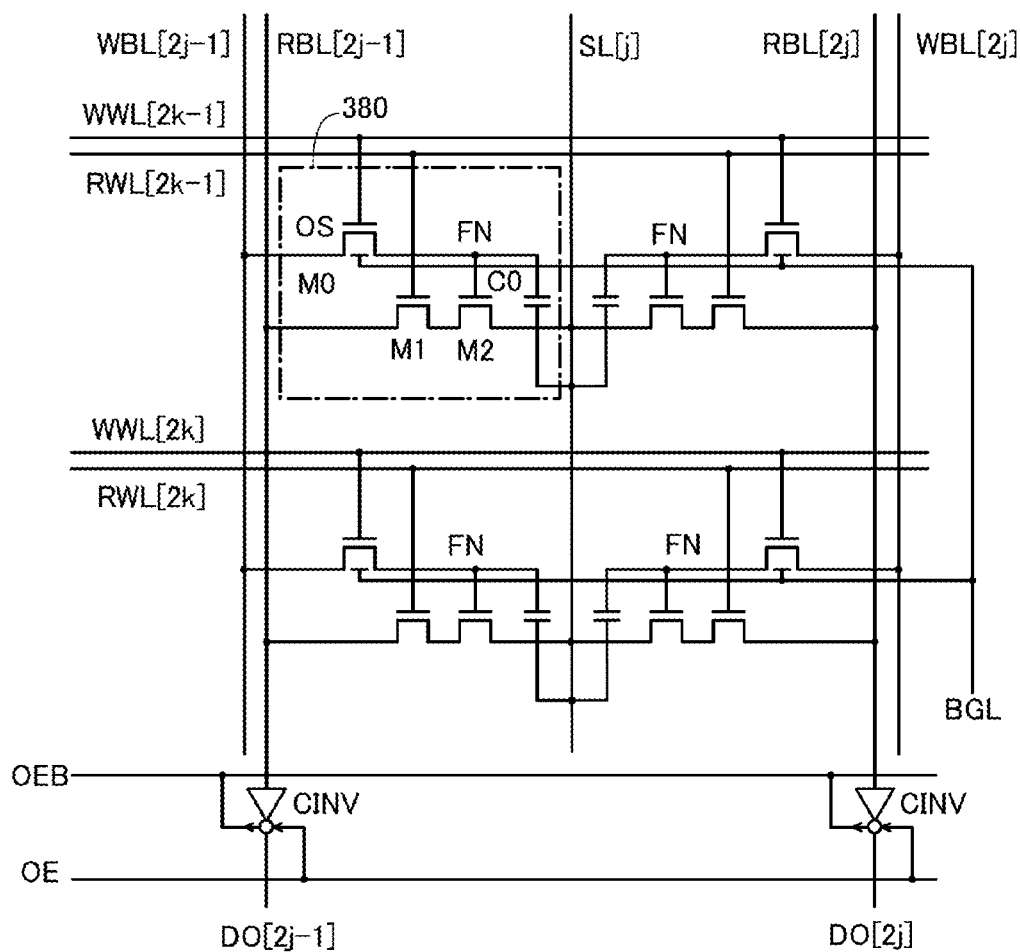
FIG. 14 is a circuit diagram illustrating a structural example of a nonvolatile memory.

The transistors M1 and M2 may be n-channel transistors. An example of a circuit diagram of a memory cell array of that case is shown in FIG. 13. When the transistors M1 and M2 are n-channel transistors, the wiring CWL connected to the capacitor C0 can be omitted and the wiring SL can be connected to the capacitor C0. FIG. 14 shows a circuit diagram of that case. A memory cell array 372 in FIG. 14 can reduce a circuit area because the wiring CWL can be omitted.

The memory cell array 370 is provided with wirings (WWL, RWL, CWL, SL, WBL, RBL) in accordance with the arrangement of the memory cells 380. The memory cells 380 are connected to these wirings in corresponding rows and columns. Moreover, a wiring BGL is provided as a common wiring in the memory cell array 370. A back gate of the transistor M0 in each memory cell 380 is connected to the wiring BGL.

The wirings WWL and RWL function as a writing word line and a reading word line, respectively, and are both connected to the row driver circuit 362. The wiring CWL has a function of supplying a voltage to be applied to the capacitor C0.

The wiring SL functions as a source line and provided in every other column. The wiring WBL functions as a writing bit line and is a wiring to which memory data to be written to the memory cells 380 is supplied from the column driver circuit 363. The wiring RBL functions as a reading bit line and is a wiring to which memory data read out from the memory cells 380 is output. The wirings SL, WBL, and RBL are connected to the column driver circuit 363.

A clocked inverter CINV is connected to an output of the wiring RBL because the voltage level (high/low) of a signal read from the wiring RBL is opposite from the voltage level of written data. In the example of FIG. 12, the voltage of the wiring RBL is high when the voltage of written data is low, while the voltage of the wiring RBL is low when the voltage of written data is high. Wirings OE and OEB are wirings that supply a signal for controlling an output signal of the clocked inverter CINV. The output signal (memory data) of the clocked inverter CINV is output from a wiring DO.

The capacitor C0 functions as a capacitor for holding charges of the node FN. One terminal of the capacitor C0 is connected to the node FN, and the other terminal of the capacitor C0 is connected to the wiring CWL. The wiring CWL is connected to the row driver circuit 362. Note that in the case where charges of the node FN can be held by a capacitor between wirings of the memory cell 380, the capacitor C0 and the wiring CWL need not be provided.

By turning on the transistor M0, a voltage corresponding to the data value ("0", "1") is applied to the node FN. In addition, by turning off the transistor M0, the node FN is brought into an electrically floating state and the memory cell 380 is brought into a data retention state. Since the transistor M0 is an OS transistor, the leakage current flowing between a source and a drain of the transistor M0 in an off state is extremely low. Therefore, the memory cell 380 can retain data for a period of years (e.g., 10 years, approximately) without refresh operation; thus, the memory cell 380 can be used as a nonvolatile memory cell. Moreover, since Vth of the transistor M0 is shifted in the positive direction by applying VBG to the back gate, a voltage lower than Vth can be more certainly applied to the gate of the transistor M0 in the data retention state; accordingly, the memory cell 380 with little data retention errors can be obtained.

The operation of the memory cell array 370 (the memory circuit 300) is described below in more detail with reference to FIG. 15.

Note that in a memory circuit that utilizes an extremely low off-state current of an OS transistor, a predetermined voltage might keep being supplied to the transistor in a period for holding data. For example, a voltage that turns off the transistor completely might keep being supplied to a gate of the transistor. Alternatively, a voltage that shifts the threshold voltage of the transistor to make the transistor in a normally-off state may keep being supplied to a back gate of the transistor. In these cases, the voltage is supplied to the memory circuit in the period for retaining data. However, because almost no current flows, little power is consumed. Because of little power consumption, the memory circuit can be regarded as being substantially nonvolatile even if a predetermined voltage is supplied to the memory circuit.

Figure 15:
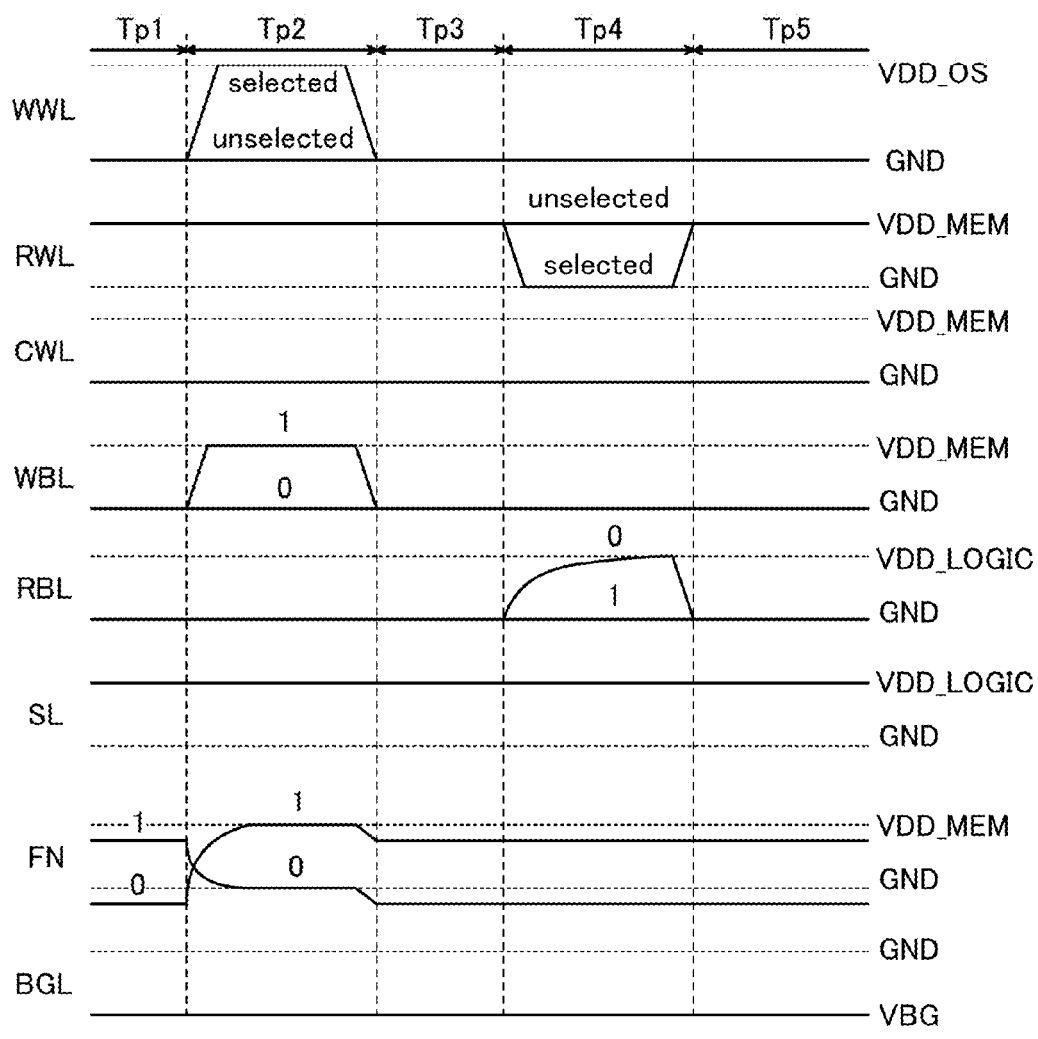
FIG. 15 is a timing chart showing an operation example of a nonvolatile memory.

FIG. 15 is a timing chart showing an operation example of the memory cell array 370 (memory circuit 300). Specifically, FIG. 15 shows waveforms of signals input to the memory cell array 370 and the voltages (high level ("H")/low level ("L")) of wirings and a node included in the memory cell array 370. In this example, a constant voltage is applied to the wirings CWL, SL, and BGL.

In a period Tp1, the memory circuit 300 is in a stand-by state (Stdby). The stand-by state refers to a state in which data is held in the memory circuit 300. The wirings WWL, WBL, and RBL are low and the wiring RWL is high. In the case where "1" is written to the memory cell 380, the voltage of the node FN is "H", while in the case where "0" is written to the memory cell 380, the voltage of the node FN is "L".

A period Tp2 is a writing operation period. The wiring WWL in a row to which data is written becomes "H", turning on the transistor M0, whereby the node FN is connected to the wiring WBL. In the case of writing "1", the wiring WBL is "H"; accordingly, the node FN is also "H". In contrast, in the case of writing "0", the wiring WBL is "L"; accordingly, the node FN is also "L". By setting the wiring WWL at "L" to turn off the transistor M0, the data writing operation is terminated and the memory cell 380 is brought into a stand-by state.

In a period Tp3 (stand-by period), the transistor M0 is changed from an on state to an off state, whereby capacitive coupling between the node FN and the gate of the transistor M0 is caused and the voltage of the node FN is decreased. As described above, since Vth of the transistor M0 is shifted in the positive direction by applying a negative voltage VBG to a back gate, the leakage current of the transistor M0 is extremely low. Therefore, the voltage that is recognized as the data "1" can be held at the node FN for a period of years (e.g., 10 years, approximately).

A period Tp4 is a reading operation period. The wiring RWL in a row from which data is read becomes "L", turning on the transistor M1 in the row. The wiring RWL in the other rows remains "H". In the case where "1" is stored in the memory cell 380, the transistor M2 is in an off state, and thus the wiring RBL remains "L". In the case where "0" is stored, the transistor M2 is also in an on state, so that the transistors M1 and M2 connect the wiring RBL to the wiring SL; accordingly, the voltage level of RBL becomes "H". The voltage level of a signal read to the wiring RBL is inverted by the clocked inverter CNV and output to the wiring DO.

In a period Tp5, the memory circuit 300 is in a stand-by state, in which the voltage levels of the node FN and the wirings are the same as that in the period Tp1.

Figure 16:
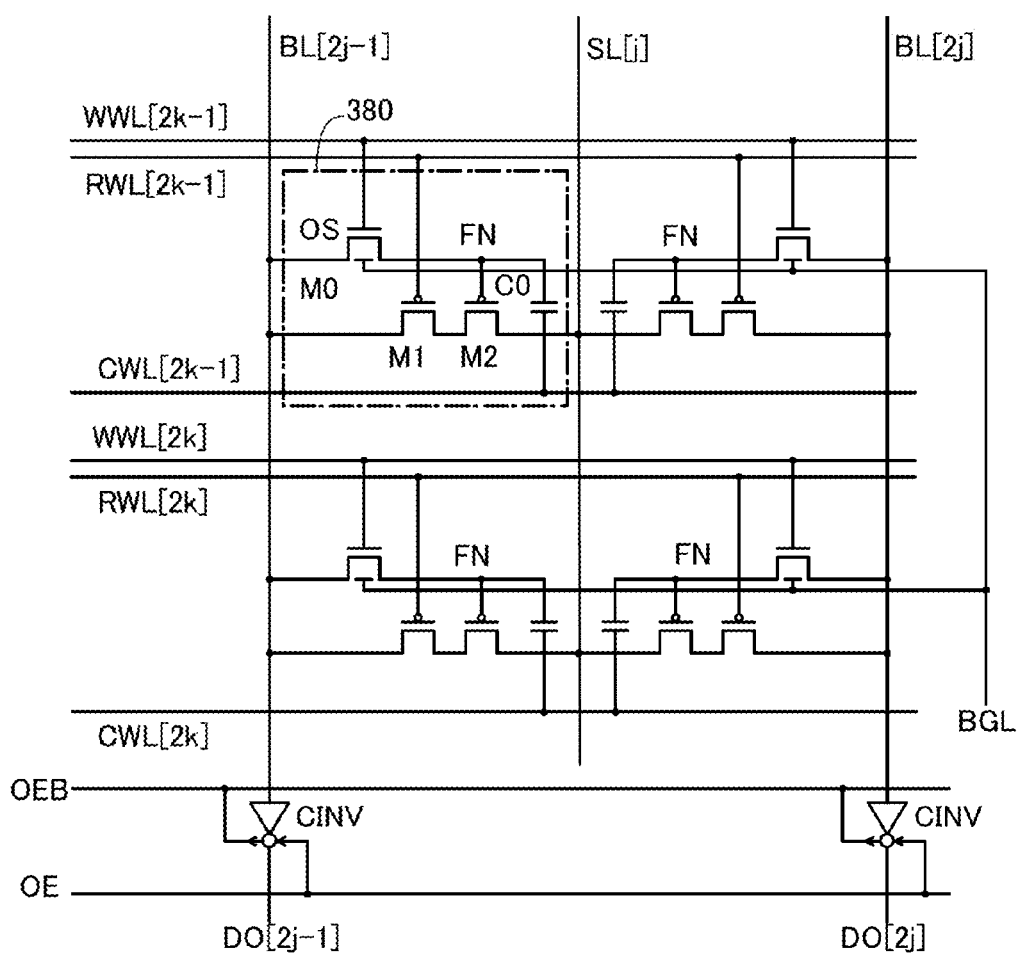
FIG. 16 is a circuit diagram illustrating a structural example of a nonvolatile memory.

FIG. 16 illustrates another structure example of the memory cell array. A memory cell array 373 illustrated in FIG. 16 is a modification example of the memory cell array 370. The memory cell array 373 is different from the memory cell array 370 in having a wiring BL serving as both the wiring WBL and the wiring RBL. That is, in the example of FIG. 12, two kinds of bit lines which are for writing and for reading are provided, while in the example of FIG. 16, one kind of bit line is provided.

Figure 17:
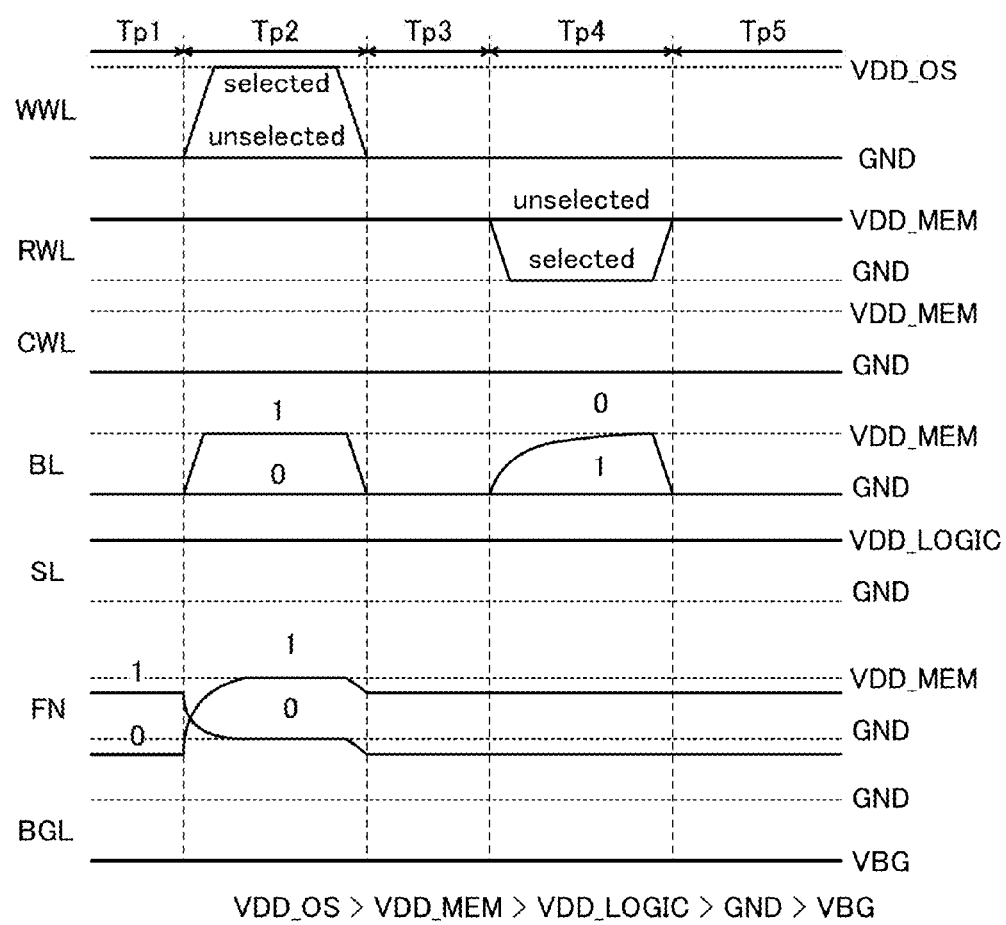
FIG. 17 is a timing chart showing an operation example of a nonvolatile memory.

FIG. 17 is a timing chart showing an operation example of the memory cell array 373. As shown in FIG. 17, the memory cell array 373 can be driven in a manner similar to that of the memory cell array 370. The wiring BL has both functions of the wirings WBL and RBL. In the writing operation period (Tp2), in the case of writing "1" to the memory cell 380, the wiring BL is "H"; while in the case of writing "0", the wiring BL is "L". In the reading operation period (Tp4), in the case where "1" is stored in the memory cell 380, the transistor M2 is in an off state, and thus the wiring BL remains "L". In the case where "0" is stored, the transistor M2 is also in an on state, so that the transistors M1 and M2 connect the wiring BL to the wiring SL; accordingly, the voltage level of the wiring BL becomes "H". The logical value of a signal read to the wiring BL is inverted by the clocked inverter CNV and then output to the wiring DO.

<Structural Example of Chip>

Figure 18:
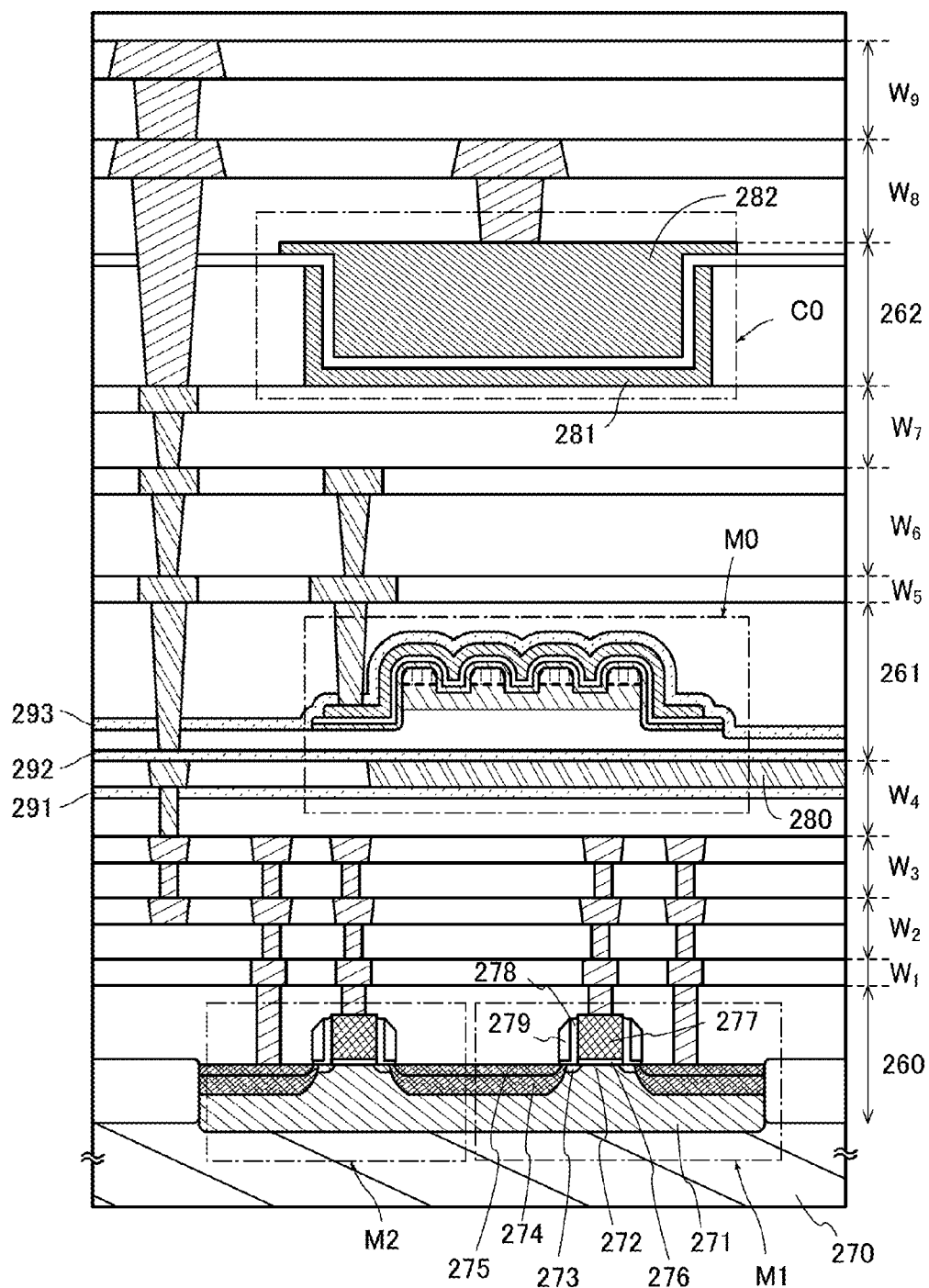
FIG. 18 is a cross-sectional view illustrating a structural example of a nonvolatile memory.

FIG. 18 specifically illustrates the structure of the memory cell 380. FIG. 18 illustrates an example in which the transistors M0, M1, and M2 and the capacitor C0 that are included in the memory cell 380 are constructed in one chip.

The chip is formed in and over a substrate 270. As the substrate 270, a single crystal semiconductor substrate or a polycrystalline semiconductor substrate of silicon or silicon carbide, a compound semiconductor substrate of silicon germanium, an SOI substrate, or the like can be used.

Examples of the substrate 270 are a glass substrate, a quartz substrate, a plastic substrate, a metal substrate, a stainless steel substrate, a substrate including stainless steel foil, a tungsten substrate, and a substrate including tungsten foil, a flexible substrate, an attachment film, paper including a fibrous material, and a base film. Examples of the glass substrate are a barium borosilicate glass substrate, an aluminoborosilicate glass substrate, and a soda lime glass substrate. Examples of the flexible substrate are flexible synthetic resin substrates such as substrates of plastics typified by polyethylene terephthalate (PET), polyethylene naphthalate (PEN), and polyether sulfone (PES) and an acrylic substrate. Examples of the attachment film are attachment films formed using polypropylene, polyester, polyvinyl fluoride, polyvinyl chloride, and the like. Examples of the base film are base films formed using polyester, polyamide, polyimide, aramid, epoxy, an inorganic vapor deposition film, and paper.

Alternatively, a semiconductor element may be formed using one substrate, and then, transferred to another substrate. Examples of a substrate to which a semiconductor element is transferred include, in addition to the above-described substrates, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), a leather substrate, and a rubber substrate. When such a substrate is used, a transistor with excellent properties or a transistor with low power consumption can be formed, a device with high durability, high heat resistance can be provided, or reduction in weight or thickness can be achieved.

In the example illustrated in FIG. 18, a single crystal silicon wafer is used as the substrate 270.

Semiconductor elements such as the transistors and the capacitor are provided in a layer 260. In FIG. 18, the transistors M1 and M2 are typically illustrated. Wiring layers $W_1$ to $W_4$ are stacked over the layer 260. A layer 261 is stacked over the wiring layer $W_4$.

The transistors M1 and M2 each include a channel formation region 272 formed in a well 271, low concentration impurity regions 273 and high concentration impurity regions 274 (also collectively referred to as an impurity region simply) provided so as to sandwich the channel formation region 272, conductive regions 275 provided in contact with the impurity regions, a gate insulating film 276 provided over the channel formation region 272, and a gate electrode 277 provided over the gate insulating film 276. Sidewall insulating films 278 and 279 are provided on side surfaces of the gate electrode 277. Note that the conductive regions 275 can be formed using metal silicide or the like.

The layer 261 is a layer in which an OS transistor, that is, the transistor M0 is formed. The transistor described in Embodiment 1 can be used as the transistor M0. As a second gate (back gate) of the transistor M0, a conductive layer 280 is formed in the wiring layer $W_4$.

Wiring layers $W_5$, $W_6$, and $W_7$ are stacked over the layer 261, and a layer 262 is stacked over the wiring layer $W_7$, and wiring layers $W_8$ and $W_9$ are stacked over the layer 262. The capacitor C0 is formed in the layer 262. The capacitor C0 includes conductive layers 281 and 282. Providing the capacitor C0 in a layer over the layer 261 facilitates increase of the capacitance of the capacitor C0. Alternatively, depending on the capacitance of the capacitor C0, the capacitor C0 can be provided in the layer 261. In that case, two electrodes are formed using a conductive layer which is at the same level as the source electrode and the drain electrode of the transistor M0 and a conductive layer which is at the same level as the gate electrode of the transistor M0. Providing the capacitor C0 in the layer 261 can reduce the number of steps, leading to reduction in manufacturing cost.

Insulating films 291 to 293 preferably include at least one layer that is formed using an insulator having a blocking effect against hydrogen, water, and the like. Water, hydrogen, and the like are factors that generate carriers in an oxide semiconductor; thus, providing such a blocking layer against hydrogen, water, and the like can improve reliability of the transistor M0. Examples of the insulator having a blocking effect against hydrogen, water, and the like include aluminum oxide, aluminum oxynitride, gallium oxide, gallium oxynitride, yttrium oxide, yttrium oxynitride, hafnium oxide, hafnium oxynitride, and yttria-stabilized zirconia (YSZ).

In FIG. 18, regions without reference numerals and hatch patterns represent regions formed of an insulator. As the insulator, an insulator containing at least one of aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, and the like can be used. Alternatively, an organic resin such as a polyimide resin, a polyamide resin, an acrylic resin, a siloxane resin, an epoxy resin, or a phenol resin can be used in the region.

<<DRAM>>

Figure 19A:
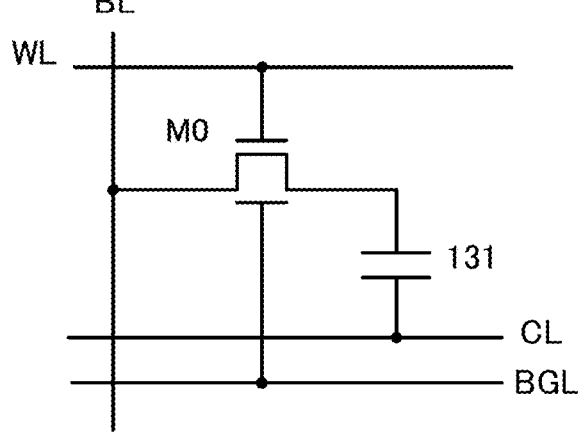
FIGS. 19A and 19B are circuit diagrams illustrating a structural example of a DRAM.

FIG. 19A illustrates the circuit structure of a memory cell 130 functioning as a storage element.

The memory cell 130 in FIG. 19A includes the transistor M0 including the first and second gates, a capacitor 131, the wiring BL, the wiring WL, a wiring CL, and the wiring BGL.

In the memory cell 130 in FIG. 19A, the first gate of the transistor M0 is electrically connected to the wiring WL; the second gate of the transistor M0 is electrically connected to the wiring BGL; one of the source and the drain of the transistor M0 is electrically connected to the wiring BL; and the other of the source and the drain of the transistor M0 is electrically connected to a first electrode of the capacitor 131. A second electrode of the capacitor 131 is electrically connected to the wiring CL.

The transistor M0 is an n-channel OS transistor. It is preferable to use an OS transistor as the transistor M0, in which case the transistor M0 has low off-state current. The transistor described in Embodiment 1 may be used as the transistor M0.

The wiring WL has a function of supplying signals for controlling the on/off state of the transistor M0, and the wiring BL has a function of giving charge to the capacitor 131 through the transistor M0. By turning off the transistor M0 after charge is given to the capacitor 131, the charge given to the capacitor 131 can be held.

Since the charge given to the capacitor 131 leaks to the outside through the transistor M0, operation of rewriting (refreshing) the charge given to the capacitor 131 at regular intervals is needed. However, the refresh frequency is low because the off-state current of the transistor M0 is extremely low and the amount of charge that leaks from the capacitor 131 is small. In addition, the capacitance of the capacitor 131 need not be large, and thus, the area occupied by the capacitor 131 can be reduced.

Figure 19B:
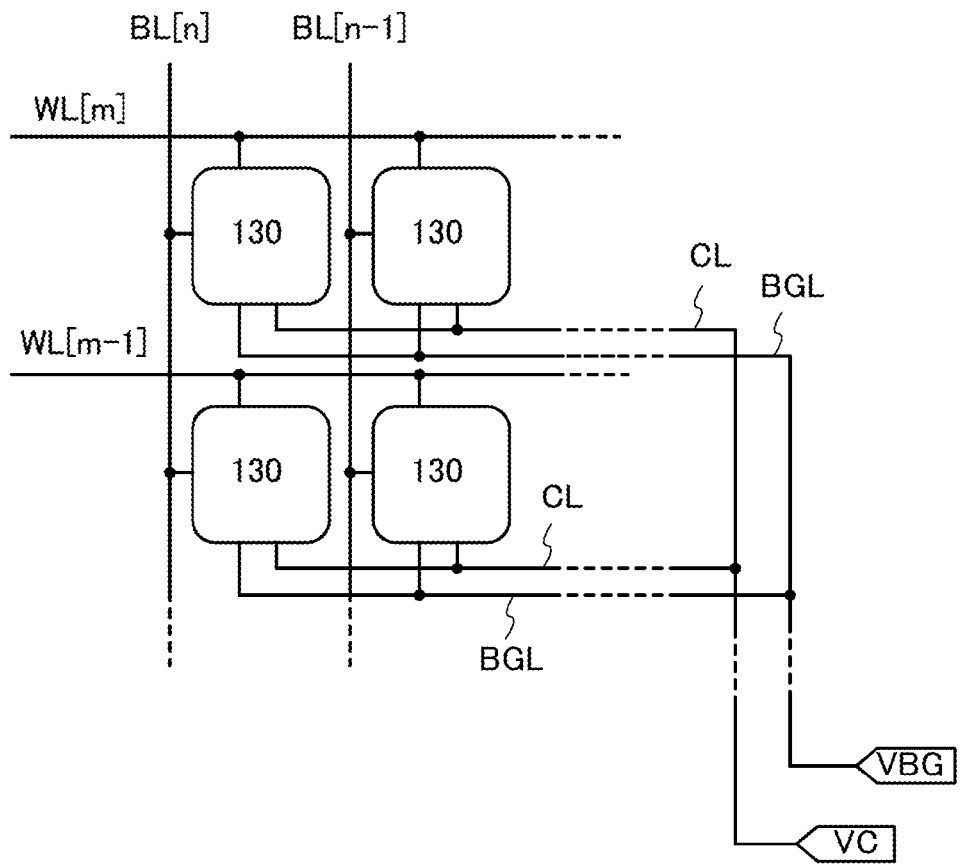

FIG. 19B illustrates the circuit structure of a storage device 140 including the memory cells 130 arranged in a matrix. The storage device 140 functions as a DRAM.

The storage device 140 includes the memory cells 130 arranged in a matrix of m rows and n columns. Here, m and n are each a natural number of 2 or more. The memory cells 130 provided in the m-th row are electrically connected to the wiring WL[m], and the memory cells 130 provided in the n-th column are electrically connected to the wiring BL[n]. The wiring CL is electrically connected to a terminal VC for applying a constant low potential.

When the storage device 140 has such a structure, it is possible to provide a storage device capable of operating at low power with infrequent refresh operation.

<<Register>>

Figure 20:
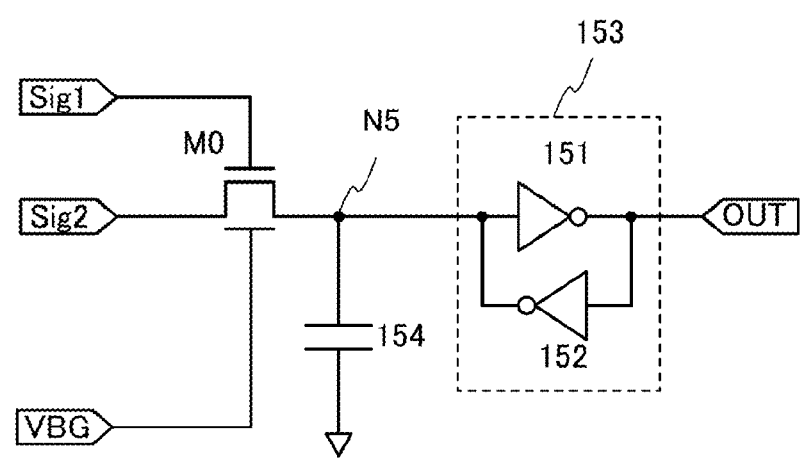
FIG. 20 is a circuit diagram illustrating a structural example of a register.

FIG. 20 illustrates a structure example of a 1-bit register circuit 150.

The register circuit 150 includes the transistor M0 including the first and second gates, a capacitor 154, a node N5, and a flip-flop circuit 153.

The flip-flop circuit 153 includes inverters 151 and 152. The inverter 151 whose direction is opposite to the direction of the inverter 152 is connected in parallel with the inverter 152, and a node to which an output side of the inverter 151 is connected corresponds to an output terminal OUT of the register circuit 150.

The second gate of the transistor M0 is electrically connected to an input terminal VBG; the first gate of the transistor M0 is electrically connected to an input terminal Sig1; one of the source and the drain of the transistor M0 is electrically connected to an input terminal Sig2; and the other of the source and the drain of the transistor M0 is electrically connected to the node N5. The transistor M0 is controlled by input signals from the input terminals Sig1 and Sig2.

A first electrode of the capacitor 154 is electrically connected to the node N5, and a constant low potential is applied to a second electrode of the capacitor 154. The ground potential may be applied as the low potential. The node N5 is electrically connected to the flip-flop circuit 153.

The transistor M0 is an n-channel OS transistor. It is preferable to use an OS transistor as the transistor M0, in which case the transistor M0 has low off-state current. The transistor described in Embodiment 1 may be used as the transistor M0.

The register circuit 150 stores and outputs data with input signals from the input terminals Sig1 and Sig2. For example, when high-level voltages are input from the input terminals Sig1 and Sig2, the transistor M0 is turned on, so that high-level voltage is input to the node N5. Accordingly, low-level voltage obtained by inversion in the inverter 151 is output from the output terminal OUT of the register circuit 150, and at the same time, data of the low-level voltage is stored in the flip-flop circuit 153. In contrast, when low-level voltage is input from the input terminal Sig2, high-level voltage is output from the output terminal OUT similarly, and data of the high-level voltage is stored in the flip-flop circuit 153.

The capacitor 154 has a function of holding the voltage of the node N5.

The register circuit 150 can hold the potential of the node N5 even if supply of power supply voltage is stopped by turning off the transistor M0 after a potential is applied from the input terminal Sig2 to the node N5. This is because the off-state current of the transistor M0 is extremely low. In other words, by using the register circuit 150, it is possible to provide a storage device that can retain data even after supply of power supply voltage is stopped.

Note that in this embodiment, a simple structure of two inverter circuits is described as an example of the flip-flop circuit 153; however, one embodiment of the present invention is not limited to this structure. A clocked inverter capable of performing clock operation or a structure in which a NAND circuit and an inverter are combined can be used as appropriate. For example, a known flip-flop circuit such as an RS flip-flop circuit, a JK flip-flop circuit, a D flip-flop circuit, or a T flip-flop circuit can be used as appropriate.

<<Display Device>>

Figure 21A:
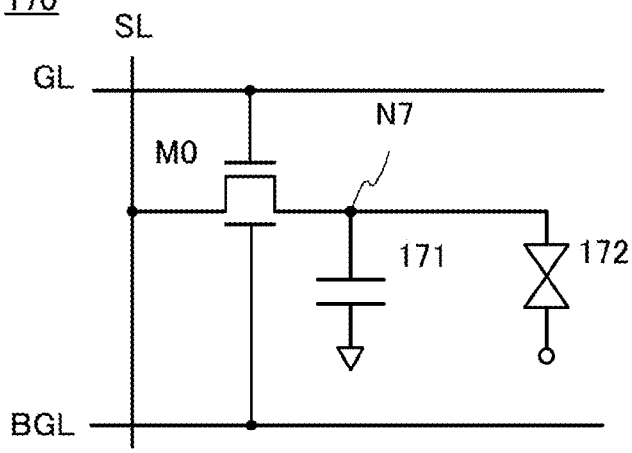
FIGS. 21A and 21B are circuit diagrams illustrating a structural example of a display device.
Figure 21B:
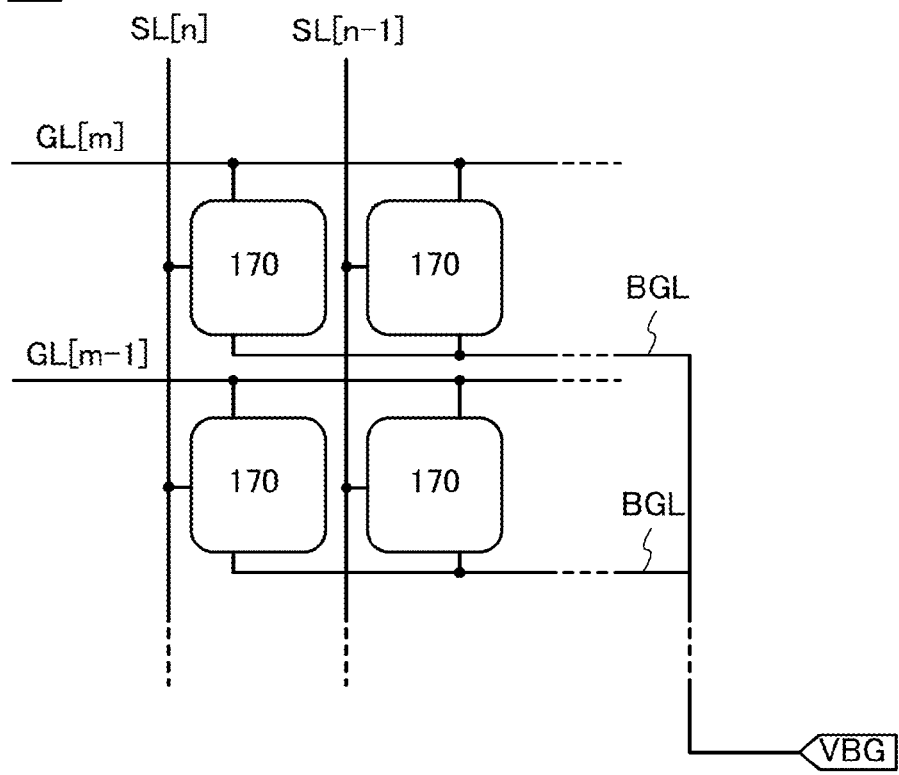

FIGS. 21A and 21B each illustrate an example of a display device.

FIG. 21A illustrate a structure example of a pixel 170 that can be used in a display device. The pixel 170 includes the transistor M0 including the first and second gates, a capacitor 171, a display element 172, a node N7, a wiring GL, the wiring SL, and the wiring BGL.

The first gate of the transistor M0 is electrically connected to the wiring GL; the second gate of the transistor M0 is electrically connected to the wiring BGL; one of the source and the drain of the transistor M0 is electrically connected to the wiring SL; and the other of the source and the drain of the transistor M0 is electrically connected to the node N7.

A first electrode of the capacitor 171 is electrically connected to the node N7, and a constant low potential is applied to a second electrode of the capacitor 171.

The capacitor 171 may be provided as needed. In the case where parasitic capacitance of an electrode, a wiring, or the like can be used as capacitance needed to drive the pixel 170, the capacitor 171 may be omitted.

The transistor M0 is an n-channel OS transistor. It is preferable to use an OS transistor as the transistor M0, in which case the transistor M0 has low off-state current. The transistor described in Embodiment 1 may be used as the transistor M0.

A first electrode of the display element 172 is electrically connected to the node N7, and a constant low potential is applied to a second electrode of the display element 172. The ground potential may be applied as the low potential. A dielectric element whose optical characteristics are changed when voltage is applied to its electrodes at opposite ends can be used as the display element 172. For example, a liquid crystal element or an element used for electronic paper or the like, such as an electrophoretic element or a twisting ball element, can be used.

The wiring GL has a function of supplying signals for controlling the on/off state of the transistor M0, and the wiring SL has a function of supplying voltage applied to the display element 172 through the transistor M0.

Since the off-state current of the transistor M0 is extremely low, when the transistor M0 is turned off, the node N7 can hold voltage applied immediately before turning off the transistor M0. While the voltage of the node N7 is held, the display element 172 can maintain its display state.

The pixel 170 can hold the voltage of the node N7 for a long time. Thus, the optical characteristics of the display element 172 can be unchanged even when supply of power supply voltage is stopped. For example, even in the case where a liquid crystal element that cannot store data, such as a twisted nematic (TN) liquid crystal, is used, the element can be always maintained in a state in which voltage is applied. Consequently, it is possible to exclude rewrite operation or it is possible to reduce the frequency of rewrite operation markedly.

FIG. 21B illustrates the circuit structure of a display device 180 including the pixels 170 arranged in a matrix.

The display device 180 includes the pixels 170 arranged in a matrix of m rows and n columns. Here, m and n are each a natural number of 2 or more. The pixels 170 provided in the m-th row are electrically connected to a wiring GL[m], and the pixels 170 provided in the n-th column are electrically connected to a wiring SL[n].

When the display device 180 has such a structure, it is possible to provide a display device capable of operating at low power with infrequent rewrite operation. In addition, it is possible to obtain a display device including a plurality of pixels that can easily perform refresh operation. Furthermore, it is possible to obtain a display device capable of holding a display image even when supply of power is stopped.

In this specification and the like, an explicit description "X and Y are connected" means that X and Y are electrically connected and X and Y are directly connected. Accordingly, without limitation to a predetermined connection relation, for example, a connection relation shown in drawings or text, another connection relation is included in the drawings or the text.

Here, X and Y each denote an object (e.g., a device, an element, a circuit, a line, an electrode, a terminal, a conductive film, a layer, or the like).

Examples of the case where X and Y are directly connected include the case where an element that enables electrical connection between X and Y (e.g., a switch, a transistor, a capacitor, an inductor, a resistor, a diode, a display element, a light-emitting element, or a load) is not connected between X and Y, and the case where X and Y are connected without the element that enables electrical connection between X and Y provided therebetween.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and E Note that the switch is controlled to be turned on or off. That is, the switch is conducting or not conducting (is turned on or off) to determine whether current flows therethrough or not. Alternatively, the switch has a function of selecting and changing a current path. Note that the case where X and Y are electrically connected includes the case where X and Y are directly connected.

(Embodiment 3)

In this embodiment, a CPU in which the transistor described in Embodiment 1 can be used will be described.

Figure 22:
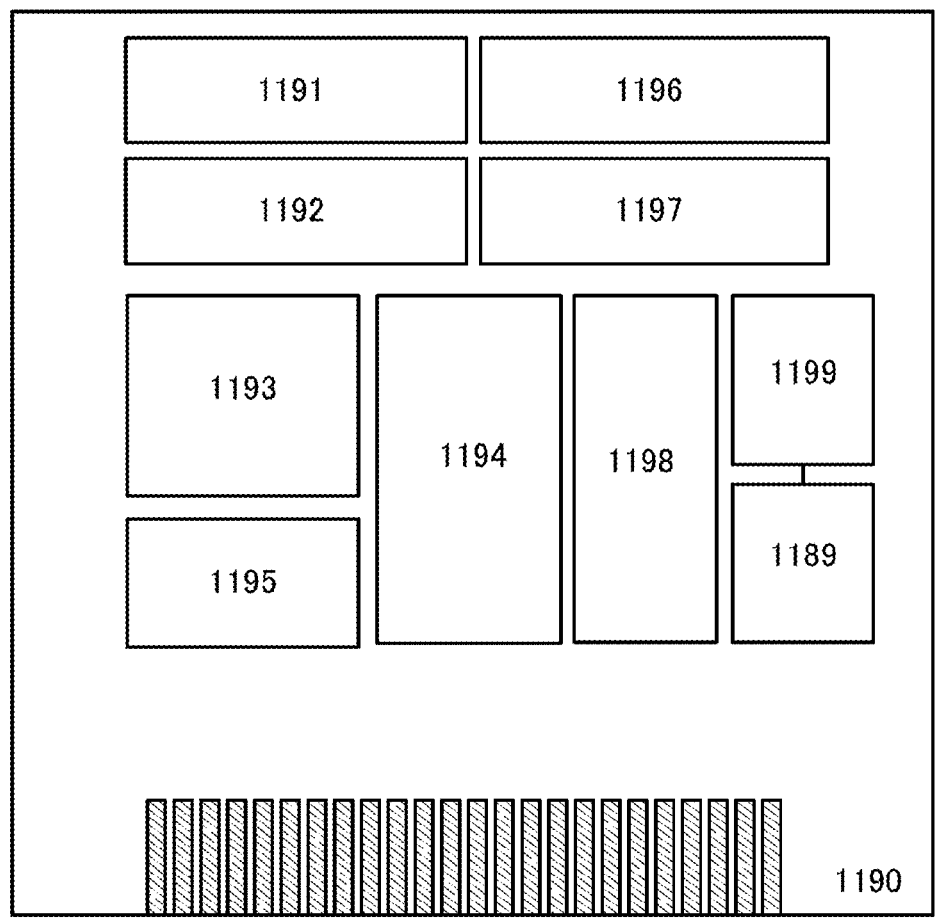
FIG. 22 is a block diagram illustrating a structural example of a CPU.

FIG. 22 is a block diagram illustrating a configuration example of a CPU.

The CPU illustrated in FIG. 22 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198 (BUS I/F), a rewritable ROM 1199, and a ROM interface (ROM I/F) 1189. A semiconductor substrate, an SOI substrate, a glass substrate, or the like is used as the substrate 1190. The ROM 1199 and the ROM interface 1189 may be provided over a separate chip. Needless to say, the CPU in FIG. 22 is just an example in which the configuration is simplified, and an actual CPU may have a variety of configurations depending on the application. For example, the CPU may have the following configuration: a structure including the CPU illustrated in FIG. 22 or an arithmetic circuit is considered as one core; a plurality of the cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal based on a reference clock signal, and supplies the internal clock signal to the above circuits.

In the CPU illustrated in FIG. 22, a memory cell is provided in the register 1196. For the memory cell of the register 1196, the transistor described in Embodiment 1 can be used.

In the CPU illustrated in FIG. 22, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retaining by the flip-flop is selected, a power supply voltage is supplied to the memory cell in the register 1196. When data retaining by the capacitor is selected, the data is rewritten in the capacitor, and supply of the power supply voltage to the memory cell in the register 1196 can be stopped.

(Embodiment 4)

The transistor of one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic devices that can be equipped with the transistor of one embodiment of the present invention are cellular phones, game machines including portable game machines, portable data terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 23A to 23F illustrate specific examples of these electronic devices.

Figure 23A:
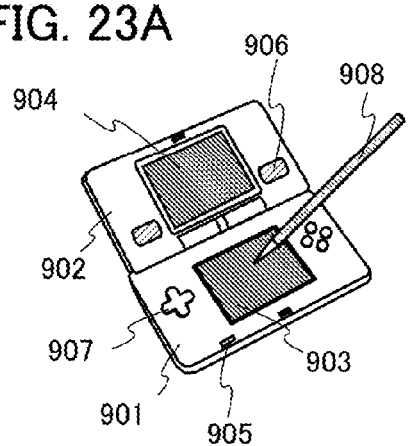
FIGS. 23A to 23F are perspective views illustrating examples of an electronic device.

FIG. 23A illustrates a portable game machine, which includes a housing 901, a housing 902, a display portion 903, a display portion 904, a microphone 905, a speaker 906, an operation key 907, a stylus 908, and the like. Although the portable game machine in FIG. 23A has the two display portions 903 and 904, the number of display portions included in a portable game machine is not limited to this.

Figure 23B:
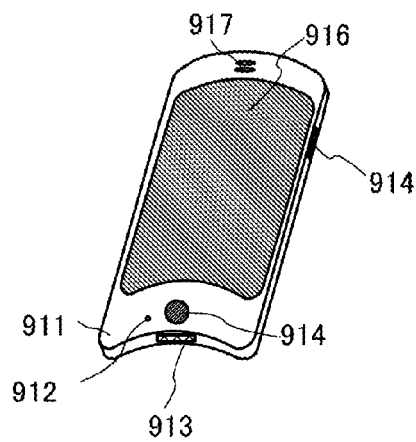

FIG. 23B illustrates a cellular phone, which is provided with a housing 911, a display portion 916, operation buttons 914, an external connection port 913, a speaker 917, a microphone 912, and the like. When the display portion 916 of the cellular phone illustrated in FIG. 23B is touched with a finger or the like, data can be input. Further, operations such as making a call and inputting a character can be performed by touch on the display portion 916 with a finger or the like. The power can be turned on or off with the operation button 914. In addition, types of images displayed on the display portion 916 can be switched; for example, switching images from a mail creation screen to a main menu screen is performed with the operation button 914.

Figure 23C:
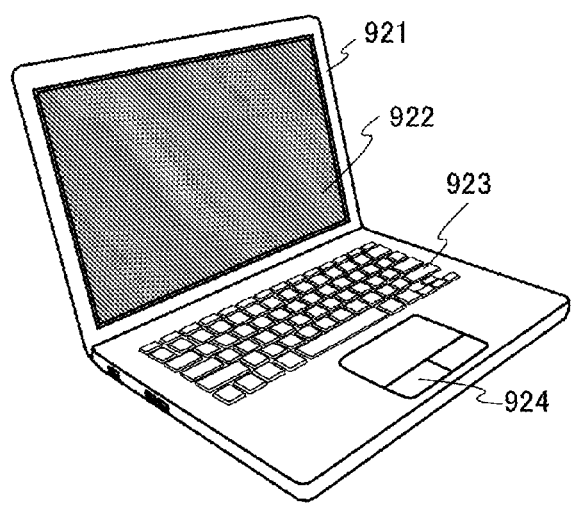

FIG. 23C illustrates a notebook personal computer, which includes a housing 921, a display portion 922, a keyboard 923, a pointing device 924, and the like.

Figure 23D:
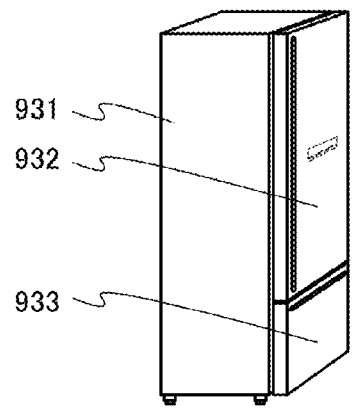

FIG. 23D illustrates an electric refrigerator-freezer, which includes a housing 931, a refrigerator door 932, a freezer door 933, and the like.

Figure 23E:
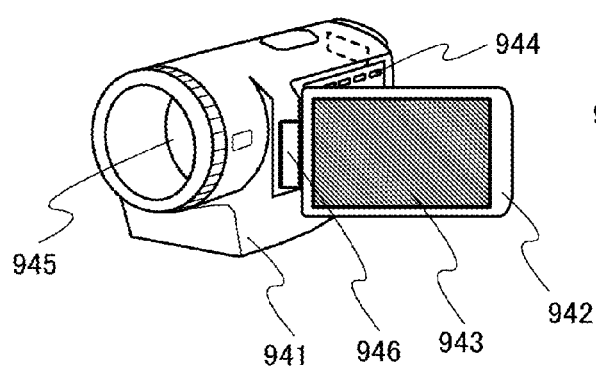

FIG. 23E illustrates a video camera, which includes a first housing 941, a second housing 942, a display portion 943, operation keys 944, a lens 945, a joint 946, and the like. The operation keys 944 and the lens 945 are provided in the first housing 941, and the display portion 943 is provided in the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

Figure 23F:
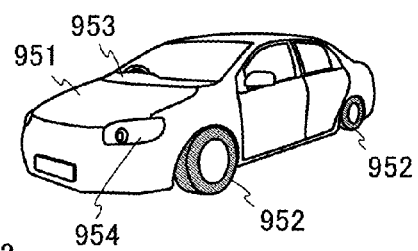
Figure 24A:
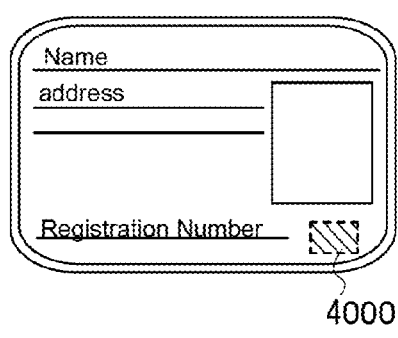
FIGS. 24A to 24F are perspective views illustrating usage examples of an RF tag.
Figure 24B:
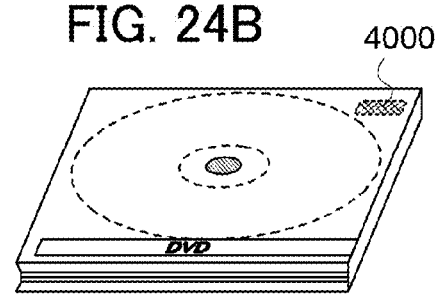
Figure 24C:
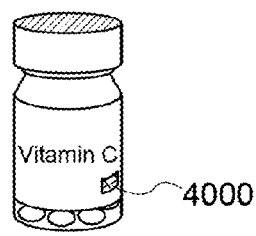
Figure 24D:
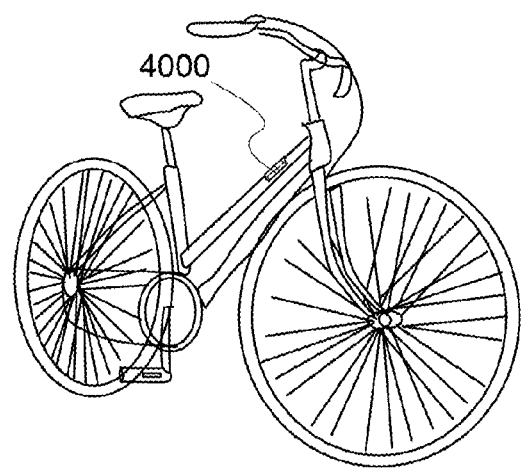
Figure 24E:
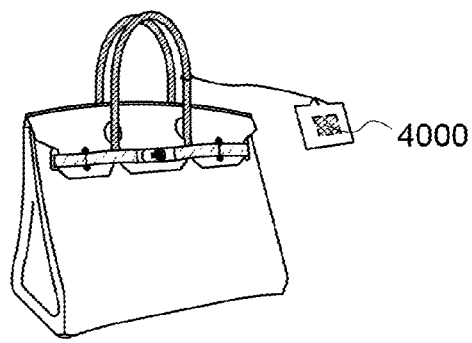
Figure 24F:
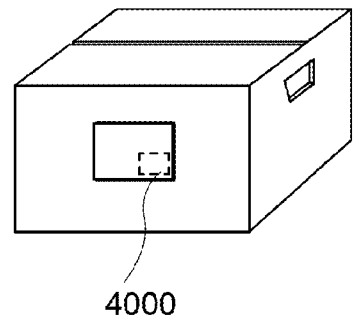

FIG. 23F illustrates a car, which includes a car body 951, wheels 952, a dashboard 953, lights 954, and the like.

(Embodiment 5)

In this embodiment, application examples of an RF tag that can be formed using the transistor of one embodiment of the present invention will be described with reference to FIGS. 24A to 24F. The RF tag is widely used and can be provided for, for example, products such as bills, coins, securities, bearer bonds, documents (e.g., driver's licenses or resident's cards, see FIG. 24A), recording media (e.g., DVDs or video tapes, see FIG. 24B), packaging containers (e.g., wrapping paper or bottles, see FIG. 24C), vehicles (e.g., bicycles, see FIG. 24D), personal belongings (e.g., bags or glasses), foods, plants, animals, human bodies, clothing, household goods, medical supplies such as medicine and chemicals, and electronic devices (e.g., liquid crystal display devices, EL display devices, television sets, or cellular phones), or tags on products (see FIGS. 24E and 24F).

An RF tag 4000 of one embodiment of the present invention is fixed to a product by being attached to a surface thereof or embedded therein. For example, the RF tag 4000 is fixed to each product by being embedded in paper of a book, or embedded in an organic resin of a package. Since the RF tag 4000 of one embodiment of the present invention can be reduced in size, thickness, and weight, it can be fixed to a product without spoiling the design of the product. Furthermore, bills, coins, securities, bearer bonds, documents, or the like can have an identification function by being provided with the RF tag 4000 of one embodiment of the present invention, and the identification function can be utilized to prevent counterfeiting. Moreover, the efficiency of a system such as an inspection system can be improved by providing the RF tag of one embodiment of the present invention for packaging containers, recording media, personal belongings, foods, clothing, household goods, electronic devices, or the like. Vehicles can also have higher security against theft or the like by being provided with the RF tag of one embodiment of the present invention.

As described above, by using the RF tag of one embodiment of the present invention for each application described in this embodiment, power for operation such as writing or reading of data can be reduced, which results in an increase in the maximum communication distance. Moreover, data can be held for an extremely long period even in the state where power is not supplied; thus, the RF tag can be preferably used for application in which data is not frequently written or read.

(Embodiment 6)

In this embodiment, the crystal structure and a formation method of an oxide semiconductor applicable to an OS transistor will be described.

Note that in this specification, the term "parallel" indicates that the angle formed between two straight lines is greater than or equal to $-10°$ and less than or equal to $10°$, and accordingly also includes the case where the angle is greater than or equal to $-5°$ and less than or equal to $5°$. In addition, the term "substantially parallel" indicates that the angle formed between two straight lines is greater than or equal to $-30°$ and less than or equal to $30°$. The term "perpendicular" indicates that the angle formed between two straight lines is greater than or equal to $80°$ and less than or equal to $100°$, and accordingly also includes the case where the angle is greater than or equal to $85°$ and less than or equal to $95°$. In addition, the term "substantially perpendicular" indicates that the angle formed between two straight lines is greater than or equal to $60°$ and less than or equal to $120°$.

In this specification, trigonal and rhombohedral crystal systems are included in a hexagonal crystal system.

<<Structure of Oxide Semiconductor>>

The structure of an oxide semiconductor will be described below.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

It is known that an amorphous structure is generally defined as being metastable and unfixed, and being isotropic and having no non-uniform structure. In other words, an amorphous structure has a flexible bond angle and a short-range order but does not have a long-range order.

This means that an inherently stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. Note that an a-like OS has a periodic structure in a microscopic region, but at the same time has a void and has an unstable structure. For this reason, an a-like OS has physical properties similar to those of an amorphous oxide semiconductor.

<CAAC-OS>

First, a CAAC-OS will be described.

The CAAC-OS is one of oxide semiconductors having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Figure 31A:
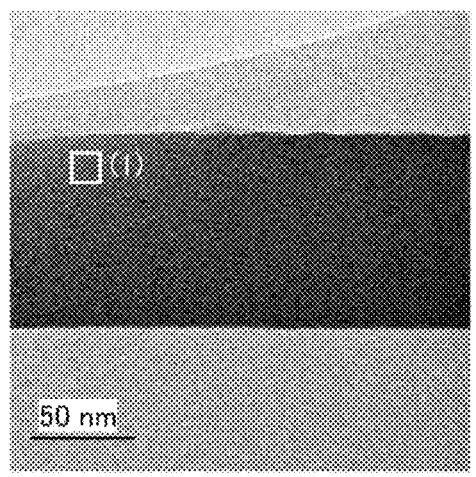
FIGS. 31A to 31D are Cs-corrected high-resolution TEM images of a cross section of a CAAC-OS and a cross-sectional schematic view of the CAAC-OS.

A CAAC-OS observed with TEM will be described below. FIG. 31A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 31B:
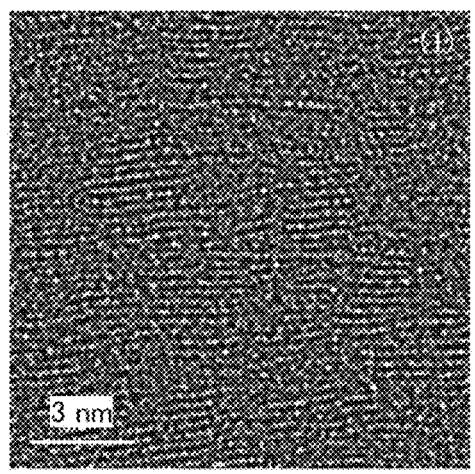

FIG. 31B is an enlarged Cs-corrected high-resolution TEM image of a region (1) in FIG. 31A. FIG. 31B shows that metal atoms are arranged in a layered manner in a pellet. Each metal atom layer has a configuration reflecting unevenness of a surface over which the CAAC-OS is formed (hereinafter, the surface is referred to as a formation surface) or a top surface of the CAAC-OS, and is arranged parallel to the formation surface or the top surface of the CAAC-OS.

Figure 31C:
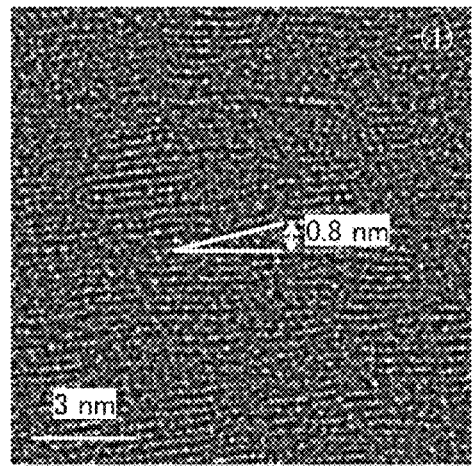

As shown in FIG. 31B, the CAAC-OS has a characteristic atomic arrangement. The characteristic atomic arrangement is denoted by an auxiliary line in FIG. 31C. FIGS. 31B and 31C prove that the size of a pellet is approximately 1 nm to 3 nm, and the size of a space caused by tilt of the pellets is approximately 0.8 nm. Therefore, the pellet can also be referred to as a nanocrystal (nc). Furthermore, the CAAC-OS can also be referred to as an oxide semiconductor including c-axis aligned nanocrystals (CANC).

Figure 31D:
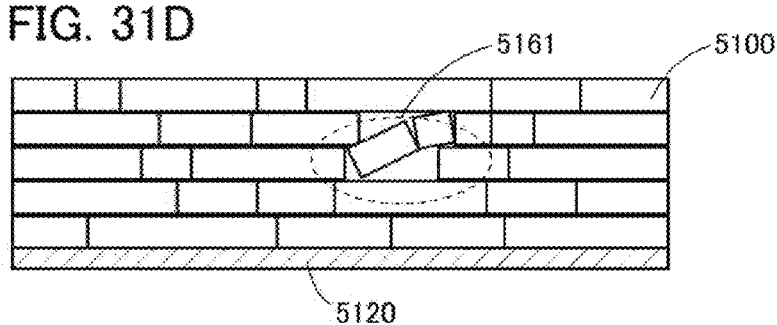

Here, according to the Cs-corrected high-resolution TEM images, the schematic arrangement of pellets 5100 of a CAAC-OS over a substrate 5120 is illustrated by such a structure in which bricks or blocks are stacked (see FIG. 31D). The part in which the pellets are tilted as observed in FIG. 31C corresponds to a region 5161 shown in FIG. 31D.

FIG. 32A shows a Cs-corrected high-resolution TEM image of a plane of the CAAC-OS observed from a direction substantially perpendicular to the sample surface. FIGS. 32B, 32C, and 32D are enlarged Cs-corrected high-resolution TEM images of regions (1), (2), and (3) in FIG. 32A, respectively. FIGS. 32B, 32C, and 32D indicate that metal atoms are arranged in a triangular, quadrangular, or hexagonal configuration in a pellet. However, there is no regularity of arrangement of metal atoms between different pellets.

Figure 33A:
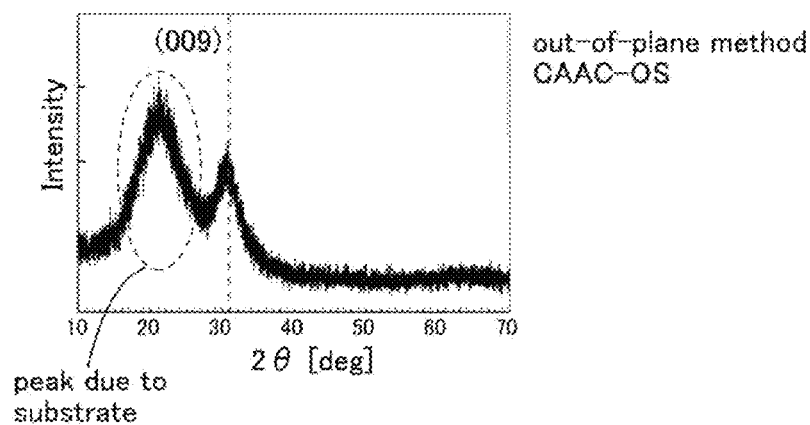
FIGS. 33A to 33C show structural analysis of a CAAC-OS and a single crystal oxide semiconductor by XRD.

Next, a CAAC-OS analyzed by X-ray diffraction (XRD) will be described. For example, when the structure of a CAAC-OS including an $InGaZnO_4$ crystal is analyzed by an out-of-plane method, a peak appears at a diffraction angle ($2\theta$) of around 31° as shown in FIG. 33A. This peak is attributed to the (009) plane of the $InGaZnO_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS by an out-of-plane method, another peak may appear when $2\theta$ is around 36°, in addition to the peak at $2\theta$ of around 31°. The peak at $2\theta$ of around 36° indicates that a crystal having no c-axis alignment is included in part of the CAAC-OS. It is preferable that in the CAAC-OS analyzed by an out-of-plane method, a peak appear when $2\theta$ is around 31° and that a peak not appear when $2\theta$ is around 36°.

Figure 33B:
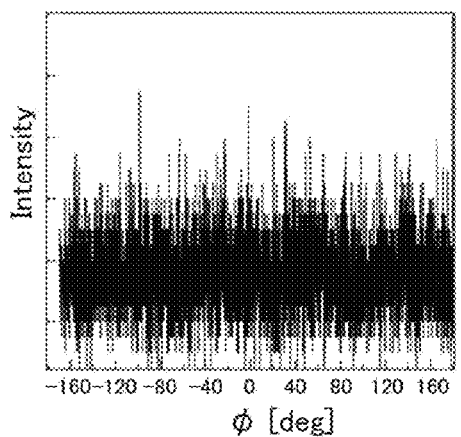
Figure 33C:
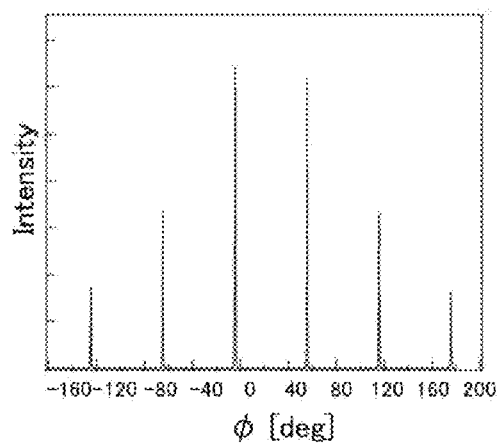

On the other hand, in structural analysis of the CAAC-OS by an in-plane method in which an X-ray beam is incident on a sample in a direction substantially perpendicular to the c-axis, a peak appears when $2\theta$ is around 56°. This peak is attributed to the (110) plane of the $InGaZnO_4$ crystal. In the case of the CAAC-OS, when analysis ($\phi$ scan) is performed with $2\theta$ fixed at around 56° and with the sample rotated using a normal vector of the sample surface as an axis ($\phi$ axis), as shown in FIG. 33B, a peak is not clearly observed. In contrast, in the case of a single crystal oxide semiconductor of $InGaZnO_4$, when $\phi$ scan is performed with $2\theta$ fixed at around 56°, as shown in FIG. 33C, six peaks which are attributed to crystal planes equivalent to the (110) plane are observed. Accordingly, the structural analysis using XRD shows that the directions of a-axes and b-axes are irregularly oriented in the CAAC-OS.

Next, a CAAC-OS analyzed by electron diffraction will be described. For example, when an electron beam with a probe diameter of 300 nm is incident on a CAAC-OS including an $InGaZnO_4$ crystal in a direction parallel to the sample surface, a diffraction pattern (also referred to as a selected-area transmission electron diffraction pattern) shown in FIG. 34A can be obtained. In this diffraction pattern, spots attributed to the (009) plane of an $InGaZnO_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 34B shows a diffraction pattern obtained in such a manner that an electron beam with a probe diameter of 300 nm is incident on the same sample in a direction perpendicular to the sample surface. As shown in FIG. 34B, a ring-like diffraction pattern is observed. Thus, the electron diffraction also indicates that the a-axes and b-axes of the pellets included in the CAAC-OS do not have regular alignment. The first ring in FIG. 34B is considered to be attributed to the (010) plane, the (100) plane, and the like of the $InGaZnO_4$ crystal. The second ring in FIG. 34B is considered to be attributed to the (110) plane and the like.

As described above, the CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in the oxide semiconductor might serve as carrier traps or carrier generation sources, for example. Furthermore, an oxygen vacancy in the oxide semiconductor might serve as a carrier trap or serve as a carrier generation source when hydrogen is captured therein.

The CAAC-OS having small amounts of impurities and oxygen vacancies is an oxide semiconductor with low carrier density. Specifically, an oxide semiconductor with a carrier density of lower than $8\times10^{11}/cm^3$, preferably lower than $1\times10^{11}/cm^3$, further preferably lower than $1\times10^{10}/cm^3$, and is higher than or equal to $1\times10^{-9}/cm^3$ can be used. Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

Next, an nc-OS will be described.

An nc-OS has a region in which a crystal part is observed and a region in which a crystal part is not clearly observed in a high-resolution TEM image. In most cases, the size of a crystal part included in the nc-OS is greater than or equal to 1 nm and less than or equal to 10 nm, or greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method. For example, when the nc-OS is analyzed by an out-of-plane method using an X-ray beam having a diameter larger than the size of a pellet, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet. Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, bright regions in a circular (ring) pattern are shown in some cases. Also in a nanobeam electron diffraction pattern of the nc-OS, a plurality of spots is shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<a-like OS>

An a-like OS has a structure intermediate between those of the nc-OS and the amorphous oxide semiconductor.

In a high-resolution TEM image of the a-like OS, a void may be observed. Furthermore, in the high-resolution TEM image, there are a region where a crystal part is clearly observed and a region where a crystal part is not observed.

The a-like OS has an unstable structure because it contains a void. To verify that an a-like OS has an unstable structure as compared with a CAAC-OS and an nc-OS, a change in structure caused by electron irradiation is described below.

Three samples of a-like OS, nc-OS, and CAAC-OS are prepared and subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of an InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of InGaZnO$_4$. Each of lattice fringes corresponds to the a-b plane of the InGaZnO$_4$ crystal.

Figure 35:
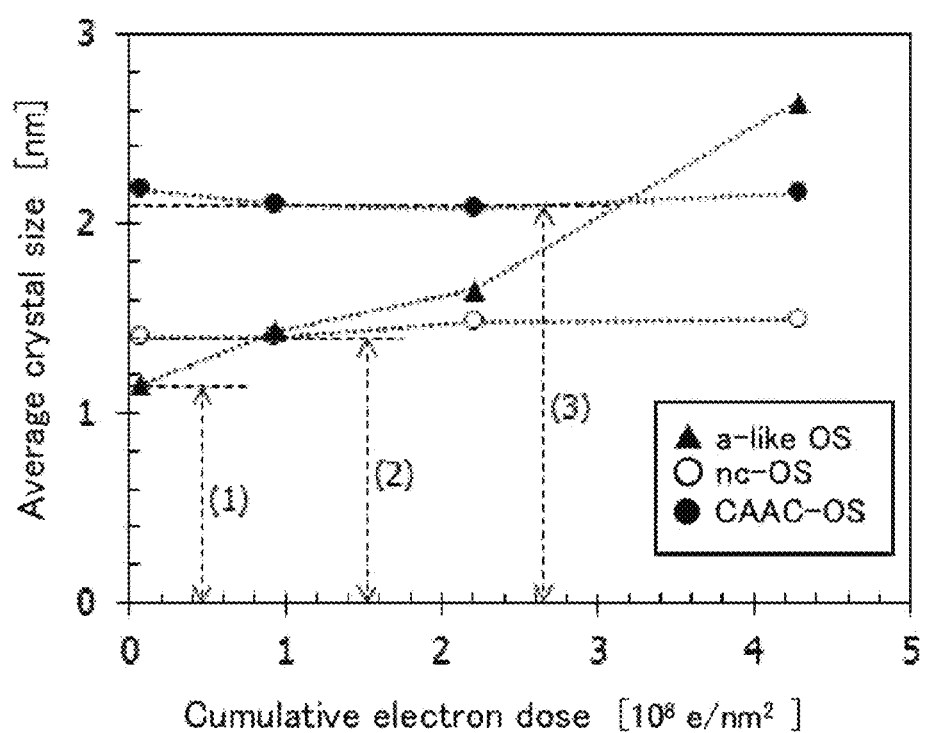
FIG. 35 shows a change in crystal part of an In—Ga—Zn oxide induced by electron irradiation.

FIG. 35 shows change in the average size of crystal parts (at 22 points to 45 points) in each sample. Note that the crystal part size corresponds to the length of a lattice fringe. FIG. 35 indicates that the crystal part size in the a-like OS increases with an increase in the cumulative electron dose. Specifically, as shown by (1) in FIG. 35, a crystal part of approximately 1.2 nm (also referred to as an initial nucleus) at the start of TEM observation grows to a size of approximately 2.6 nm at a cumulative electron dose of $4.2\times10^8$ e$^-$/nm$^2$. In contrast, the crystal part size in the nc-OS and the CAAC-OS shows little change from the start of electron irradiation to a cumulative electron dose of $4.2\times10^8$ e$^-$/nm$^2$. Specifically, as shown by (2) and (3) in FIG. 35, the average crystal sizes in an nc-OS and a CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. It is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that there is a possibility that an oxide semiconductor having a certain composition cannot exist in a single crystal structure. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more of an amorphous oxide semiconductor, an a-like OS, an nc-OS, and a CAAC-OS, for example.

<<Formation Method>>

An example of a method for forming a CAAC-OS film will be described below.

Figure 36A:
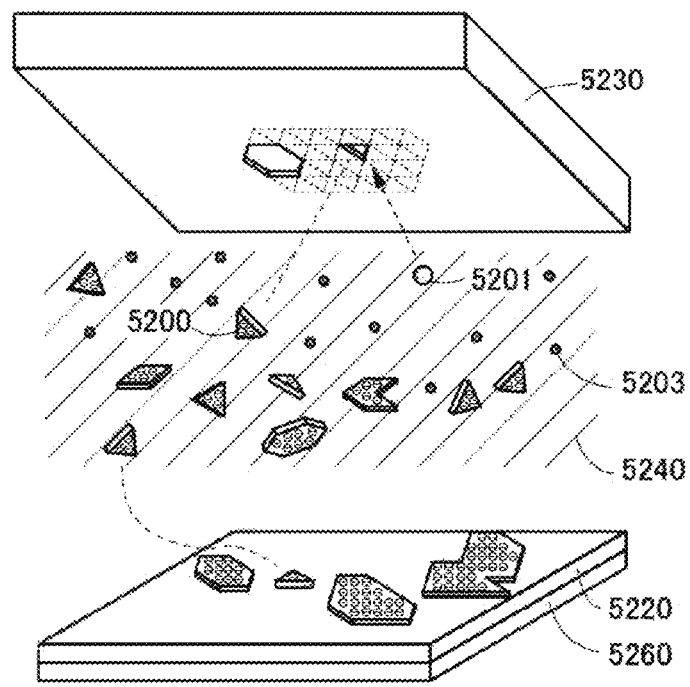
FIGS. 36A to 36D illustrate a deposition method of a CAAC-OS.

FIG. 36A is a schematic view of the inside of a film formation chamber. The CAAC-OS film can be formed by a sputtering method.

As shown in FIG. 36A, a substrate 5220 and a target 5230 are arranged to face each other. Plasma 5240 is generated between the substrate 5220 and the target 5230. A heating mechanism 5260 is under the substrate 5220. The target 5230 is attached to a backing plate (not illustrated in the drawing). A plurality of magnets is arranged to face the target 5230 with the backing plate positioned therebetween. A sputtering method in which the disposition speed is increased by utilizing a magnetic field of the magnets is referred to as a magnetron sputtering method.

The distance d between the substrate 5220 and the target 5230 (also referred to as a target-substrate distance (T-S distance)) is greater than or equal to 0.01 m and less than or equal to 1 m, preferably greater than or equal to 0.02 m and less than or equal to 0.5 m. The film formation chamber is mostly filled with a deposition gas (e.g., an oxygen gas, an argon gas, or a mixed gas containing oxygen at 5 vol % or higher) and the pressure in the film formation chamber is controlled to be higher than or equal to 0.01 Pa and lower than or equal to 100 Pa, preferably higher than or equal to 0.1 Pa and lower than or equal to 10 Pa. Here, discharge starts by application of a voltage at a certain value or higher to the target 5230, and the plasma 5240 is observed. The magnetic field forms a high-density plasma region in the vicinity of the target 5230. In the high-density plasma region, the deposition gas is ionized, so that an ion 5201 is generated. Examples of the ion 5201 include an oxygen cation (O$^+$) and an argon cation (Ar$^+$).

Figure 37:
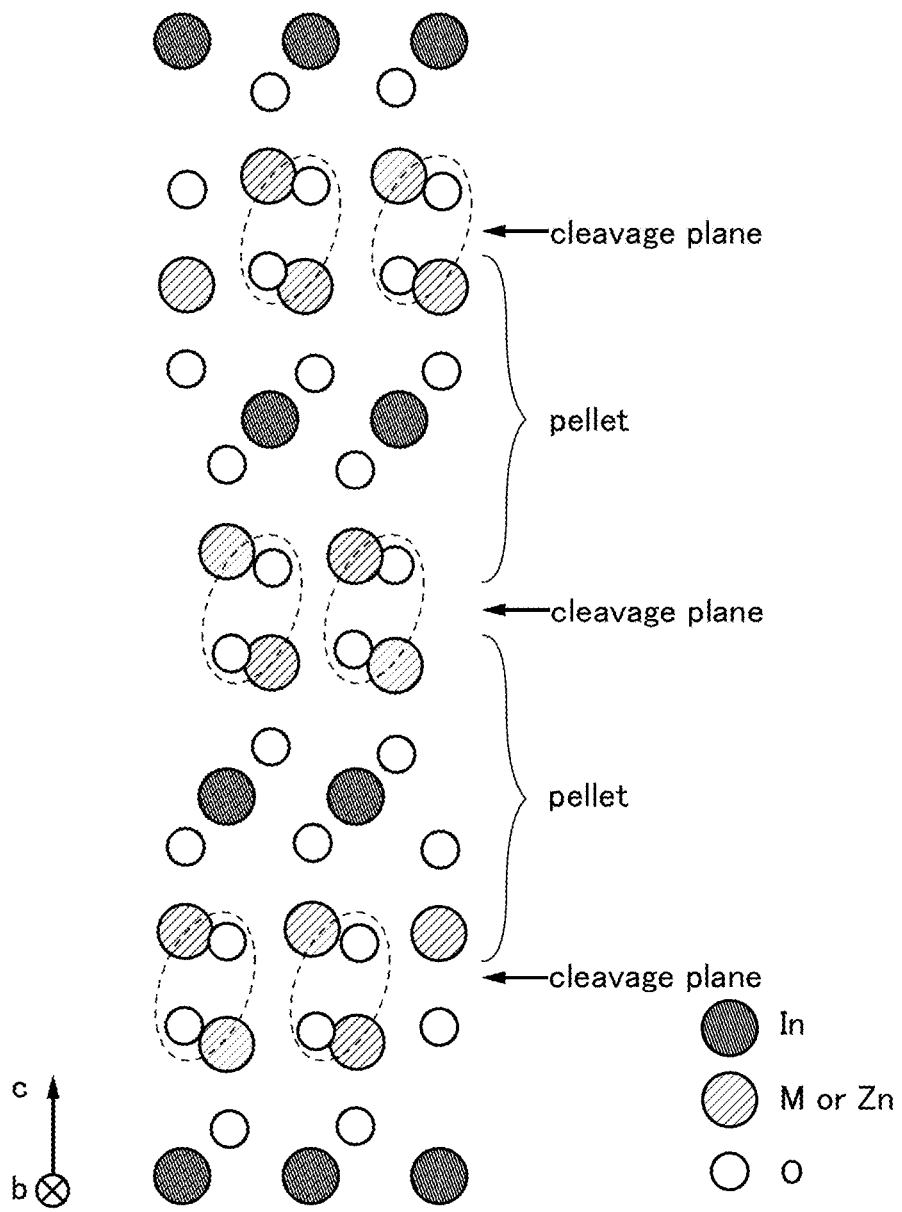
FIG. 37 illustrates a crystal structure of $InMZnO_4$.

Here, the target 5230 has a polycrystalline structure which includes a plurality of crystal grains and in which a cleavage plane exists in any of the crystal grains. As an example, a crystal structure of InMZnO$_4$ (the element M is aluminum, gallium, yttrium, or tin, for example) included in the target 5230 is illustrated in FIG. 37. Note that FIG. 37 illustrates the crystal structure of InMZnO$_4$ observed from a direction parallel to a b-axis. In the crystal of InMZnO$_4$, oxygen atoms are negatively charged, whereby repulsive force is generated between the two adjacent M-Zn—O layers. Thus, the InMZnO$_4$ crystal has a cleavage plane between the two adjacent M-Zn—O layers.

Figure 36B:
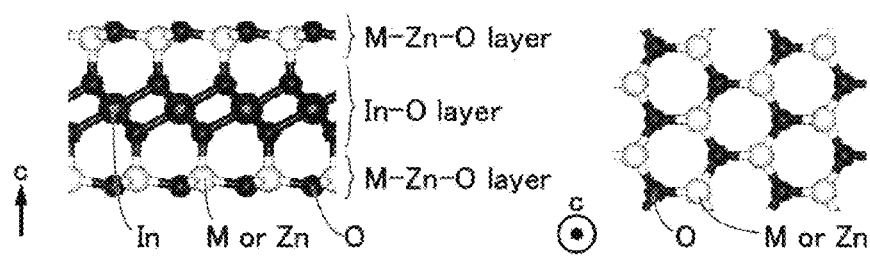
Figure 36C:
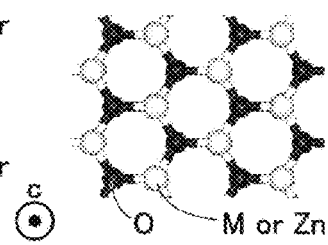

The ion 5201 generated in the high-density plasma region is accelerated toward the target 5230 side by an electric field, and then collides with the target 5230. At this time, a pellet 5200 which is a flat-plate-like or pellet-like sputtered particles is separated from the cleavage plane (FIG. 36A). The pellet 5200 is between the two cleavage planes shown in FIG. 37. Thus, when the pellet 5200 is observed, the cross-section thereof is as shown in FIG. 36B, and the top surface thereof is as shown in FIG. 36C. Note that the structure of the pellet 5200 may be distorted by an impact of collision of the ion 5201. Note that along with the separation of the pellet 5200, a particle 5203 is also sputtered from the target 5230. The particle 5203 has an atom or an aggregate of several atoms. Therefore, the particle 5203 can be referred to as an atomic particle.

The pellet 5200 is a flat-plate-like (pellet-like) sputtered particle having a triangle plane, e.g., regular triangle plane. Alternatively, the pellet 5200 is a flat-plate-like (pellet-like) sputtered particle having a hexagon plane, e.g., regular hexagon plane. However, the shape of a flat plane of the pellet 5200 is not limited to a triangle or a hexagon. For example, the flat plane may have a shape formed by combining two or more triangles. For example, a quadrangle (e.g., rhombus) may be formed by combining two triangles (e.g., regular triangles).

The thickness of the pellet 5200 is determined depending on the kind of the deposition gas and the like. For example, the thickness of the pellet 5200 is greater than or equal to 0.4 nm and less than or equal to 1 nm, preferably greater than or equal to 0.6 nm and less than or equal to 0.8 nm. In addition, for example, the width of the pellet 5200 is greater than or equal to 1 nm and less than or equal to 3 nm, preferably greater than or equal to 1.2 nm and less than or equal to 2.5 nm. For example, the ion 5201 collides with the target 5230 including the In-M-Zn oxide. Then, the pellet 5200 including three layers of an M-Zn—O layer, an In—O layer, and an M-Zn—O layer is separated. Note that the particle 5203 is also sputtered from the target 5230 along with the separation of the pellet 5200.

The pellet 5200 may receive a charge when passing through the plasma 5240, so that surfaces thereof are negatively or positively charged. For example, the pellet 5200 receives a negative charge from O$^{2-}$ in the plasma 5240. As a result, oxygen atoms on the surfaces of the pellet 5200 may be negatively charged. In addition, when passing through the plasma 5240, the pellet 5200 is sometimes combined with indium, the element M, zinc, oxygen, or the like in the plasma 5240 to grow up.

The pellet 5200 and the particle 5203 that have passed through the plasma 5240 reach a surface of the substrate 5220. Note that part of the particles 5203 is discharged to the outside by a vacuum pump or the like because the particle 5203 is small in mass.

Next, deposition of the pellet 5200 and the particle 5203 on the surface of the substrate 5220 is described with reference to FIGS. 38A to 38E.

Figure 38A:
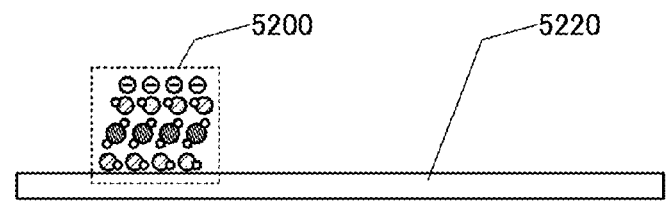
FIGS. 38A to 38E illustrate a deposition method of a CAAC-OS.
Figure 38B:
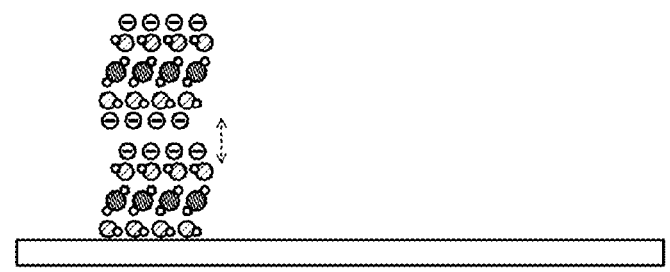

First, a first of the pellets 5200 is deposited over the substrate 5220. Since the pellet 5200 has a flat-plate-like shape, it is deposited so that the flat plane faces to the surface of the substrate 5220 (FIG. 38A). Here, a charge on a surface of the pellet 5200 on the substrate 5220 side is lost through the substrate 5220.

Next, a second of the pellets 5200 reaches the substrate 5220. Here, since another surface of the first of the pellets 5200 and surfaces of the second of the pellets 5200 are charged, they repel each other (FIG. 3 8B).

Figure 38C:
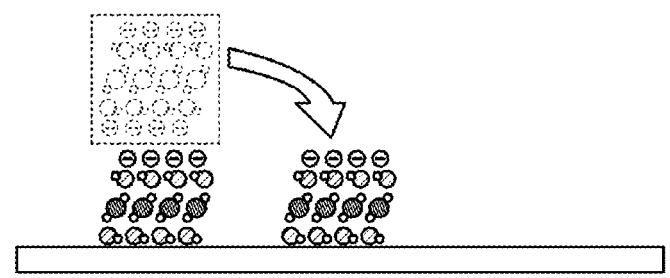

As a result, the second of the pellets 5200 avoids being deposited over the first of the pellets 5200, and is deposited over the surface of the substrate 5220 so as to be a little distance away from the first of the pellets 5200 (FIG. 38C). With repetition of this, millions of the pellets 5200 are deposited over the surface of the substrate 5220 to have a thickness of one layer. A region where any pellet 5200 is not deposited is generated between adjacent pellets 5200.

Figure 38D:
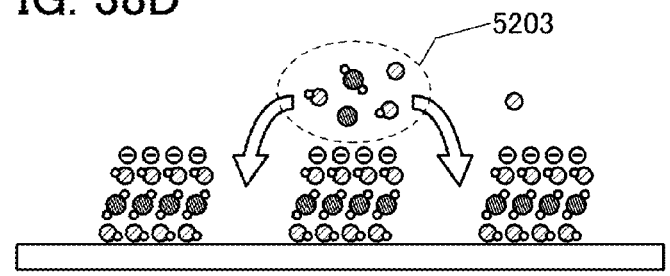

Next, the particle 5203 reaches the surface of the substrate 5220 (FIG. 38D).

The particle 5203 cannot be deposited over an active region such as the surface of the pellet 5200. Therefore, the particle 5203 is deposited so as to fill a region where the pellets 5200 are not deposited. The particles 5203 grow in the horizontal (lateral) direction between the pellets 5200, thereby connecting the pellets 5200. In this way, the particles 5203 are deposited until they fill regions where the pellets 5200 are not deposited. This mechanism is similar to a deposition mechanism of the ALD method.

Figure 38E:
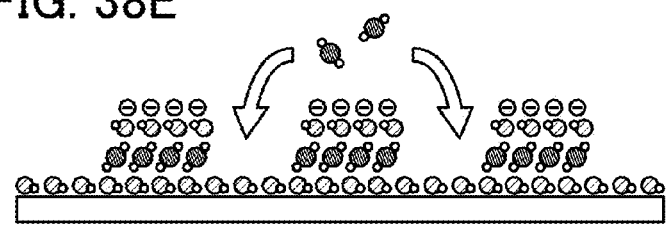

Note that there can be several mechanisms for the lateral growth of the particles 5203 between the pellets 5200. For example, as shown in FIG. 38E, the pellets 5200 can be connected from side surfaces of the first M-Zn—O layers. In this case, after the first M-Zn—O layers make connection, the In—O layers and the second M-Zn—O layers are connected in this order (the first mechanism).

Figure 39A:
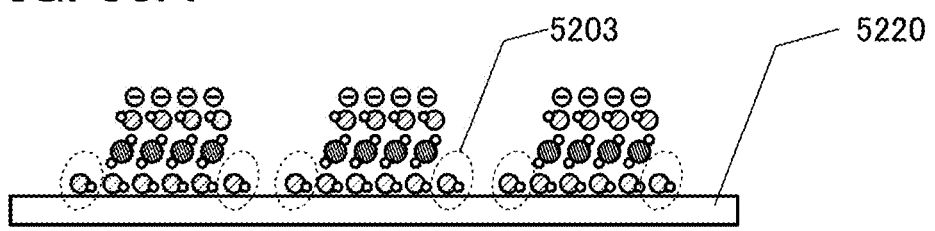
FIGS. 39A to 39C illustrate a deposition method of a CAAC-OS.
Figure 39B:
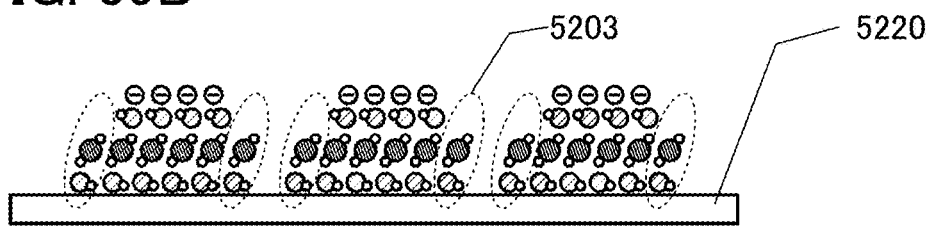
Figure 39C:
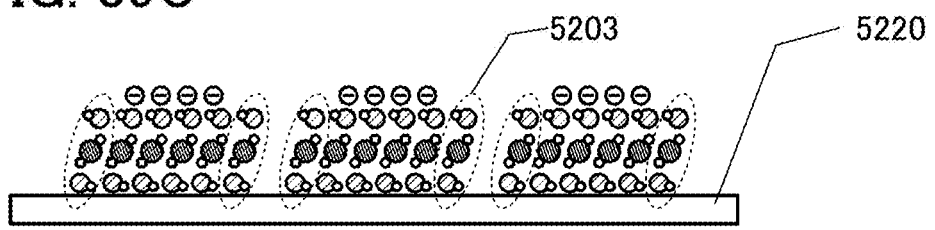

Alternatively, as shown in FIG. 39A, first, the particles 5203 are connected to the sides of the first M-Zn—O layers so that each side of the first M-Zn—O layer has one particle 5203. Then, as shown in FIG. 39B, the particle 5203 is connected to each side of the In—O layers. After that, as shown in FIG. 39C, the particle 5203 is connected to each side of the second M-Zn—O layers (the second mechanism). Note that the connection can also be made by the simultaneous occurrence of the deposition in FIGS. 39A, 39B, and 39C (the third mechanism).

As shown in the above, the above three mechanisms are considered as the mechanisms of the lateral growth of the particles 5203 between the pellets 5200. However, the particles 5203 may grow up laterally between the pellets 5200 by other mechanisms.

Therefore, even when the orientations of a plurality of pellets 5200 are different from each other, generation of crystal boundaries can be suppressed since the particles 5203 laterally grow to fill gaps between the plurality of pellets 5200. In addition, as the particles 5203 make smooth connection between the plurality of pellets 5200, a crystal structure different from a single crystal and a polycrystal is formed. In other words, a crystal structure including distortion between minute crystal regions (pellets 5200) is formed. The regions filling the gaps between the crystal regions are distorted crystal regions, and thus, it will be not appropriate to say that the regions have an amorphous structure.

Figure 36D:
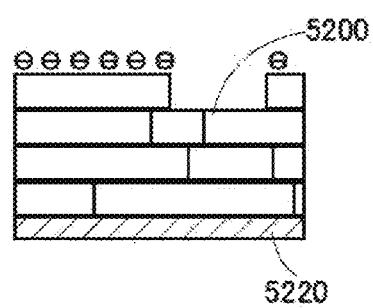

When the particles 5203 completely fill the regions between the pellets 5200, a first layer with a thickness almost the same as that of the pellet 5200 is formed. Then, a new first of the pellets 5200 is deposited over the first layer, and a second layer is formed. With repetition of this cycle, the stacked-layer thin film structure is formed (FIG. 36D).

A deposition way of the pellets 5200 changes depending on the surface temperature of the substrate 5220 or the like. For example, if the surface temperature of the substrate 5220 is high, migration of the pellets 5200 occurs over the substrate 5220. As a result, a proportion of the pellets 5200 that are directly connected with each other without the particles 5203 increases, whereby a CAAC-OS with high orientation is made. The surface temperature of the substrate 5220 for formation of the CAAC-OS is higher than or equal to 100° C. and lower than 500° C., preferably higher than or equal to 140° C. and lower than 450° C., or further preferably higher than or equal to 170° C. and lower than 400° C. Therefore, even when a large-sized substrate of the 8th generation or more is used as the substrate 5220, a warp or the like hardly occur.

Figure 40:
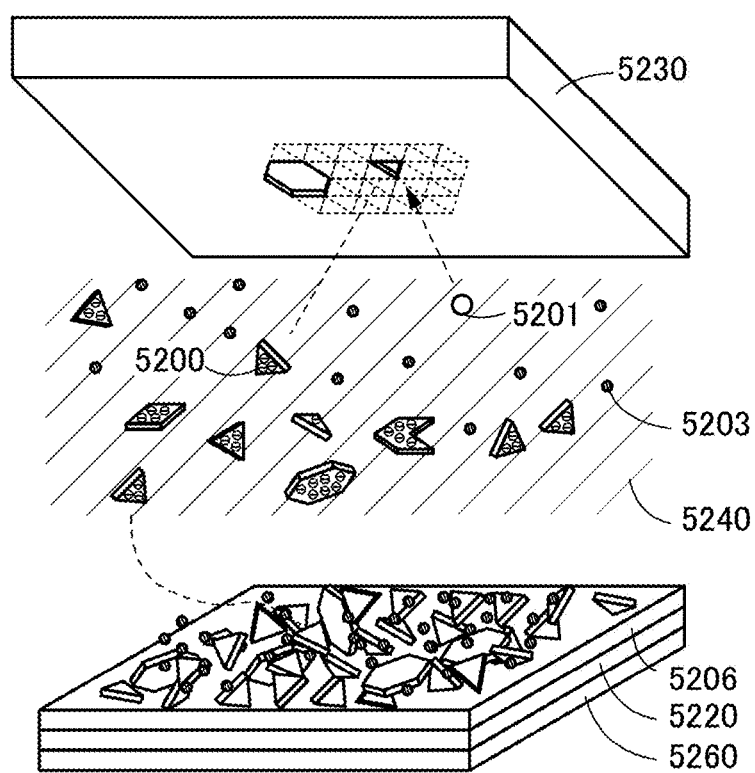
FIG. 40 illustrates a deposition method of an nc-OS.

On the other hand, if the surface temperature of the substrate 5220 is low, the migration of the pellets 5200 over the substrate 5220 does not easily occur. As a result, the pellets 5200 are stacked to form a nanocrystalline oxide semiconductor (nc-OS) or the like with low orientation (FIG. 40). In the nc-OS, the pellets 5200 are possibly deposited with certain gaps since the pellets 5200 are negatively charged. Therefore, the nc-OS film has low orientation but some regularity, and thus it has a denser structure than an amorphous oxide semiconductor.

When spaces between the pellets are extremely small in a CAAC-OS, the pellets may form a large pellet. The inside of the large pellet has a single crystal structure. For example, the size of the pellet may be greater than or equal to 10 nm and less than or equal to 200 nm, greater than or equal to 15 nm and less than or equal to 100 nm, or greater than or equal to 20 nm and less than or equal to 50 nm, when seen from the above.

According to such a model, the pellets 5200 are considered to be deposited on the substrate 5220. A CAAC-OS can be deposited even when a formation surface does not have a crystal structure; therefore, a growth mechanism in this case is different from epitaxial growth. In addition, a uniform film of a CAAC-OS or an nc-OS can be formed even over a large-sized glass substrate or the like. For example, even when the surface of the substrate 5220 (formation surface) has an amorphous structure (e.g., such as amorphous silicon oxide), a CAAC-OS can be formed.

In addition, even when the surface of the substrate 5220 (formation surface) has an uneven shape, the pellets 5200 are aligned along the shape.

(Embodiment 7)

In this embodiment, examples of a semiconductor device including the transistor described in Embodiment 1 will be described with reference to FIGS. 41 and 42.

Figure 41:
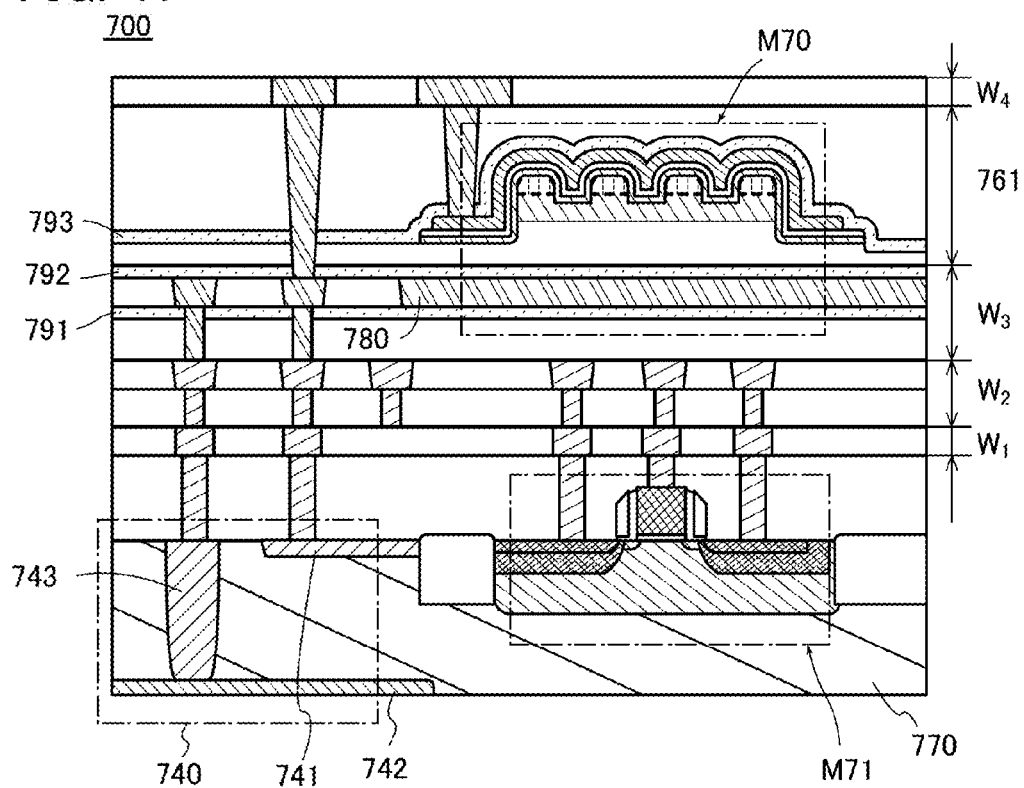
FIG. 41 is a cross-sectional view of a semiconductor device.

A semiconductor device 700 shown in FIG. 41 includes a transistor M71 and a photodiode 740 in a substrate 770, a transistor M70 in a layer 761, insulating films 791 to 793, and wiring layers $W_1$ to $W_4$ over the transistor M71 and the photodiode 740. The layer 761 is stacked over the wiring layer $W_3$.

The transistor described in Embodiment 1 may be used as the transistor M70. As a second gate (back gate) of the transistor M70, a conductive layer 780 is formed in the wiring layer $W_3$.

For the details of the substrate 770, the description of the substrate 270 in FIG. 18 is referred to. In FIG. 41, an example of using a silicon wafer as the substrate 770 is shown. Furthermore, like the transistors M1 and M2 shown in FIG. 18, the transistor M71 is a silicon transistor.

The photodiode 740 includes a conductive layer 741 serving as one of an anode and a cathode, a conductive layer 742 serving as the other of the anode and the cathode, and a conductive layer 743 electrically connected to the conductive layer 742. The conductive layers 741 to 743 may be formed by impurity injection to the substrate 770.

Although the photodiode 740 is provided so that a current flows in the vertical direction with respect to the substrate 770 in FIG. 41, the photodiode 740 may be provided so that a current flows in the lateral direction with respect to the substrate 770.

For the details of the insulating films 791 to 793, the description of the insulating films 291 to 293 shown in FIG. 18 is referred to.

In FIG. 41, the photodiode 740 and the transistor M70 can be formed so as to overlap with each other. Thus, the use of an image sensor including the semiconductor device 700 can increase the integration degree of pixels. In other words, the resolution of an imaging device can be increased.

In FIG. 41, a structure where the photodiode 740 and the transistor M71 are provided in the same substrate 770 is shown, however, they are not limited to this structure. For example, the transistor M71 is provided in the substrate 770, and a photodiode provided in another substrate is attached thereto. Alternatively, the transistor M71 is not provided in the substrate 770, and an OS transistor is provided as the transistor M71 like the transistor M70. A capacitor, a diode, a resistor, or the like may be provided in the substrate 770.

Figure 42:
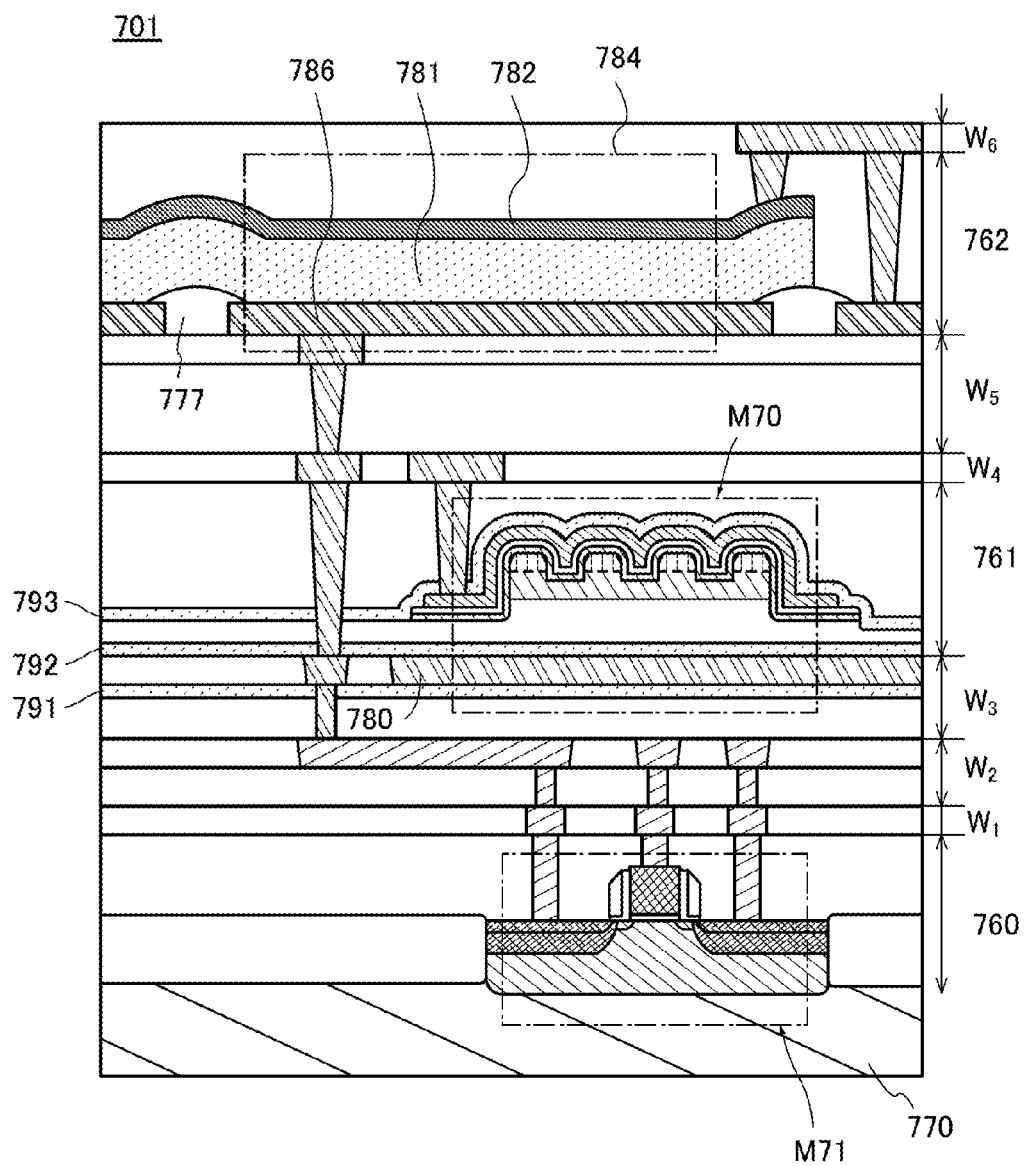
FIG. 42 is a cross-sectional view of a semiconductor device.

In an example shown in FIG. 42, a semiconductor device 701 includes a photodiode in a layer over the layer 761, unlike the semiconductor device 700 including the photodiode in the substrate 770.

In the semiconductor device 701, wiring layers $W_4$ to $W_6$ are formed over the layer 761. A layer 762 is stacked over the wiring layer $W_5$.

A photodiode 784 is formed in the layer 762. The photodiode 784 includes an electrode 786, a photoelectric conversion layer 781, and a light-transmitting conductive layer 782. A partition wall 777 is provided in a region not provided with the electrode 786.

A selenium-based material can be used for the photoelectric conversion layer 781. The photodiode 784 including a selenium-based material has characteristics of high external quantum efficiency to visible light. Moreover, the use of the photodiode 784 can achieve a highly sensitive sensor in which the amplification of electrons with respect to the amount of incident light is large owing to an avalanche phenomenon. Furthermore, the selenium-based material has a high light-absorption coefficient, which leads to an advantage that the photoelectric conversion layer 781 can be formed thin.

Amorphous selenium or crystalline selenium can be used as the selenium-based material. Crystalline selenium can be obtained by, for example, depositing amorphous selenium and then performing heat treatment. When the crystal grain size of crystalline selenium is smaller than a pixel pitch, variation in characteristics between pixels can be reduced. Moreover, crystalline selenium has higher spectral sensitivity and light-absorption coefficient than amorphous selenium.

Although the photoelectric conversion layer 781 is illustrated as a single layer, gallium oxide, cerium oxide, or the like as a hole blocking layer may be provided on the light reception side of the selenium-based material, and nickel oxide, antimony sulfide, or the like as an electron blocking layer may be provided on the electrode 786 side.

Furthermore, the photoelectric conversion layer 781 may be a layer including a compound of copper, indium, and selenium (CIS). Alternatively, a layer including a compound of copper, indium, gallium, and selenium (CIGS) may be used. With the CIS or CIGS, a photoelectric conversion element that can utilize an avalanche phenomenon as in the case of using a single layer of selenium can be formed. Furthermore, CIS and CIGS are p-type semiconductors, and an n-type semiconductor such as cadmium sulfide or zinc sulfide may be provided in contact with the p-type semiconductor in order to form a junction.

It is preferable to apply a relatively high voltage (e.g., 10 V or higher) to the photoelectric conversion element in order to cause the avalanche phenomenon. Since the transistor M70 (OS transistor) has higher drain withstand voltage than the silicon transistor, the application of a relatively high voltage to the photoelectric conversion element is easy. Thus, by combination of the OS transistor having high drain withstand voltage and a photodiode including the selenium-based material in the photoelectric conversion layer, a highly sensitive and highly reliable imaging device can be obtained.

Note that the partition wall 777 can be formed using an inorganic insulator, an insulating organic resin, or the like. The partition wall 777 may be colored black or the like in order to shield the transistors and the like from light and/or to determine the area of a light-receiving portion.

For the details of the other components of the semiconductor device 701, the description of the semiconductor device 700 is referred to.

In FIGS. 41 and 42, regions without reference numerals and hatch patterns represent regions formed of an insulator. As the insulator, an insulator containing at least one of aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, and the like can be used. Alternatively, in the regions, an organic resin such as a polyimide resin, a polyamide resin, an acrylic resin, a siloxane resin, an epoxy resin, or a phenol resin can be used.

EXAMPLE 1

In Example 1, electric characteristics of the OS transistor described in Embodiment 1 were calculated by device simulation.

The electric characteristics of a 3D transistor were calculated by device simulation software Atlas (Silvaco, Inc.). The transistor structures assumed in this device simulation are illustrated in FIGS. 25A to 25D, FIGS. 26A to 26D, and FIGS. 27A to 27D. The transistor illustrated in FIGS. 25A to 25D is referred to as a FET-A, the transistor illustrated in FIGS. 26A to 26D is referred to as a FET-B, and the transistor illustrated in FIGS. 27A to 27D is referred to as a FET-C.

Figure 25A:
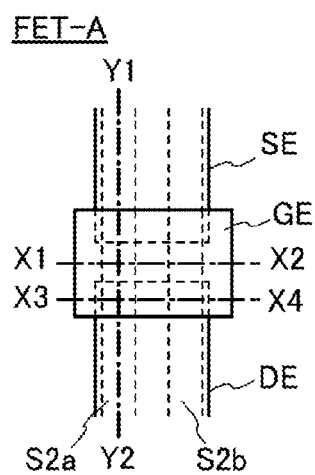
FIGS. 25A to 25D are a top view and cross-sectional views of a transistor used in device simulation.
Figure 25B:
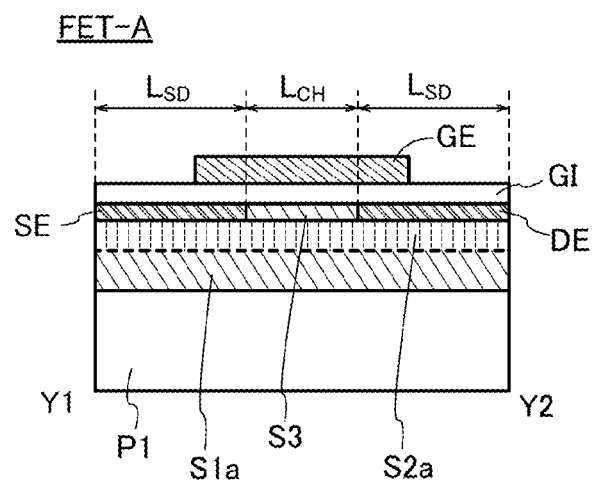
Figure 25C:
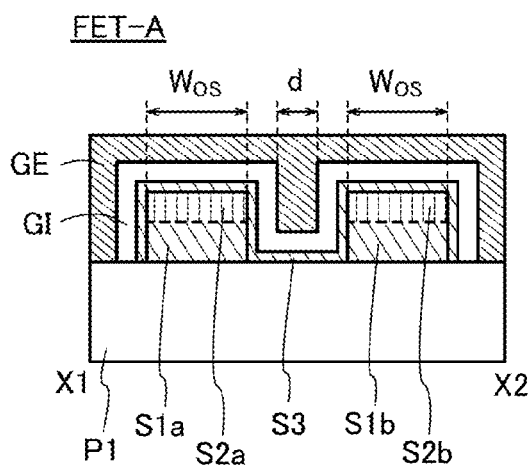
Figure 25D:
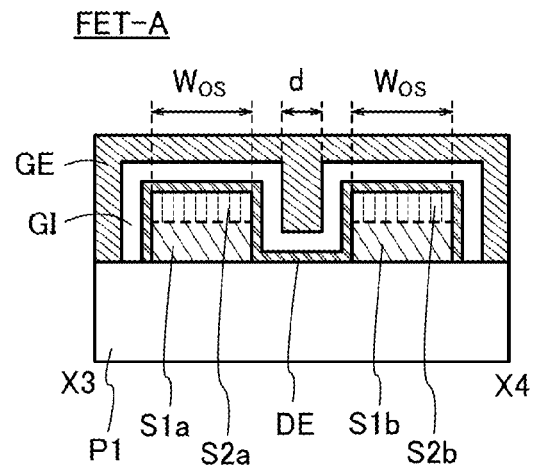

FIG. 25A is a top view of the FET-A. FIG. 25B is a cross-sectional view along the dashed-dotted line Y1-Y2 in FIG. 25A. Similarly, FIG. 25C is a cross-sectional view along the dashed-dotted line X1-X2 in FIG. 25C. Similarly, FIG. 25D is a cross-sectional view along the dashed-dotted line X3-X4 in FIG. 25D.

The FET-A illustrated in FIGS. 25A to 25D schematically illustrates the transistor 10E of FIGS. 6A to 6D. In FIGS. 25A to 25D, a semiconductor S1a, a semiconductor S1b, a semiconductor S2a, a semiconductor S2b, and a semiconductor S3 correspond to the semiconductor 21a, the semiconductor 21b, the semiconductor 22a, the semiconductor 22b, and the semiconductor 23, respectively. In addition, an electrode GE, an electrode SE, an electrode DE, an insulating film GI, and an insulating film P1 have functions of a gate electrode, a source electrode, a drain electrode, a gate insulating film, and a base insulating film, respectively. In the FET-A, a second gate electrode such as a backgate is not assumed. Note that in terms of the easiness of device simulation, the FET-A includes two fins, and components that do not influence the results of the device simulation, such as an interlayer insulating film, is omitted.

Figure 26A:
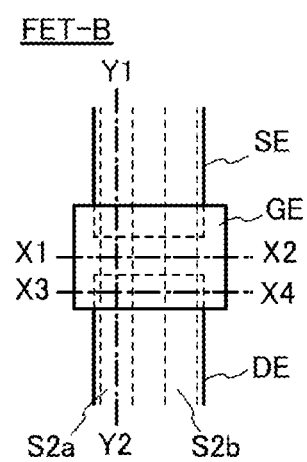
FIGS. 26A to 26D are a top view and cross-sectional views of a transistor used in device simulation.
Figure 26B:
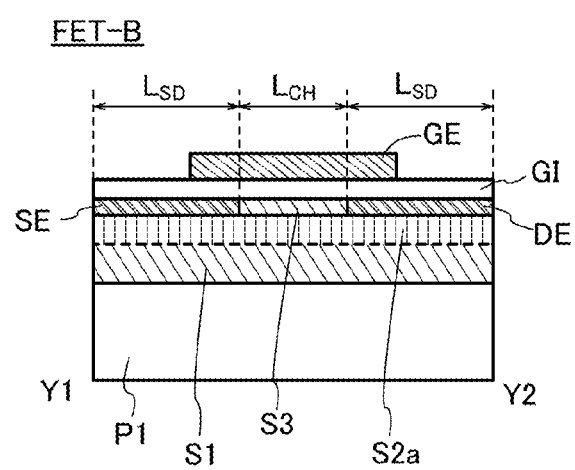
Figure 26C:
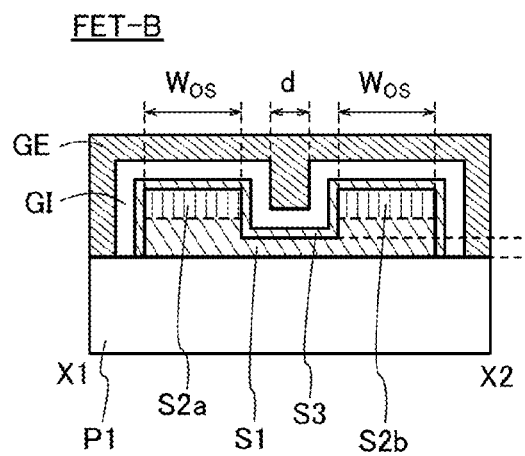
Figure 26D:
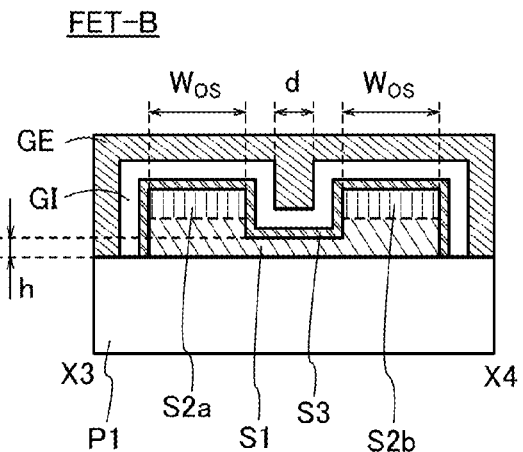

FIG. 26A is a top view of the FET-B. FIG. 26B is a cross-sectional view along the dashed-dotted line Y1-Y2 in FIG. 26A. Similarly, FIG. 26C is a cross-sectional view along the dashed-dotted line X1-X2 in FIG. 26C. Similarly, FIG. 26D is a cross-sectional view along the dashed-dotted line X3-X4 in FIG. 26D.

The FET-B illustrated in FIGS. 26A to 26D has a structure in which the semiconductors S1a and S1b of the FET-A are replaced with one semiconductor S1. Like the semiconductor 21 in FIGS. 1A to 1D and FIGS. 2A to 2D, the semiconductor S1 is shared by a plurality of fins.

Figure 27A:
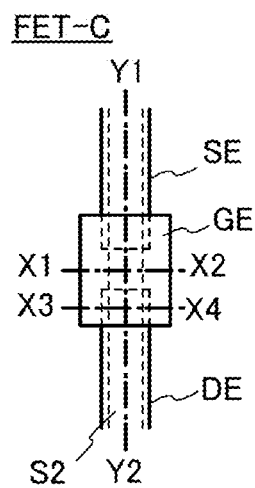
FIGS. 27A to 27D are a top view and cross-sectional views of a transistor used in device simulation.
Figure 27B:
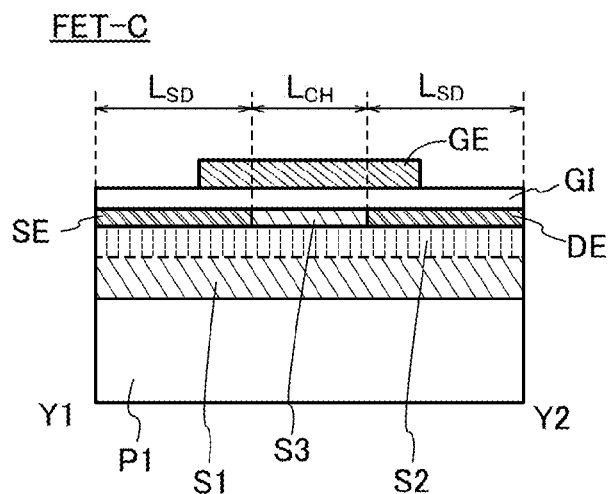
Figure 27C:
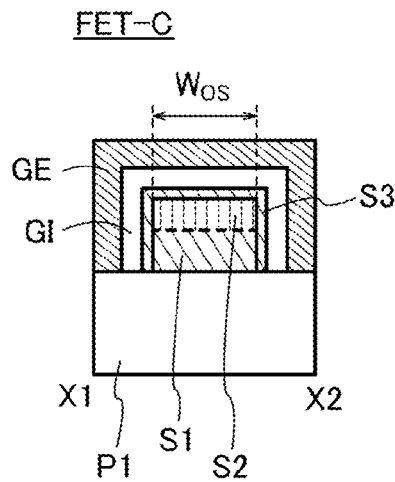
Figure 27D:
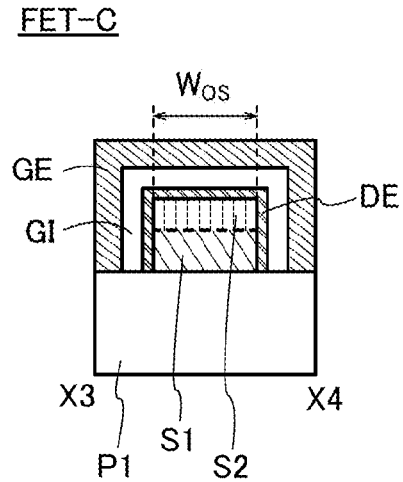

FIG. 27A is a top view of the FET-C. FIG. 27B is a cross-sectional view along the dashed-dotted line Y1-Y2 in FIG. 27A. Similarly, FIG. 27C is a cross-sectional view along the dashed-dotted line X1-X2 in FIG. 27C. Similarly, FIG. 27D is a cross-sectional view along the dashed-dotted line X3-X4 in FIG. 27D.

The FET-C illustrated in FIGS. 27A to 27D has a structure including one fin of the FET-A.

The other parameters assumed for this device simulation are listed in Table 1.

TABLE 1

| Transistor | | | |
|---|---|---|---|
| | $L_{CH}$ | | 60 nm |
| | $L_{SD}$ | | 50 nm |
| | d | | 20 nm |
| | $W_{OS}$ | | 50, 30 nm |
| | h | | 10 nm |
| GI | Relative dielectric constant | | 4.1 |
| | Thickness | | 10 nm |
| SE | Work function | | 4.6 eV |
| DE | Thickness | | 5 nm |
| S3 | Composition ratio | | In:Ga:Zn = 1:3:2 |
| | Electron affinity | | 4.3 eV |
| | Bandgap $E_G$ | | 3.6 eV |
| | Relative dielectric constant | | 15 |
| | Donor density | | $6.60 \times 10^{-9}$ cm$^{-3}$ |
| | Electron mobility | | 0.1 cm$^2$/Vs |
| | Hole mobility | | 0.01 cm$^2$/Vs |
| | Effective density of states in conduction band Nc | | $5.00 \times 10^{18}$ cm$^{-3}$ |
| | Effective density of states in valence band Nv | | $5.00 \times 10^{18}$ cm$^{-3}$ |
| | Thickness | | 5 nm |
| S2 | Composition ratio | | In:Ga:Zn = 1:1:1 |
| S2a | Electron affinity | | 4.6 eV |
| S2b | Bandgap $E_G$ | | 3.2 eV |
| | Relative dielectric constant | | 15 |
| | Donor density | | $6.60 \times 10^{-9}$ cm$^{-3}$ |
| | Donor density (n$^+$ region) | | $5.00 \times 10^{18}$ cm$^{-3}$ |
| | Electron mobility | | 10 cm$^2$/Vs |
| | Hole mobility | | 0.01 cm$^2$/Vs |
| | Effective density of states in conduction band Nc | | $5.00 \times 10^{18}$ cm$^{-3}$ |

TABLE 1-continued

| | | | |
|---|---|---|---|
| | Effective density of states in valence band Nv | | $5.00 \times 10^{18}$ cm$^{-3}$ |
| | Thickness | | 15 nm |
| S1 | Composition ratio | | In:Ga:Zn = 1:3:2 |
| S1a | Thickness | | 20 nm |
| S1b | | | |
| P1 | Relative dielectric constant | | 4.1 |
| | Thickness | | 100 nm |

The semiconductor S3 was assumed to be an In—Ga—Zn oxide semiconductor deposited using a target having a composition of In:Ga:Zn=1:3:2.

Similarly, the semiconductors S1, S1a, and S1b were assumed to be In—Ga—Zn oxide semiconductors deposited using a target having a composition of In:Ga:Zn=1:3:2. For the physical constants of the semiconductors S1, S1a, and S1b, the values of the semiconductor S3 can be referred to.

The semiconductors S2, S2a, and S2b were assumed to be In—Ga—Zn oxide semiconductors deposited using a target having a composition of In:Ga:Zn=1:1:1.

In the semiconductors S2, S2a, and S2b, n$^+$ regions including donors at $5 \times 10^{18}$ cm$^{-3}$ under the electrode SE and the electrode DE were assumed.

Figure 28A:
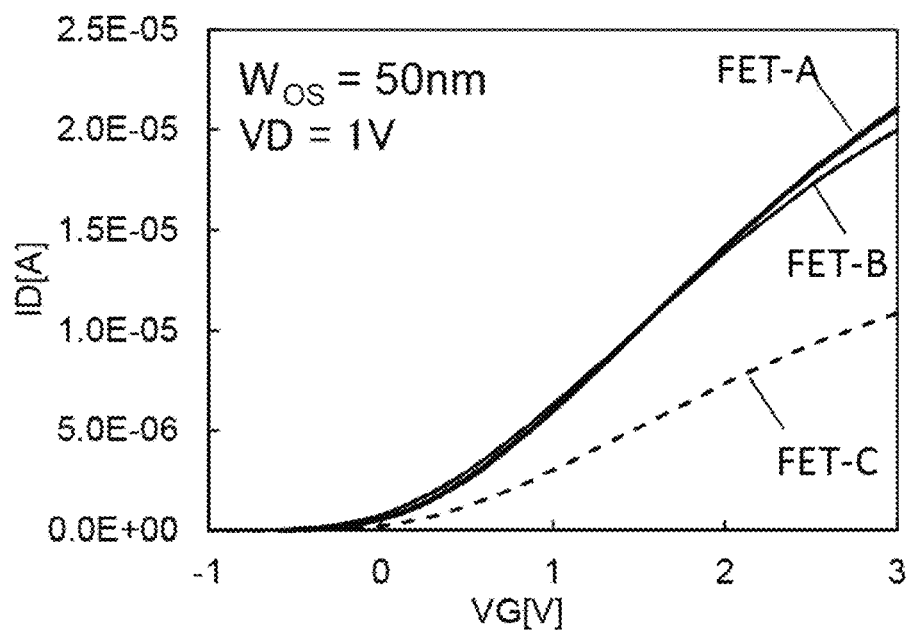
FIGS. 28A and 28B show $V_G$-$I_D$ characteristics of transistors obtained by device simulation.
Figure 28B:
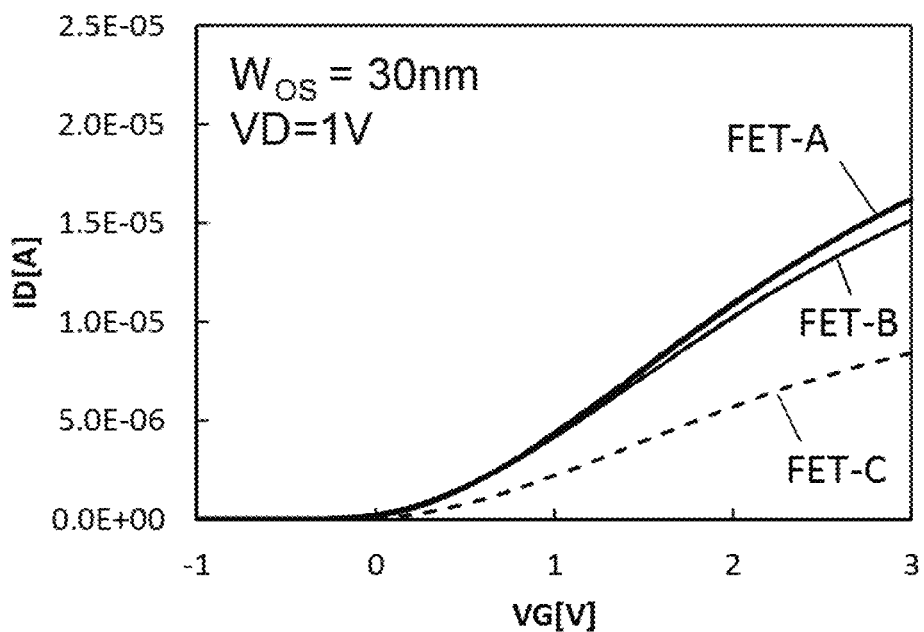

The device simulation results are shown in FIGS. 28A and 28B. FIG. 28A shows $V_G$-$I_D$ characteristics (gate voltage and drain current) in the case where $W_{OS}$ (the width of the fin) is 50 nm. FIG. 28B shows $V_G$-$I_D$ characteristics in the case where $W_{OS}$ is 30 nm.

The results of FIGS. 28A and 28B show that the FET-A and the FET-B including two fins have an on-state current (drain current) that is approximately twice the on-state current of the FET-C including one fin. This is because the number of channels through which the on-state current can flow is increased with the increased number of fins, leading to an increase in the on-state current.

Moreover, when the FET-A and the FET-B are compared in FIGS. 28A and 28B, the FET-A has a higher on-state current than the FET-B. This is because side surfaces of the semiconductors S2a and S2b functioning as channels are completely surrounded by GE in the FET-A, whereas a part of side surfaces of the semiconductors S2a and S2b are not surrounded by GE in the FET-B. Thus, the on-state current of the FET-A is increased than that of the FET-B.

From the above, it has been confirmed that a multi-channel FET including a plurality of fins has a higher on-state current than a single-channel FET including one fin, and that a higher on-state current can be obtained when adjacent fins are completely separated.

EXAMPLE 2

In Example 2, the memory operation frequency in the case of using the transistor described in Embodiment 1 in a memory was calculated.

Before the memory operation frequency is calculated, the frequency characteristics of the transistors are considered first. The cutoff frequency $f_T$ of a transistor can be represented by Formula (1). In Formula (1), $g_m$ is mutual conductance, and $C_G$ is gate capacitance.

[Formula 1]

$$f_T = \frac{g_m}{2\pi C_G} \quad (1)$$

Figure 29:
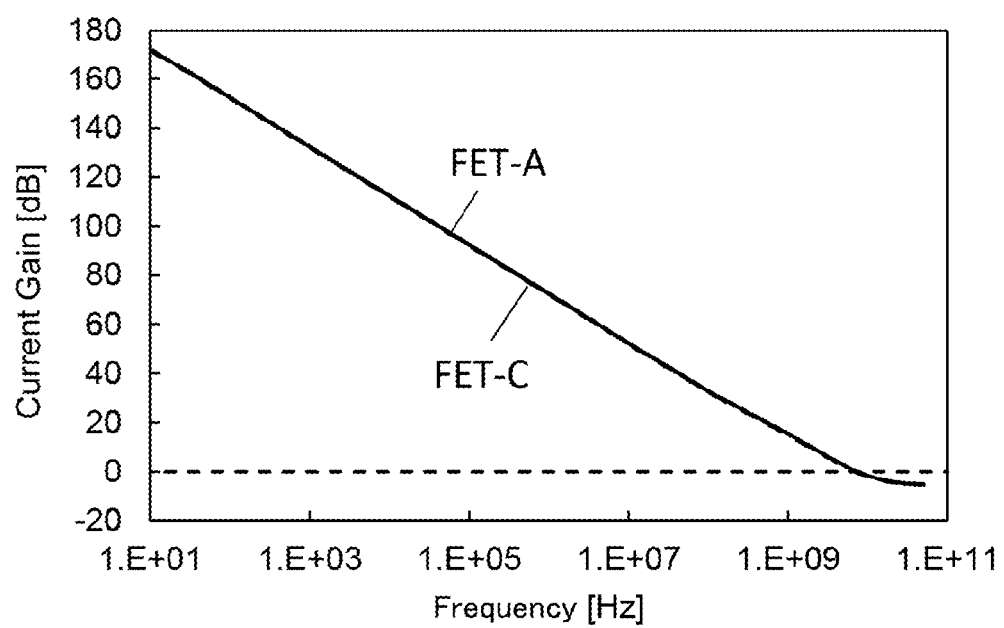
FIG. 29 shows frequency characteristics of transistors obtained by device simulation.

Next, the frequency characteristics of the FET-A and the FET-C assumed in Example 1 were calculated by device simulation, and the results are shown in FIG. 29. The frequency characteristics of the FET-A and the FET-C at $V_D$ of 1 V, $V_G$ of 3 V, and $W_{OS}$ of 30 nm are shown in FIG. 29. In the results in FIG. 29, the frequency characteristics of the FET-A substantially coincide with those of the FET-C. This is because the FET-C having double the $g_m$ of the FET-A has double the $C_G$ of the FET-A; therefore, a difference in the cutoff frequency $f_T$ represented by Formula (1) is not caused between the FET-A and the FET-C. According to the results of FIG. 29, the cutoff frequency $f_T$ (the frequency at which the current gain is 0 dB) of the FET-A and the FET-C is approximately 10 GHz.

Next, the memory operation frequency is calculated. In the case of using a single-channel FET in the charge storage memories including capacitors illustrated in FIG. 12, FIG. 13, FIG. 14, FIG. 15, FIG. 16, FIG. 17, FIG. 18, and FIGS. 19A and 19B for example, the memory operation frequency $f_{single}$ can be represented by Formula (2). In Formula (2), $C_L$ is load capacitance.

[Formula 2]

$$f_{single} = \frac{g_m}{2\pi(C_G + C_L)} \quad (2)$$

In this specification, the load capacitance $C_L$ means capacitance of a capacitor having a function of storing electric charges for data retention in a memory cell. For example, the load capacitance $C_L$ represents the capacitance of the capacitor C0 in FIG. 12, FIG. 13, FIG. 14, and FIG. 16 or the capacitor 131 in FIGS. 19A and 19B.

Next, the memory operation frequency $f_{multi}$ in the case of using the multi-channel FET described in Embodiment 1 is considered. According to the device simulation results of FIG. 29, $g_m$ and $C_G$ of a multi-channel FET including n fins are n times as large as those of a single-channel FET. The operation frequency $f_{multi}$ of the multi-channel FET can be represented by Formula (3).

[Formula 3]

$$f_{multi} = \frac{ng_m}{2\pi(nC_G + C_L)} = \frac{g_m}{2\pi(C_G + C_L/n)} \quad (3)$$

In the process of drawing Formula (3) from Formula (2), the load capacitance $C_L$ was assumed to be constant.

The comparison between Formula (2) and Formula (3) reveals that by using a multi-channel Fin FET in a memory, the load capacitance $C_L$ becomes 1/n times that of a single-channel Fin FET and the memory operation speed is improved.

Using Formula (3), the memory operation frequency $f_{multi}$ in the case of using a multi-channel Fin FET was calculated. The calculation results are shown in FIG. 30.

Figure 30:
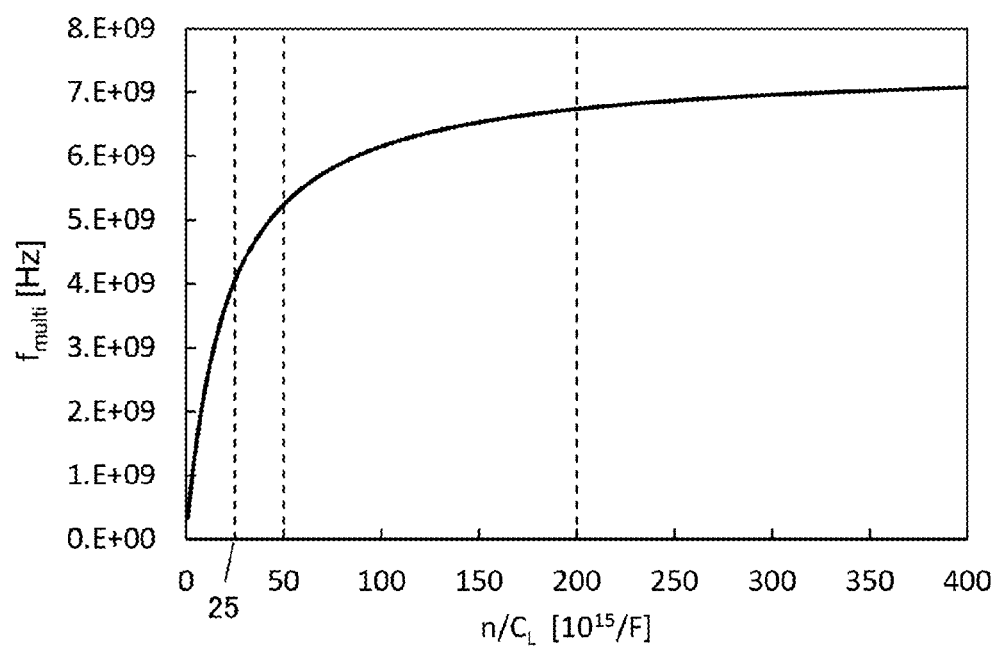
FIG. 30 shows a relation between the memory operation frequency and the number of fins in a transistor.

In the graph of FIG. 30, the vertical axis indicates the memory operation frequency $f_{multi}$, and the horizontal axis indicates the number of fins n divided by the load capacitance $C_L$ ($n/C_L$).

Note that for carrying out the calculation of Formula (3), the mutual conductance $g_m$ was obtained from the $V_G$-$I_D$ characteristics of the FET-C in FIG. 28B ($V_D$=1 V, $V_G$=3 V, $W_{OS}$=30 nm). The gate capacitance $C_G$ was obtained by substituting, in Formula (1), the value of the cutoff frequency $f_T$ of the FET-C obtained from FIG. 29.

The calculation results of FIG. 30 show that an increase in the value of $n/C_L$ increases the operation frequency $f_{multi}$, and a further increase in the value of $n/C_L$ causes saturation at the cutoff frequency $f_T$. Especially when the load capacitance $C_L$ is assumed to be constant, an increase in the value of n increases the operation frequency $f_{multi}$, and a further increase in the value of n causes saturation at the cutoff frequency $f_T$.

In order to improve the memory operation speed, it is preferable that the value of $n/C_L$ be large within the range of not causing saturation.

According to FIG. 30, $n/C_L$ is smaller than or equal to $200\times10^{15}$ $F^{-1}$, preferably smaller than or equal to $50\times10^{15}$ $F^{-1}$, and further preferably smaller than or equal to $25\times10^{15}$ $F^{-1}$.

As for the lower limit of $n/C_L$, because n is more than or equal to 2 and the load capacitance $C_L$ is 1 pF at the most, $n/C_L$ is preferably larger than or equal to $2/10^{-12}$ $F^{-1}=2\times10^{12}$ $F^{-1}$.

From the above, it has been shown that the memory operation speed can be improved by employing the multi-channel FET.

EXPLANATION OF REFERENCE

C0: capacitor, CINV: clocked inverter, DE: electrode, GE: electrode, GI: insulating film, FN: node, M0-M2: transistors, M70: transistor, M71: transistor, N5: node, N7: node, P1: insulating film, S1: semiconductor, S1a: semiconductor, S1b: semiconductor, S2: semiconductor, S2a: semiconductor, S2b: semiconductor, S3: semiconductor, SE: electrode, Sig1: input terminal, Sig2: input terminal, Tp1-Tp5: periods, W1-W9: wiring layers, 10A-10E: transistors, 11: substrate, 12: insulating film, 12a: insulating film, 12b: insulating film, 13: insulating film, 14: insulating film, 15: conductive film, 15a: conductive film, 15aa: conductive film, 15b: conductive film, 15c: conductive film, 15d: conductive film, 15i: hard mask, 16: conductive film, 16a: conductive film, 16aa: conductive film, 16b: conductive film, 16c: conductive film, 16d: conductive film, 17: insulating film, 18: insulating film, 19: insulating film, 20a: semiconductor, 20b: semiconductor, 20c: semiconductor, 20d: semiconductor, 21: semiconductor, 21a: semiconductor, 21b: semiconductor, 21c: semiconductor, 21d: semiconductor, 21i: semiconductor, 22a: semiconductor, 22b: semiconductor, 22c: semiconductor, 22d: semiconductor, 22i: semiconductor, 23: semiconductor, 24: conductive film, 25: conductive film, 26a: fin, 26b: fin, 26c: fin, 26d: fin, 27: contact hole, 130: memory cell, 131: capacitor, 140: memory device, 150: register circuit, 151: inverter, 152: inverter, 153: flip-flop circuit, 154: capacitor, 170: pixel, 171: capacitor, 172: display element, 180: display device, 230: logic portion, 260: layer, 261: layer, 262: layer, 270: substrate, 271: well, 272: channel formation region, 273: low concentration impurity region, 274: high concentration impurity region, 275: conductive region, 276: gate insulating film, 277: gate electrode, 278: sidewall insulating film, 279: sidewall insulating film, 280: conductive layer, 281: conductive layer, 282: conductive layer, 291: insulating film, 293: insulating film, 300: memory circuit, 300_A: memory circuit, 360: controller, 361: row decoder circuit, 362: row driver circuit, 363: column driver circuit, 364: AD converter, 370: memory cell array, 372: memory cell array, 373: memory cell array, 380: memory cell, 700:

semiconductor device, 701: semiconductor device, 740: photodiode, 741: conductive layer, 742: conductive layer, 743: conductive layer, 761: layer, 762: layer, 770: substrate, 777: partition wall, 780: conductive layer, 781: photoelectric conversion layer, 782: light-transmitting conductive layer, 784: photodiode, 786: electrode, 791: insulating film, 793: insulating film, 901: housing, 902: housing, 903: display portion, 904: display portion, 905: microphone, 906: speaker, 907: operation key, 908: stylus, 911: housing, 912: microphone, 913: external connection port, 914: operation button, 916: display portion, 917: speaker, 921: housing, 922: display portion, 923: keyboard, 924: pointing device, 931: housing, 932: refrigerator door, 933: freezer door, 941: housing, 942: housing, 943: display portion, 944: operation key, 945: lens, 946: joint, 951: car body, 952: wheel, 953: dashboard, 954: light, 1189: ROM interface, 1190: substrate, 1191: ALU, 1192: ALU controller, 1193: instruction decoder, 1194: interrupt controller, 1195: timing controller, 1196: register, 1197: register controller, 1198: bus interface, 1199: ROM, 4000: RF tag, 5100: pellet, 5120: substrate, 5161: region, 5200: pellet, 5201: ion, 5203: particle, 5220: substrate, 5230: target, 5240: plasma, 5260: heating mechanism.

This application is based on Japanese Patent Application serial no. 2014-236491 filed with Japan Patent Office on Nov. 21, 2014, the entire contents of which are hereby incorporated by reference.

The invention claimed is:

1. A transistor comprising:
a first oxide semiconductor film over an insulator;
a second oxide semiconductor film over the first oxide semiconductor film;
a third oxide semiconductor film over the first oxide semiconductor film;
a fourth oxide semiconductor film over the first oxide semiconductor film, the second oxide semiconductor film, and the third oxide semiconductor film;
a gate insulating film over the fourth oxide semiconductor film;
a gate electrode over the gate insulating film; and
an insulating film over the gate electrode,
wherein the second oxide semiconductor film and the third oxide semiconductor film comprise regions that face each other with the gate electrode positioned therebetween, and
wherein the insulating film is in contact with the insulator.

2. The transistor according to claim 1,
wherein the first to third oxide semiconductor films comprise indium, zinc, and a metal, and
wherein the metal is Al, Ti, Ga, Y, Zr, La, Ce, Nd, or Hf.

3. The transistor according to claim 2,
wherein the first oxide semiconductor film and the fourth oxide semiconductor film have a larger atomic ratio of the metal to indium than the second oxide semiconductor film and the third oxide semiconductor film.

4. The transistor according to claim 1,
wherein the fourth oxide semiconductor film is in contact with the first oxide semiconductor film.

5. The transistor according to claim 1,
wherein the fourth oxide semiconductor film is in contact with the insulator.

6. An electronic device comprising:
the transistor according to claim 1; and
at least one of a microphone, a speaker, a display portion, and an operation key.

7. The transistor according to claim 1, further comprising:
a first conductive film over the second oxide semiconductor film; and
a second conductive film over the third oxide semiconductor film,
wherein the fourth oxide semiconductor film is over the first conductive film, the second conductive film, and the first oxide semiconductor film,
wherein an end portion of the second oxide semiconductor film is aligned with an end portion of the first conductive film,
wherein an end portion of the third oxide semiconductor film is aligned with an end portion of the second conductive film, and
wherein the fourth oxide semiconductor film is in contact with a side surface of the end portion of the second oxide semiconductor film and a side surface of the end portion of the third oxide semiconductor film.

8. A transistor comprising:
a first oxide semiconductor film over an insulator;
a second oxide semiconductor film over the first oxide semiconductor film;
a third oxide semiconductor film over the first oxide semiconductor film;
a fourth oxide semiconductor film over the first oxide semiconductor film, the second oxide semiconductor film, and the third oxide semiconductor film;
a gate insulating film over the fourth oxide semiconductor film;
a gate electrode over the gate insulating film; and
an insulating film over the gate electrode,
wherein the second oxide semiconductor film and the third oxide semiconductor film comprise regions that face each other with the gate electrode positioned therebetween,
wherein the gate insulating film comprises a region in contact with a top surface of the fourth oxide semiconductor film,
wherein the first oxide semiconductor film comprises a first portion overlapping with the gate electrode with the second oxide semiconductor film positioned therebetween,
wherein the first oxide semiconductor film comprises a second portion overlapping with the gate electrode with the third oxide semiconductor film positioned therebetween, and
wherein the insulating film is in contact with the insulator.

9. The transistor according to claim 8,
wherein the first to third oxide semiconductor films comprise indium, zinc, and a metal, and
wherein the metal is Al, Ti, Ga, Y, Zr, La, Ce, Nd, or Hf.

10. The transistor according to claim 9,
wherein the first oxide semiconductor film and the fourth oxide semiconductor film have a larger atomic ratio of the metal to indium than the second oxide semiconductor film and the third oxide semiconductor film.

11. The transistor according to claim 8,
wherein the fourth oxide semiconductor film is in contact with the first oxide semiconductor film.

12. The transistor according to claim 8,
wherein the fourth oxide semiconductor film is in contact with the insulator.

13. An electronic device comprising:
the transistor according to claim 8; and
at least one of a microphone, a speaker, a display portion, and an operation key.

14. The transistor according to claim 8, further comprising:

a first conductive film over the second oxide semiconductor film; and a second conductive film over the third oxide semiconductor film, wherein the fourth oxide semiconductor film is over the first conductive film, the second conductive film, and the first oxide semiconductor film, wherein an end portion of the second oxide semiconductor film is aligned with an end portion of the first conductive film, wherein an end portion of the third oxide semiconductor film is aligned with an end portion of the second conductive film, and wherein the fourth oxide semiconductor film is in contact with a side surface of the end portion of the second oxide semiconductor film and a side surface of the end portion of the third oxide semiconductor film.

15. A transistor comprising:

a first fin to N-th fin, the N being a natural number of 2 or more, wherein the first fin comprises a first oxide semiconductor film and a second oxide semiconductor film, and a second fin comprises a third oxide semiconductor film and a fourth oxide semiconductor film;

a fifth oxide semiconductor film over the first fin and the second fin;

a gate insulating film over the fifth oxide semiconductor film;

a gate electrode over the gate insulating film;

an insulator below the first fin; and an insulating film over the gate electrode, wherein the first oxide semiconductor film and the third oxide semiconductor film comprise regions that face each other with the gate electrode positioned therebetween, wherein the second oxide semiconductor film and the fourth oxide semiconductor film comprise regions that face each other with the gate electrode positioned therebetween, wherein the second oxide semiconductor film comprises a first portion between the first oxide semiconductor film and the fifth oxide semiconductor film, wherein the gate electrode and the first portion overlap with each other with the gate insulating film positioned therebetween, wherein the fourth oxide semiconductor film comprises a second portion between the third oxide semiconductor film and the fifth oxide semiconductor film, wherein the gate electrode and the second portion overlap with each other with the gate insulating film positioned therebetween, and wherein the insulating film is in contact with the insulator.

16. The transistor according to claim 15, wherein the first to third oxide semiconductor films comprise indium, zinc, and a metal, and wherein the metal is Al, Ti, Ga, Y, Zr, La, Ce, Nd, or Hf.

17. The transistor according to claim 16, wherein the first, third, and fifth oxide semiconductors have a larger atomic ratio of the metal to indium than the second and fourth oxide semiconductors.

18. A memory comprising:

the transistor according to claim 15; and a capacitor connected to an electrode of the transistor, wherein the N divided by load capacitance of the capacitor is larger than or equal to $2 \times 10^{12}$ $F^{-1}$ and smaller than or equal to $200 \times 10^{15}$ $F^{-1}$.

19. An electronic device comprising:

the transistor according to claim 15; and at least one of a microphone, a speaker, a display portion, and an operation key.

20. The transistor according to claim 15, further comprising:

a first conductive film over the second oxide semiconductor film; and a second conductive film over the fourth oxide semiconductor film, wherein the fifth oxide semiconductor film is over the first conductive film and the second conductive film, wherein an end portion of the second oxide semiconductor film is aligned with an end portion of the first conductive film, wherein an end portion of the fourth oxide semiconductor film is aligned with an end portion of the second conductive film, and wherein the fifth oxide semiconductor film is in contact with a side surface of the end portion of the second oxide semiconductor film and a side surface of the end portion of the fourth oxide semiconductor film.

* * * * *